US011535935B2

(12) United States Patent
Spath et al.

(10) Patent No.: US 11,535,935 B2
(45) Date of Patent: Dec. 27, 2022

(54) DEPOSITION SYSTEM WITH VACUUM PRE-LOADED DEPOSITION HEAD

(71) Applicant: Eastman Kodak Company, Rochester, NY (US)

(72) Inventors: Todd Mathew Spath, Hilton, NY (US); Carolyn Rae Ellinger, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 119 days.

(21) Appl. No.: 16/903,505

(22) Filed: Jun. 17, 2020

(65) Prior Publication Data

US 2020/0318238 A1 Oct. 8, 2020

Related U.S. Application Data

(62) Division of application No. 15/458,250, filed on Mar. 14, 2017, now abandoned.

(51) Int. Cl.
*C23C 16/455* (2006.01)
*C23C 16/54* (2006.01)
(Continued)

(52) U.S. Cl.
CPC ...... *C23C 16/45544* (2013.01); *C23C 16/403* (2013.01); *C23C 16/407* (2013.01);
(Continued)

(58) Field of Classification Search
CPC ............ C23C 16/45544; C23C 16/403; C23C 16/407; C23C 16/4412; C23C 16/45519;
(Continued)

(56) References Cited

U.S. PATENT DOCUMENTS 5,136,975 A 8/1992 Bartholomew et al.
6,206,974 B1 * 3/2001 Iida ................... H01L 21/67778
118/712
(Continued)

FOREIGN PATENT DOCUMENTS

EP 1 283 279 2/2003
JP 2005-179705 7/2005

OTHER PUBLICATIONS

E. Granneman, "Conduction Heating in RTP Fast, and Pattern-independent," Materials Science Forum, vols. 573-574, pp. 375-386.

(Continued)

*Primary Examiner* — Charlee J. C. Bennett
(74) *Attorney, Agent, or Firm* — David A. Novais

(57) ABSTRACT

A thin film deposition system includes a vacuum-preloaded gas bearing deposition head positioned in an external environment having an ambient pressure, the deposition head having an output face including a plurality of source openings through which gaseous materials are supplied and one or more exhaust openings. An exhaust pressure at the exhaust openings is less than ambient pressure, and a source pressure at the source openings is greater than that at the exhaust openings, with the pressure at the outermost source openings being greater than ambient pressure. A motion control system moves a substrate unit over the output face in the in-track direction without constraining its motion in a direction normal to the output face to a point where a center of gravity of the substrate unit is beyond the first edge of the output face.

12 Claims, 36 Drawing Sheets

(51) Int. Cl.
*C23C 16/458* (2006.01)
*C23C 16/44* (2006.01)
*C23C 16/40* (2006.01)

(52) U.S. Cl.
CPC ...... *C23C 16/4412* (2013.01); *C23C 16/4583* (2013.01); *C23C 16/45519* (2013.01); *C23C 16/45527* (2013.01); *C23C 16/45551* (2013.01); *C23C 16/45574* (2013.01); *C23C 16/45595* (2013.01); *C23C 16/545* (2013.01)

(58) Field of Classification Search
CPC ........ C23C 16/45527; C23C 16/45551; C23C 16/45574; C23C 16/45595; C23C 16/4583; C23C 16/545
USPC ................................................. 118/715, 718
See application file for complete search history.

(56) References Cited

U.S. PATENT DOCUMENTS

| | | |
|---|---|---|
| 7,413,982 B2 | 8/2008 | Levy |
| 7,456,429 B2 | 11/2008 | Levy |
| 7,572,686 B2 | 8/2009 | Levy et al. |
| 7,789,961 B2 | 9/2010 | Nelson et al. |
| 7,850,780 B2 | 12/2010 | Levy et al. |
| 8,182,608 B2 | 5/2012 | Kerr et al. |
| 8,211,231 B2 | 7/2012 | Kerr et al. |
| 8,361,544 B2 | 1/2013 | Fedorovskaya et al. |
| 8,398,770 B2 | 3/2013 | Levy et al. |
| 8,420,168 B2 | 4/2013 | Kerr et al. |
| 8,529,990 B2 | 9/2013 | Fedorovskaya et al. |
| 10,584,413 B2 * | 3/2020 | Spath ................ C23C 16/45568 |
| 2008/0301935 A1 * | 12/2008 | Iida ...................... H05K 3/3478 29/843 |
| 2009/0130858 A1 | 5/2009 | Levy et al. |
| 2009/0304924 A1 | 12/2009 | Gadgil |
| 2010/0221426 A1 | 9/2010 | Sferlazzo |
| 2011/0086167 A1 * | 4/2011 | Nunes ................ C23C 16/45574 427/249.17 |
| 2011/0097487 A1 | 4/2011 | Kerr et al. |
| 2011/0097488 A1 | 4/2011 | Kerr et al. |
| 2011/0097489 A1 | 4/2011 | Kerr et al. |
| 2011/0097490 A1 | 4/2011 | Kerr et al. |
| 2011/0097491 A1 * | 4/2011 | Levy ................ C23C 16/45551 427/248.1 |
| 2011/0097492 A1 | 4/2011 | Kerr et al. |
| 2011/0097493 A1 | 4/2011 | Kerr et al. |
| 2011/0097494 A1 | 4/2011 | Kerr et al. |
| 2013/0186335 A1 * | 7/2013 | Kawato .................. C23C 14/24 118/720 |
| 2013/0199448 A1 * | 8/2013 | Granneman .......... C23C 16/455 118/729 |
| 2014/0377963 A1 | 12/2014 | Ellinger et al. |
| 2016/0245434 A1 | 8/2016 | Seeley |
| 2018/0265971 A1 * | 9/2018 | Spath ................ C23C 16/45517 |
| 2018/0265976 A1 * | 9/2018 | Spath ................ C23C 16/45551 |
| 2018/0265978 A1 * | 9/2018 | Spath .................. C23C 16/4412 |
| 2018/0265979 A1 * | 9/2018 | Spath ................ C23C 16/45544 |

OTHER PUBLICATIONS

D. Levy et al., "Oxide Electronics by Spatial Atomic Layer Deposition," J. Display Technology, vol. 5, pp. 484-494 (2009).

P. Poodt et al., "Spatial atomic layer deposition: A route towards further industrialization of atomic layer deposition," J. Vac. Sci. Technol. A, vol. 30, pp. 010802-1-010802-11 (2012).

* cited by examiner

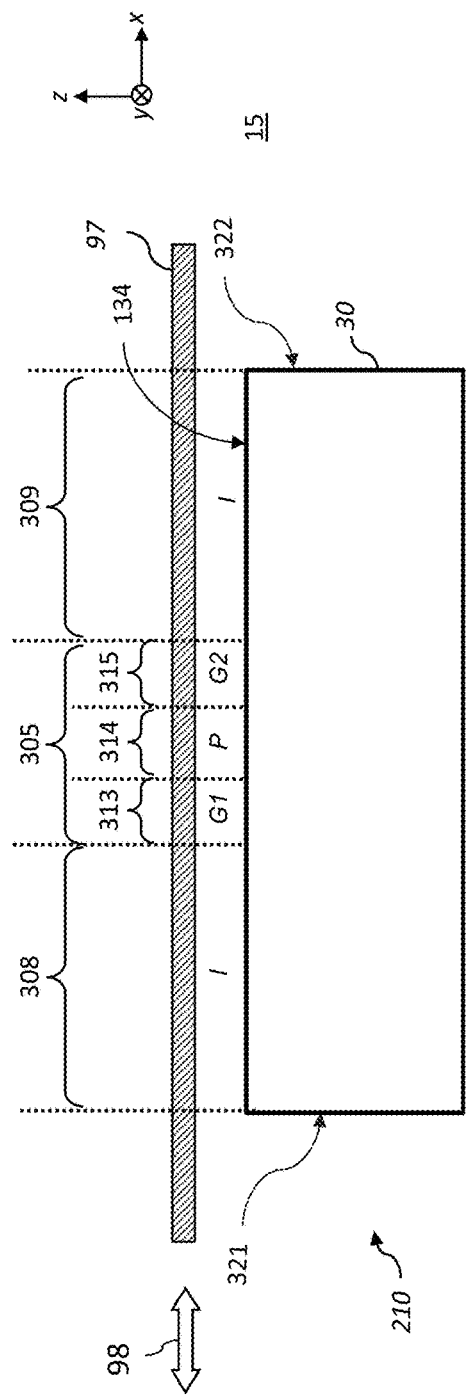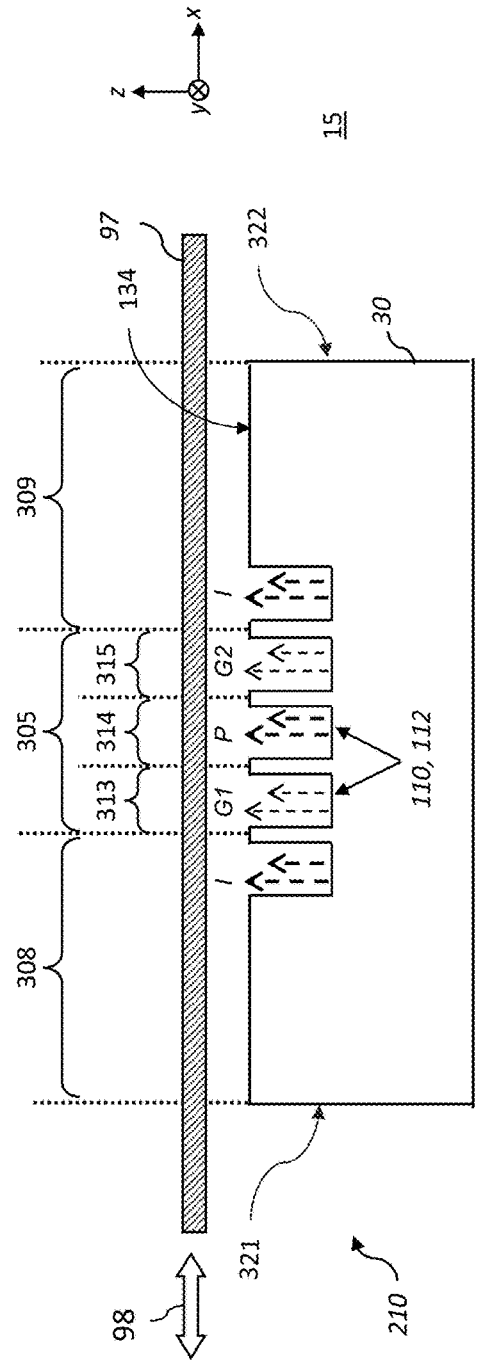

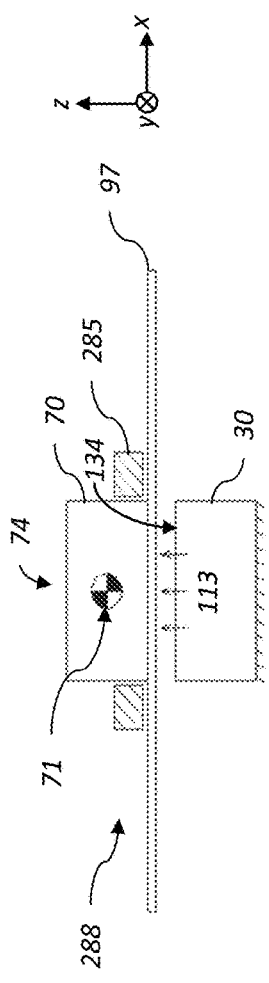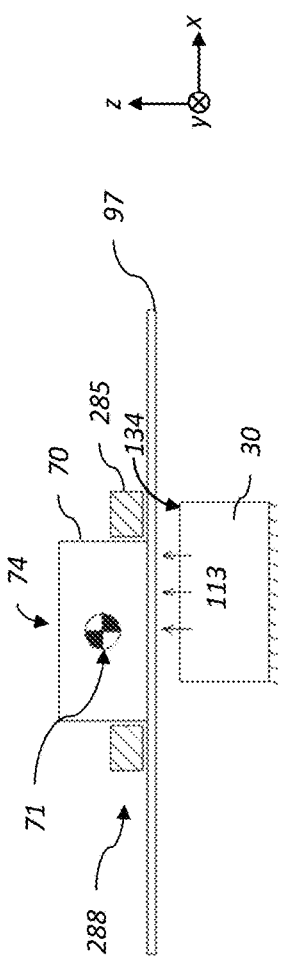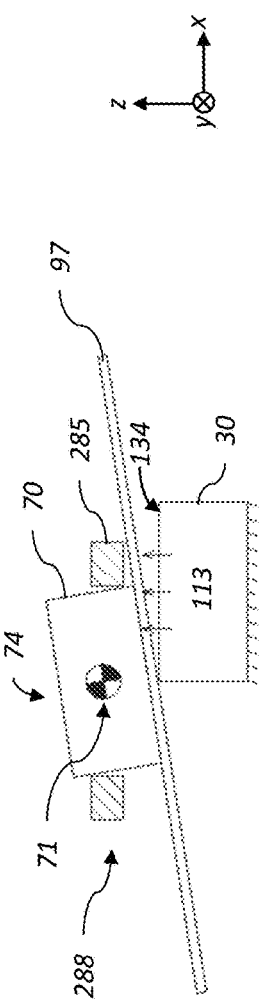

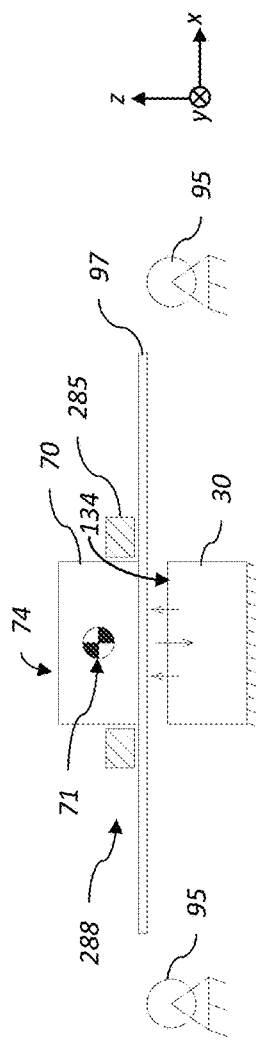
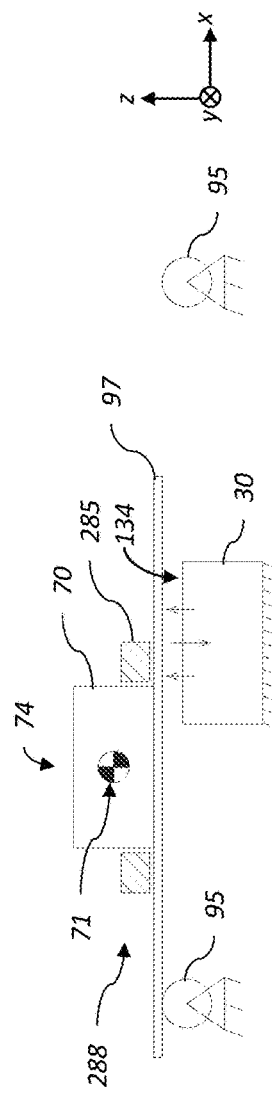
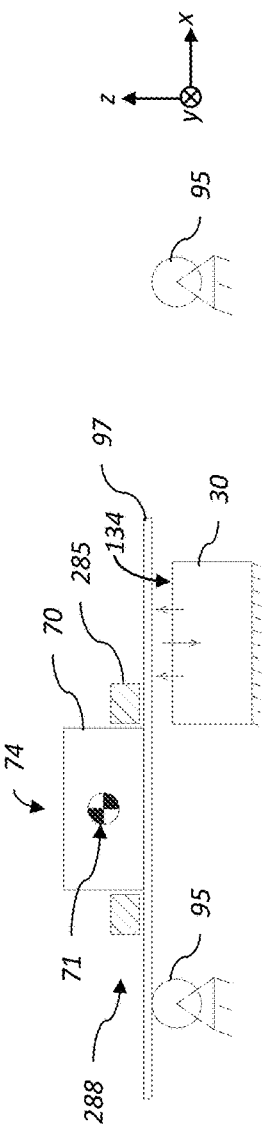
FIG. 11A
FIG. 11B
FIG. 11C

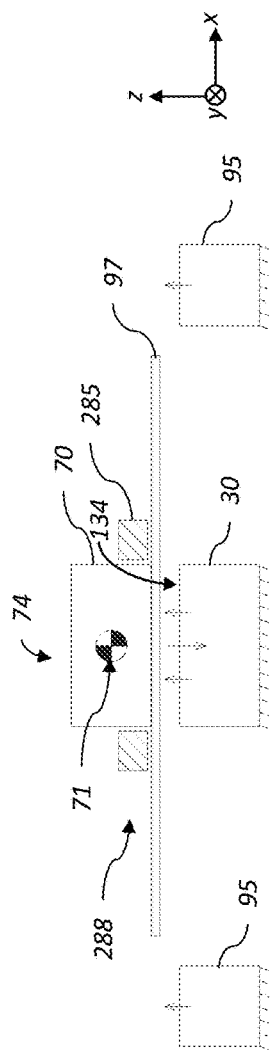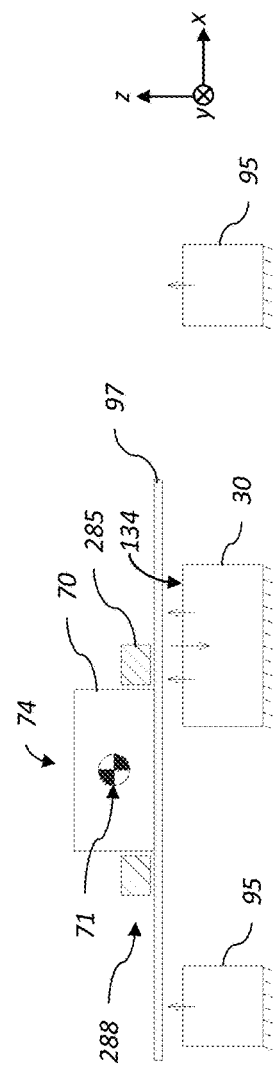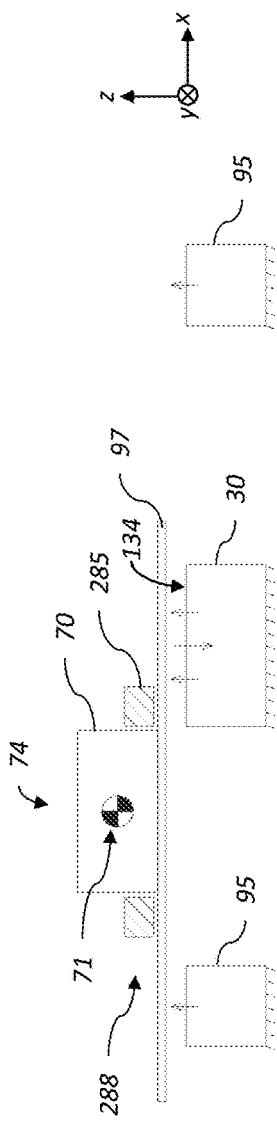

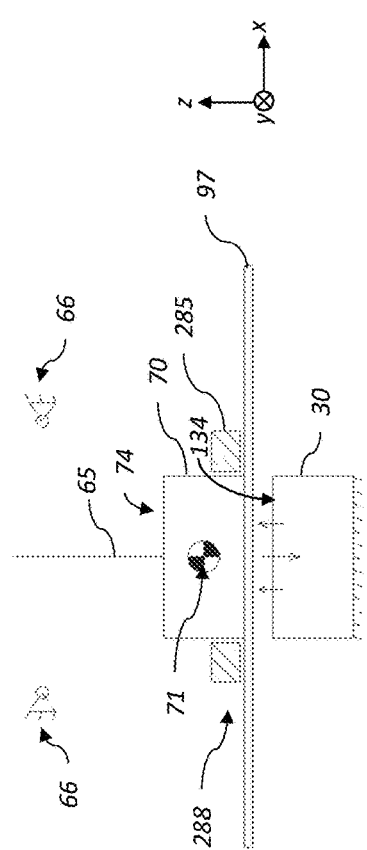
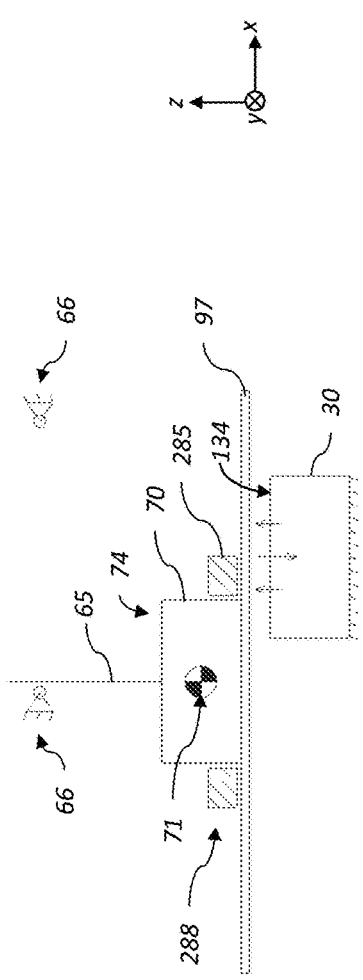
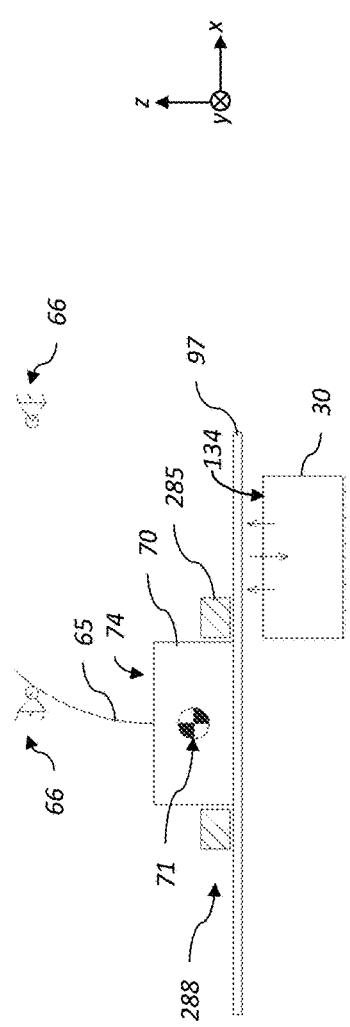

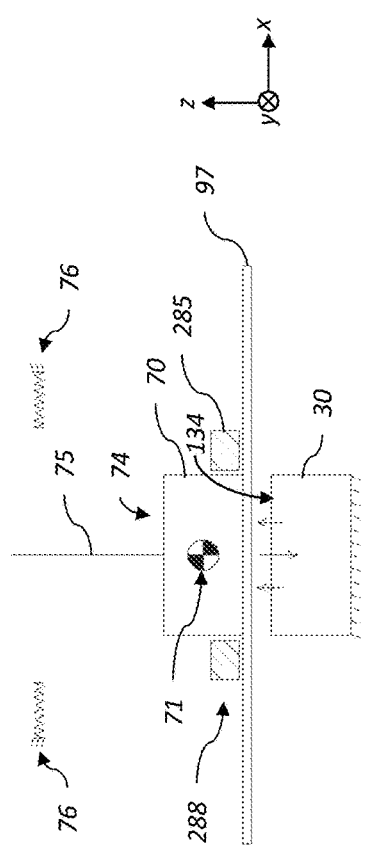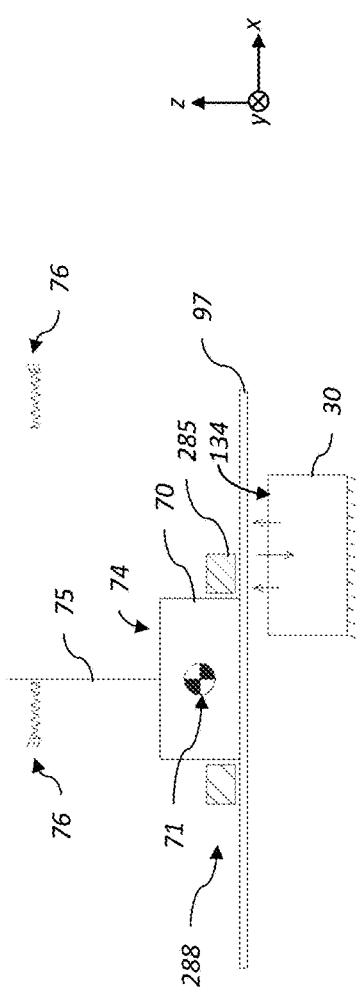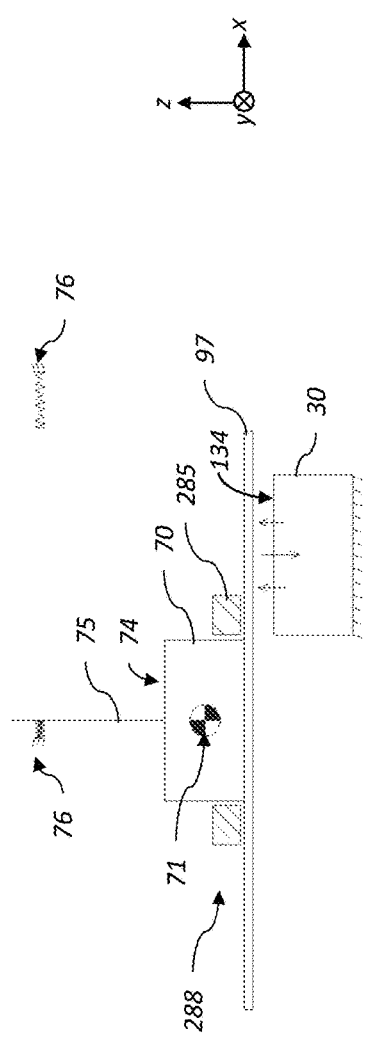

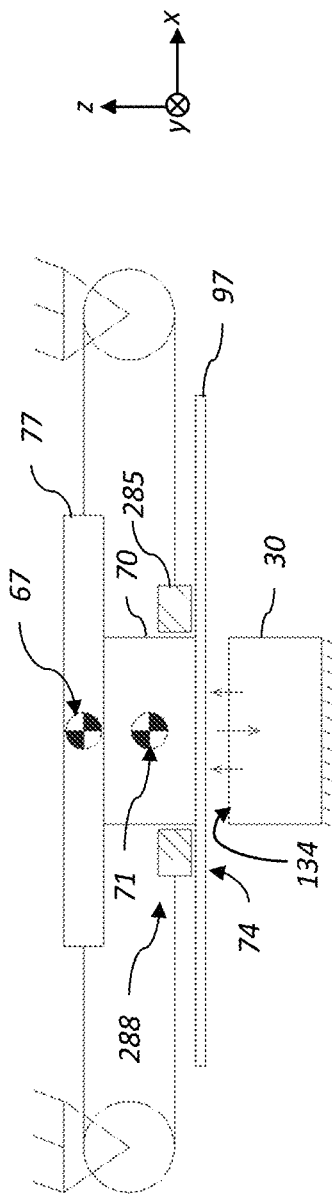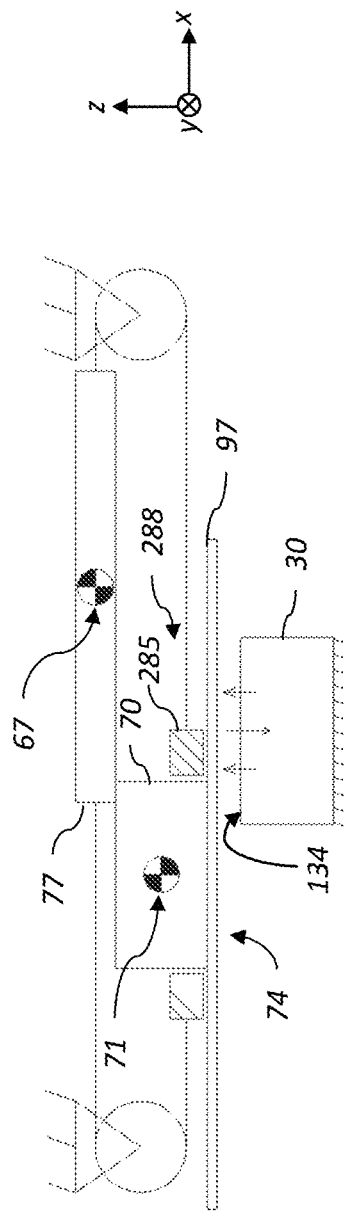
FIG. 15A
FIG. 15B

TABLE 1

| Layer | TMA Bubbler Flow (sccm) | DEZ Bubbler Flow (sccm) | NH₃ Flow (sccm) | Water Bubbler Flow (sccm) | N₂ Dilution with Metal Alkyl (sccm) | N₂ Dilution with Water (sccm) | N₂ Inert Purge (sccm) |
|---|---|---|---|---|---|---|---|
| Al₂O₃ | 0 | 0 | 0 | 65 | 1500 | 2250 | 3000 |
| ZnO | 0 | 60 | 0 | 45 | 1500 | 2250 | 3000 |
| ZnO:N | 0 | 60 | 4 | 45 | 1500 | 2250 | 3000 |

FIG. 33

TABLE 2

| Example | Material | Substrate | Forward Motion Distance, f (mm) | Ooch Distance, $\Delta x$ (mm) | Substrate Velocity (mm/sec) | # of Oscillation, $N_O$ | Number of ALD Cycles in Uniform Area, $N_T$ | Nominal Deposition Thickness (nm) | CG Past Edge of Deposition Head? |
|---|---|---|---|---|---|---|---|---|---|
| C1 | ZnO:N | 2.5" Glass | 32.00 | N/A | 50.8 | 30 | 120 | 22.8 | N |
| I1 | ZnO:N | 5" Glass | 81.28 | N/A | 50.8 | 30 | 120 | 22.8 | Y |
| I2 | ZnO:N | 2.5" Glass | 7.50 | 0.1885 | 50.8 | 130 | 103.4 | 19.6 | N |
| I3 | ZnO:N | 5" Glass | 7.50 | 0.1885 | 50.8 | 391 | 103.4 | 19.6 | Y |
| C2 | $Al_2O_3$ | 2.5" Glass | 32.00 | N/A | 50.8 | 154 | 616 | 50.0 | N |
| I4 | $Al_2O_3$ | 5" Glass | 81.28 | N/A | 50.8 | 154 | 616 | 50.0 | Y |
| I5 | $Al_2O_3$ | 5" Glass | 7.50 | 0.0317 | 50.8 | 2324 | 637.2 | 51.7 | Y |
| C3 | ZnO | 2.5" Glass | 32.00 | N/A | 50.8 | 75 | 300 | 57.0 | N |
| I6 | ZnO | 5" Glass | 10.16 | 0.1016 | 50.8 | 475 | 303.75 | 57.7 | Y |
| I7 | ZnO | 5" Glass | 10.16 | 0.1016 | 50.8 | 700 | 303.75 | 57.7 | Y |

FIG. 34 ated, co-pending U.S. patent application Ser. No. 15/458,250, filed Mar. 14, 2017, which is hereby incorporated herein by reference in its entirety.

DEPOSITION SYSTEM WITH VACUUM PRE-LOADED DEPOSITION HEAD

CROSS-REFERENCE TO RELATED APPLICATIONS

This application is a Divisional of prior U.S. patent application Ser. No. 15/458,250, filed Mar. 14, 2017, which is hereby incorporated herein by reference in its entirety.

Reference is made to commonly assigned, co-pending U.S. patent application Ser. No. 15/458,235, entitled "Modular thin film deposition system," by Spath et al.; to commonly assigned, co-pending U.S. patent application Ser. No. 15/458,262, entitled "Dual gas bearing substrate positioning system," by Spath; to commonly assigned, co-pending U.S. patent application Ser. No. 15/458,270, entitled "Deposition system with moveable-position web guides," by Spath et al.; to commonly assigned, co-pending U.S. patent application Ser. No. 15/458,287, entitled "Deposition system with repeating motion profile," by Spath et al.; to commonly assigned, co-pending U.S. patent application Ser. No. 15/458,297, entitled "Deposition system with modular deposition heads," by Spath et al.; to commonly assigned, co-pending U.S. patent application Ser. No. 15/458,307, entitled "Porous gas-bearing backer," by Spath; to commonly assigned, co-pending U.S. patent application Ser. No. 15/458,322, entitled "Deposition system with interlocking deposition heads," by Tutt et al.; to commonly assigned, co-pending U.S. patent application Ser. No. 15/458,335, entitled "Vertical system with vacuum pre-loaded deposition head," by Spath et al.; and to commonly assigned, co-pending U.S. patent application Ser. No. 15/458,345, entitled "Heated gas-bearing backer," by Spath, each of which is incorporated herein by reference.

FIELD OF THE INVENTION

This invention generally relates to the deposition of thin-film materials, and more particularly to a deposition system including a vacuum-preloaded deposition head.

BACKGROUND OF THE INVENTION

There is a growing interest in depositing thin-film materials from gaseous precursors on a wide range of substrates for a wide variety of applications. Substrates of interest include both rigid substrates, such as flat-panel glass, and flexible substrates, such as plastic webs or metal foils. Flexible supports are of particular interest since they can be more mechanically robust, lighter weight, and allow for more economic manufacturing (e.g., by enabling roll-to-roll processing) than rigid substrates. Thin-film deposition systems, similar to their liquid coating counterparts, are advantaged if the deposition head, or gas delivery device, is smaller in area than the area of the substrate to be coated. For substrates that are continuous, such as webs and foils, the use of a deposition head that is smaller than the area of the substrate is a requirement not just an advantage.

Among the techniques widely used for thin-film deposition is chemical vapor deposition (CVD), which uses chemically reactive molecules that react to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Atomic layer deposition (ALD) is a thin-film deposition technology that provides excellent thickness control of conformal thin-films. The ALD process segments the thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In temporal vacuum ALD, thin-film growth is accomplished by alternating the delivery of two or more reactive materials, or precursors, into a vacuum chamber in time. Sequentially, a first precursor is applied to react with the substrate, the excess of the first precursor is removed, and a second precursor is then applied to react with the substrate surface. The excess of the second precursor is then removed and the process is repeated. In all ALD processes, the substrate is exposed sequentially to a series of reactants that react with the substrate and are kept isolated from each other to avoid CVD or gas phase reactions. An ALD cycle is defined by the steps required to form a single layer of the overall thin-film material; for a process using two precursors a cycle is defined as the first precursor exposure, a purge step, the second precursor exposure, and a second precursor purge step.

A version of ALD processes known as spatial atomic layer deposition (SALD) employs a continuous (as opposed to pulsed) gaseous material distribution from a deposition head. As distributed from the deposition head, the gaseous precursors are separated in space by the flow of an inert gas, rather than being separated in time. While vacuum chambers can be used with SALD, they are no longer necessary due to the physical separation of the gas flows rather than a temporal separation of the precursors within a single chamber. In SALD systems, the required sequential exposures are accomplished by relative movement between the substrate and the delivery head such that any given point on the substrate sees the necessary sequence of gaseous materials. This relative movement can be accomplished by moving a substrate relative to a fixed delivery head, moving a delivery head with respect to a fixed substrate, or moving both the delivery head and the substrate in order to achieve the desired gas exposure at the substrate. Exemplary SALD processes, are described in commonly-assigned U.S. Pat. Nos. 7,413,982, 7,456,429, 7,789,961, and U.S. Patent Application Publication 2009/0130858, the disclosures of which are incorporated herein by reference. SALD enables operation at atmospheric or near-atmospheric pressures and is capable of operating in an unsealed or open-air environment, making it compatible with web coating.

SALD offers considerable promise as a technique for thin film deposition on a range of substrates. However, in spite of its inherent technical capabilities and advantages, a number of technical hurdles still remain. As in all ALD processes, the thickness of the SALD deposited thin-film is controlled by the number of ALD cycles to which the substrate is exposed, where a cycle is defined by the exposure of the substrate to the minimum required reactant and purge gas flows to form the desired thin-film composition. Due to the process being limited to an atomic layer of growth per cycle, repeated cycles are required to deposit a thin-film having an appreciable thickness. In order to effectively achieve repeated cycles, SALD requires either motion of the substrate past the deposition head or the development of complex equipment such that the delivery head moves with its gas connections, relative to the substrate. Thin-films of appreciable thickness can be accomplished by either 1) using a deposition head containing a sufficient number of gas distribution cycles and moving a substrate (or head) in a unidirectional motion relative to the head (or substrate) or 2) using a head with a limited number of cycles and using relative reciprocating motion. In instances where the substrate or the deposition head are moved by a reciprocating movement, there remains a technical challenge to manage the sequence of gas exposures since the substrate can be exposed to the gases in a different sequence during a forward stroke and a backward stroke. Furthermore, in order to deposit a thin-film over an entire substrate, the substrate or the head may have to travel a long distance in order to expose substrate to the process gases. There remains a need to provide alternative arrangements to both the very large deposition heads and long distance motion profiles such that large substrates may be easily coated. One alternative to a single large deposition head is to use multiple deposition heads, or modules, within a larger deposition section. Commonly-assigned U.S. Pat. No. 8,182,608 (Kerr et al.), which is incorporated herein by reference, relates to an apparatus for maintaining the alignment or positional relationship between at least two modules in an SALD system. U.S. Pat. No. 8,182,608 describes aligning multiple delivery heads in a 1-D array, addressing the ability to coating longer substrates or provide thicker thin-film coatings. While simplifying the manufacturing of the deposition head, it does not address the challenge of making coatings of different thicknesses using the same tool, or the footprint required for providing a large deposition section in a manufacturing environment. Additionally, there remains a need for a way to arrange modular heads to be able to coat wider substrates without coating defects or non-uniformity. Additionally, there remains a need for a motion profile that enables the use of small deposition heads in order to build up a sufficient layer thickness from an SALD. Furthermore, there remains a need for a substrate handling means for coating on roll-to-roll webs that enables exposure of the substrate to multiple SALD cycles during deposition, while simultaneously moving the substrate smoothly from the feed roll to the take-up roll.

In order to function properly, an SALD system must maintain the separation of the reactant gases. Although separated in space and by a purge gas as delivered by the deposition head, the system must be further designed to insure that the gases do not mix in the region between the deposition head and the substrate. Commonly-assigned U.S. Patent Application Publication 2009/0130858 (Levy), relates to an SALD deposition system and method using a delivery head where the distance between the substrate and the deposition head is maintained by gas pressure. In this device, the pressure of flowing reactive and purge gases is used as a means to control the separation between the deposition head and the substrate. Due to the relatively large pressures that can be generated in such a system, gases are forced to travel in well-defined paths and thus eliminate undesired gas intermixing.

The system of U.S. Patent Application Publication 2009/0130858 operates as a gas-bearing SALD system. The gas bearing operation maintains a close proximity of the substrate to the deposition head, and either the substrate or head must be free to move in the direction normal the deposition head. The use of a gas bearing SALD head is advantaged due to the resultant pressure profiles that separate the precursor gasses by the purge gas and prevent undesired gas intermixing. There remains a need for SALD systems that utilize a gas-bearing deposition head to coat large substrates, particularly for depositions systems with small manufacturing footprints. There remains a need to coat long substrates with deposition heads that are considerably smaller than the coating length, both for piece-parts and particularly for roll-to-roll webs; this need further necessitates novel motion control profiles and substrate handling. There remains a further need for roll-to-roll SALD systems that utilize a gas-bearing deposition head having a simple construction, as well as roll-to-roll systems that can manage potential substrate distortions and can isolate the motion needed for deposition from the global motion of the web through the system. Additionally, there remains a need, for a modular system that can accommodate different substrate form factors, including roll-to-roll webs of substrate, and provide a system that is relatively low in cost and easy to use.

SUMMARY OF THE INVENTION

The present invention represents a thin film deposition system, including:

a vacuum-preloaded gas bearing deposition head positioned in an external environment having an ambient pressure, the deposition head having an output face facing a first substrate surface of a substrate and being configured to expose the first substrate surface to a plurality of gaseous materials including one or more reactive gaseous materials, wherein the output face includes a plurality of source openings through which the gaseous materials are supplied and one or more exhaust openings;

wherein an exhaust pressure at the exhaust openings is less than ambient pressure and a source pressure at the source openings is greater than the exhaust pressure that at the exhaust openings, and wherein the pressure at the outermost source openings is greater than ambient pressure;

a substrate unit including the substrate, the substrate having a length in the in-track direction;

a motion control system that moves the substrate unit over the output face of the deposition head in the in-track direction in accordance with a specified motion profile without constraining motion of the substrate unit in a direction normal to the output face of the deposition head, wherein the motion profile includes moving a center of gravity of the substrate unit beyond the first edge of the output face; and wherein an integrated pressure across the output face provides a net force on the first substrate surface in a direction normal to the output face, wherein a sum of the forces on the substrate unit in a direction normal to the output face and a sum of moments on the substrate unit are zero at all positions in the motion profile and wherein a gap exists between the first substrate surface and the output face at all positions in the motion profile.

This invention has the advantage that it enables utilization of greater area of substrate than possible without vacuum-preloading. For example, a vacuum-preloaded deposition head enables the application of SALD coatings to overhung substrates such that the coated area exceeds the in-track size of the deposition head.

BRIEF DESCRIPTION OF THE DRAWINGS

FIGS. 2A-2C are cross-sectional side views of SALD deposition heads useful in the present invention having a single ALD cycle;

FIGS. 6A-6C are cross-sectional views illustrating the range of motion of a substrate unit including a backer device relative to a non-vacuum-preloaded gas bearing deposition head;

FIG. 11A-11C are cross-sectional views of an exemplary embodiment illustrating the range of motion of a substrate unit including a backer device relative to a vacuum-preloaded gas bearing deposition head, wherein outboard support elements including rollers are used to extend the range of motion;

FIG. 12A-12C are cross-sectional views of an exemplary embodiment illustrating the range of motion of a substrate unit including a backer device relative to a vacuum-preloaded gas bearing deposition head, wherein outboard support elements including air bearings are used to extend the range of motion;

FIG. 13A-13C are cross-sectional views of an exemplary embodiment illustrating the range of motion of a substrate unit including a backer device relative to a vacuum-preloaded gas bearing deposition head, wherein a cantilever spring is used to extend the range of motion;

FIG. 14A-14C are cross-sectional views of an exemplary embodiment illustrating the range of motion of a substrate unit including a backer device relative to a vacuum-preloaded gas bearing deposition head, wherein a vertical element and springs are used to extend the range of motion;

FIG. 15A-15B are cross-sectional views of an exemplary embodiment illustrating the range of motion of a substrate unit including a backer device relative to a vacuum-preloaded gas bearing deposition head, wherein a counter weight mechanism is used to extend the range of motion;

FIG. 33 shows a table of flow rates used to provide exemplary SALD coatings; and FIG. 34 shows a table of experimental SALD coatings that were made according to exemplary embodiments.

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
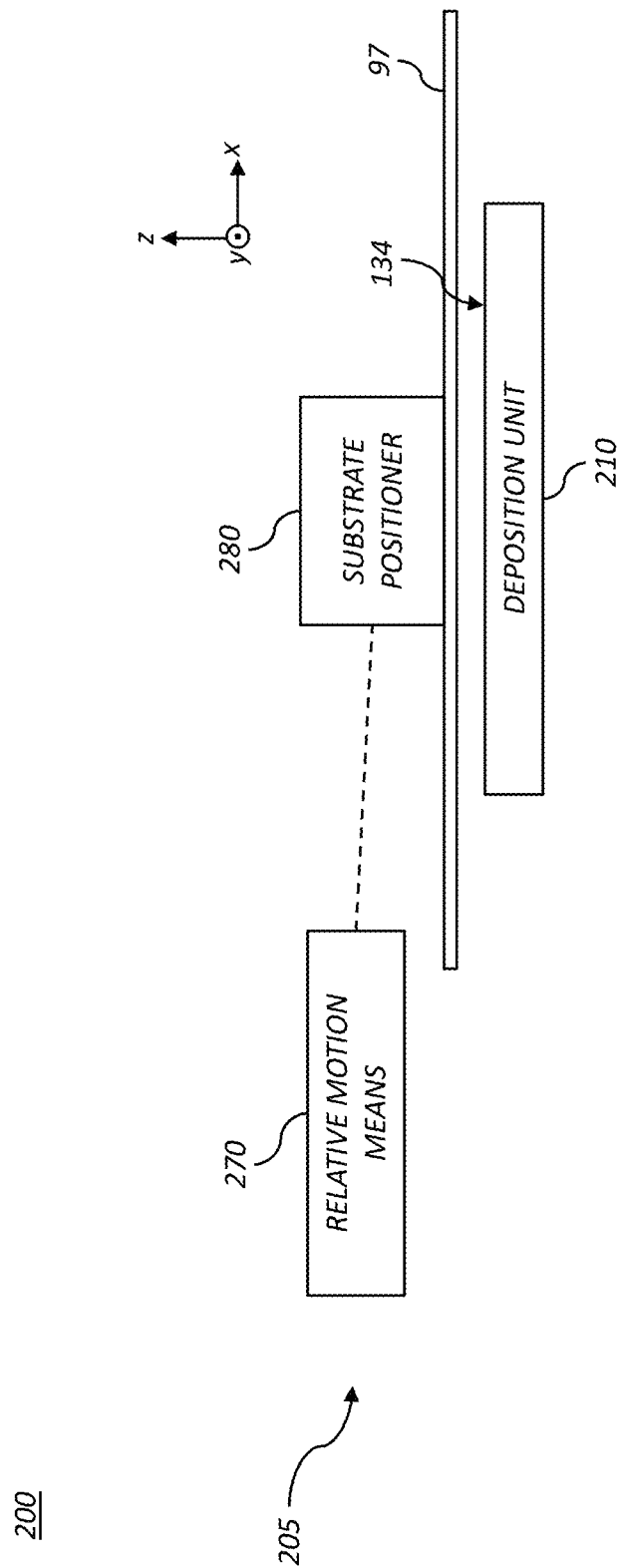
FIG. 1 is schematic block diagram showing the functional elements of an SALD deposition system.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on," "over," "top," "bottom," "left," and "right" are used with reference to the orientation of the figure(s) being described. Because components of embodiments of the present invention can be positioned in a number of different orientations, the directional terminology is used for purposes of illustration only and is in no way limiting.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are generally not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and are not to scale for the sake of clarity. One of ordinary skill in the art will be able to readily determine the specific size and interconnections of the elements of the example embodiments of the present invention. Therefore, the provided figures are not drawn to scale but are intended to show overall function and the structural arrangement of some embodiments of the present invention.

The embodiments of the present invention relate components for systems useful for thin-film deposition. In preferred embodiments, the thin-film deposition is done using a spatial atomic layer deposition (SALD) process. For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. Reactant gas flows can include multiple reactive species together with inert gaseous species. In some embodiments, the reactive gases can include a reactive plasma, such as supplied by a remote plasma source. One type of remote plasma source that can be used includes a surface dielectric barrier discharge source. As such, plasma-enhanced spatial ALD (PE-SALD) arrangements are considered to be useful in some embodiments. While the exemplary embodiments are described in the context of SALD systems, those skilled in the art will recognize that aspects of the present invention can also be used for any application which involves exposing a substrate to one or more gaseous substances, such as chemical vapor deposition processes.

Unless otherwise explicitly noted or required by context (for example, by the specified relationship between the orientation of certain components and gravity), the term "over" generally refers to the relative position of an element to another and is insensitive to orientation, such that if one element is over another it is still functionally over if the entire stack is flipped upside down. As such, the terms "over", "under", and "on" are functionally equivalent and do not require the elements to be in contact, and additionally do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

Embodiments of the present invention are illustrated and described with a particular orientation for convenience; and unless indicated specifically, such as by discussion of gravity or weight vectors, no general orientation with respect to gravity should be assumed. For convenience, the following coordinate system is used: the z-axis is perpendicular to the output face of the deposition head, the x-axis is parallel to the primary motion direction (in the plane of the output face), and the y-axis is perpendicular to the primary motion axis (in the plane of the output face). Roll, pitch, and yaw are as used herein have their commonly understood definitions. To facilitate interpretation of relative motion and degrees of freedom, the following clarifications are provided. Roll is the rotation about an axis parallel to the primary motion axis (x-axis). Pitch is the rotation about the y-axis in the plane of the output face of the delivery device and perpendicular to the primary motion axis. Yaw is the rotation about the z-axis which is normal to the output face of the delivery device.

An ALD process accomplishes thin-film growth on a substrate by the alternating exposure of two or more reactive materials, commonly referred to as precursors, either in time or space. A first precursor is applied to react with the substrate. The excess of the first precursor is removed and a second precursor is then applied to react with the substrate surface. The excess of the second precursor is then removed and the process is repeated. In all ALD processes, the substrate is exposed sequentially to a series of reactants that react with the substrate. The thickness of the ALD (and SALD) deposited thin-films is controlled by the number of ALD cycles to which the substrate is exposed, where a cycle is defined by the exposure to the minimum required reactant and purge gas flows to form the desired thin-film composition. For example, in a simple design, a single cycle can provide one application of a first reactant gaseous material G1 and one application of second reactant gaseous material G2. In order to effectively achieve repeated cycles, SALD requires either motion of the substrate past the deposition head or the development of complex equipment such that the delivery head with its gas connections, can be moved relative to the substrate. Thin-films of appreciable thickness can be accomplished by either 1) using a deposition head containing a sufficient number of gas distribution cycles and moving the substrate (or the deposition head) in a unidirectional motion relative to the deposition head (or substrate) or 2) using a deposition head with a limited number of cycles and using relative reciprocating motion.

In order to effectively use an SALD deposition head for thin-film deposition, it is commonly employed within a larger SALD system, or apparatus. Typically, such systems are specifically designed to deposit thin films on a particular type of substrate (for example, either rigid or flexible). Furthermore, SALD systems typically utilize a singular motion profile type that is chosen as a result of the design of the deposition head and the type of substrate being coated. In many cases, SALD systems are further designed for a specific application, and as such are configured to coat a single material at a given thickness on a substrate having a particular form factor.

As known by one skilled in the art, each SALD system requires at least three functional elements in order to effectively deposit a thin-film, namely a deposition unit, a substrate positioner and a means of relative motion. To date, the specific design of each functional element has generally differed from system to system. As will be described, preferred embodiments of the SALD systems of the present invention are modular in nature, and as such includes a range of components of differing design that can be exchanged to perform the function of a particular functional element within the novel SALD platform. The design and advantages of specific components useful in a range of SALD systems, and design and advantages of inventive elements and configurations of the novel modular SALD platform of the present invention will be better understood with respect to the Figures.

As shown in schematic block diagram of FIG. 1, SALD system 200 of the present invention is preferably one in which a substrate 97 is moved relative to a fixed deposition unit 210. As such, substrate 97 is positioned over the output face 134 of a deposition unit 210 by substrate positioner module 280, and relative motion between the substrate 97 and the deposition unit 210 is accomplished by motion of the substrate positioner module 280 using relative motion means 270, which can also be referred to as a motion controller or a motion control means. The deposition unit 210, substrate positioner module 280 and relative motion means 270 are functional elements of deposition subsystem 205 of SALD system 200. In various embodiments of the present invention, the deposition unit 210 can be a single deposition head 30 or can be a deposition unit that include an array of deposition heads 30. The relative motion means 270 interacts with the substrate positioner module 280 to move the substrate 97 relative to the deposition unit 210.

The substrate positioner module 280 is preferably an interchangeable substrate positioning module, with the modular system having multiple substrate positioning modules that can be easily exchanged into the SALD system 200, where the different substrate positioning modules are configured to handle different types of substrates 97 and different substrate form factors.

Many types of substrates can be coated with the SALD system 200. The substrates 97 used in the present invention can be any material that acts as a mechanical support for the subsequently coated layers. The substrate 97 can include a rigid material such as glass, silicon, or metals. The substrate can also include a flexible material such as a polymer film or paper. Useful substrate materials include organic or inorganic materials. For example, the substrate can include inorganic glasses, ceramic foils, and polymeric materials. The thickness of substrate 97 can vary, typically from about 25 μm to about 1 cm. Using a flexible substrate 97 allows for roll processing, which can be continuous, providing economy of scale and economy of manufacturing relative to flat or rigid supports.

In some example embodiments, the substrate 97 can include a temporary support or support material layer, for example, when additional structural support is desired for a temporary purpose, e.g., manufacturing, transport, testing, or storage. In these example embodiments, the substrate 97 can be detachably adhered or mechanically affixed to the temporary support. For example, a flexible polymeric support can be temporarily adhered to a rigid glass support to provide added structural rigidity during the deposition process. The glass support can be removed from the flexible polymeric support after completion of the manufacturing process. The substrate 97 can be bare indicating that it contains no substantial materials on its surface other the material from which it is composed. The substrate 97 can include various layers and patterned materials on the surface.

The relative motion means 270 is adapted to connect to the interchangeable substrate positioner modules, and as such, the relative motion means 270 and the interchangeable substrate positioner modules preferably contain appropriate mating features. The substrate positioner module 280 is designed to position the substrate 97 in the x- and y-directions relative to the output face 134 of the deposition unit 210. The SALD system 200 may also include a secondary substrate positioner (not shown) which is designed to control the position of the substrate 97 in the z-direction.

In various configurations, the substrate 97 can be attached to a backer device during deposition. The backer device can be used as heat source for the substrate, or to stiffen otherwise flexible substrates. A backer that is temporarily attached to the substrate, by vacuum for example, is intended to move with the substrate during relative motion between the substrate and a fixed deposition head. The backer attachment can provide greatly increased rigidity and flatness to flexible substrates. A backer device useful in the present invention can be larger than the substrate, as might be used to stabilize piece-parts of flexible substrate or approximately the same size as the substrate, or significantly smaller than the substrate when the substrate is rigid and self-supporting. As used herein, the "substrate unit" refers to either the substrate 97 alone or a substrate 97 with an attached backer device; the substrate unit has relative motion relative to the deposition unit 210.

Figure 2C:
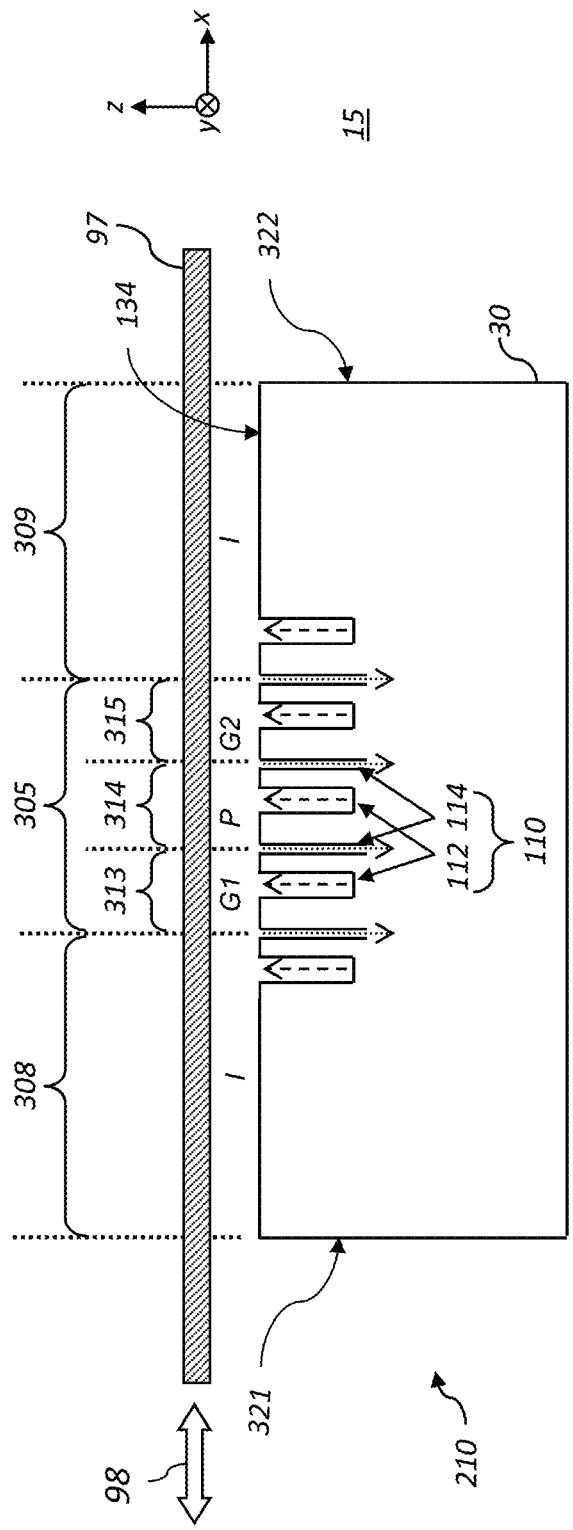

The deposition unit 210 can use any type of SALD deposition head that is known in the art. FIGS. 2A-2C illustrate deposition heads 30 that are configured to simultaneously supply a plurality of gaseous materials from the output face in different gas zones within a deposition zone 305. In all three figures, the deposition zone 305 contains the necessary gas zones for a single two-step ALD deposition cycle. Moving from left to right within the deposition zone 305, there is a first reactive gas zone 313 (G1) followed by an inert gas purge zone 314 (P), and a second reactive gas zone 315 (G2). As the relative motion means 270 (FIG. 1) moves the substrate 97 relative to the deposition head 30 (the x-direction being the primary motion direction as indicated by motion arrow 98), a particular location on the substrate 97 sees the above sequence of gases which results in ALD deposition. Deposition heads 30 of the present can include a deposition zone 305 with gas zones for any number of ALD deposition cycles, the single ALD cycle illustrated is for clarity of understanding.

The SALD systems of the present invention can use any deposition head geometry so long it has the required gas delivery to form gas zones between the deposition head 30 and the substrate 97 in the required order to accomplish an ALD cycle, as illustrated by the simplified deposition head 30 of FIG. 2A. In preferred embodiments, the reactive gases (G1 and G2, for example) have little or no intermixing to avoid a CVD component during film deposition or gas phase reactions. The purge zone 314 (P) serves to separate the reactive gases G1, G2 and allows for the removal of any reaction byproducts from the substrate surface as it moves through the purge zone 314.

A single deposition cycle (moving from left to right) is defined by an inert gas flow I, followed by a first reactive gas flow G1, followed by an inert purge gas flow P, and lastly by a second reactive gas flow G2. The deposition zone 305 has a deposition zone length that spans the distance from the start of the first reactive gas zone to the end of the last reactive gas zone (e.g., from the first reactive gas zone 313 to the second reactive gas zone 315 in FIG. 2A).

The deposition heads 30 illustrated in FIGS. 2A-2C, have extended inert zones 308, 309 on either side of the deposition zone 305. The first inert zone 308 has a first inert zone length that spans the distance from the left edge 321 of the deposition head 30 to the boundary of the first reactive gas zone 313. The second inert zone 309 has a second inert zone length that spans the distance from the boundary of the second reactive gas zone 315 to the right edge 322 of the deposition head 30. The extended inert zones 308, 309 isolate the deposition zone 305 from the external environment 15 and enable the deposition head 30 to coat substrates 97 that are substantially longer than the length of the deposition head 30 without exposing the growth region to the external environment 15. Deposition heads of the prior art are typically operated within a larger system where the external environment is controlled to be inert, under vacuum, or both. In preferred embodiments of the present invention, the deposition head 30 can be used at atmospheric pressure without any additional environmental controls for the external environment 15. One of the advantages of the present invention is that the deposition head 30 and SALD system 200 containing it can be used to coat on substrates 97 whose length is much larger than the length of the deposition zone 305. A further advantage of some embodiments of the present invention is the ability to control the environment of the region of the substrate being actively coated during deposition. Additionally, the relatively small deposition head size allows for lower cost manufacturing of the deposition head.

It is known that ALD is self-limiting, meaning that when all available sites on a substrate surface have reacted with a precursor there is no further reaction during that half-step. When both half-reactions in a deposition cycle have sufficient time and available precursor to reach this state, it is said that the ALD cycle has reached "saturation". ALD depositions done in these conditions are by definition, saturated ALD, and continued exposure to the precursors does not change significantly the deposition amount. In SALD, the substrate velocity and length of reaction zones determine the exposure time to a give precursor. For a given velocity, there is a minimum zone length required to reach saturation (i.e., a "saturation length") and zone lengths longer than the saturation length do not add film thickness during material deposition. SALD systems of the present invention can be used in both saturated and sub-saturated conditions. One advantage of the present invention is that sub-saturated growth can still be deterministic, since each point on the substrate 97 will see the same concentration of precursors for a time which is set by the substrate velocity and motion profile.

The motion arrow 98 indicates one known motion of the substrate 97 useful in SALD which is to move the substrate 97 in a smooth oscillating, or reciprocating, motion through the entire deposition zone 305 such that the substrate "sees" the required number of cycles to produce the desired coating thickness (as discussed above). In preferred embodiments of the present invention the substrate motion is controlled such that the region being actively coated is prevented from experiencing the external environment during coating. This has the advantage of avoiding contamination of the thin-films during growth by preventing exposure to any reactive species or dust particulates or other contaminates that may be present in the external environment outside of the controlled environment defined by the region between the deposition head 30 and the substrate 97.

The deposition head 30 of FIG. 2B illustrates an embodiment where one or more of the gas zones use a transverse arrangement, such as that disclosed in the aforementioned commonly-assigned U.S. Pat. No. 7,456,429 (Levy et al.), entitled "Apparatus for atomic layer deposition." In a transverse flow arrangement, the flow of gases during deposition is orthogonal, or transverse, to the direction of substrate motion and is exhausted either out the edges of the deposition head 30, or into exhaust slots along the perimeter of the deposition head 30. As illustrated, the deposition head 30 has gas slots 110 (i.e., output slots 112) that are configured to supply the gases into their corresponding gas zones. In other embodiments, the deposition head 30 provides gas to the elongated parallel gas zones through an array of orifices, rather than through the illustrated output slots 112 (elongated channels).

The deposition head 30 of FIG. 2C illustrates a preferred gas bearing deposition head 30 of the present invention. The principles and design of gas bearing deposition heads 30 has been described in detail in the aforementioned U.S. Patent Application Publication 2009/0130858, as well as in commonly-assigned U.S. Pat. No. 7,572,686 (Levy et al.), entitled "System for thin film deposition utilizing compensating forces." As shown in FIG. 2C, an exemplary deposition unit 210 includes a deposition head 30 that operates on a vacuum-preloaded gas bearing principle having an output face 134 (facing upward) having gas slots 110 which provide gases into the gas zones and exhaust gases from the gas zones. Gases are provided into the gas zones by spatially separated elongated output slots 112 (extending in the y-direction). Each gas zone includes a corresponding output slot 112. Adjacent exhaust slots 114 remove (or exhaust) gas from the gas zones. The exhaust slots 114 are positioned to define the boundaries of the various gas zones. As illustrated, the gas zones are equivalent to those of FIGS. 2A and 2B.

In these preferred embodiments wherein the deposition head 30 operates using a gas bearing principle the substrate 97 is positioned above the output face 134 of the deposition head 30 and is maintained in close proximity to the output face 134 by an equilibrium between the pull of gravity, the flow of the gases supplied to the output face 134 through the output slots 112, and a slight amount of vacuum at the exhaust slots 114. While the gas openings in this example are gas slots 110 (also referred to as gas channels) that extend in the y-direction, one skilled in the art will recognize that the gas openings could also have other geometries, such as a row of nozzles or circular orifices, so long as the proper gases are delivered into and exhausted from the gas zones between the deposition head and the substrate.

As shown in FIG. 2C, the gases are introduced and exhausted in alternating output slots 112 and exhaust slots 114 in the output face 134 of the deposition head 30. The flow of gases between the output slots 112 during deposition is primarily in the direction of substrate travel (forward and backward) toward the adjacent exhaust slots 114. As discussed earlier, the region that spans the reactive gas zones can be referred to as the deposition zone 305, which is preferably surrounded by two inert zones 308, 309. The individual gas zones within the deposition zone 305, where the substrate 97 is exposed to each gas, generally extend outward from the corresponding output slot 112 to the two adjacent exhaust slots 114 as illustrated for the first reactive gas zone 313, the purge zone 314, and the second reactive gas zone 315. In the illustrated configuration, the extended inert zones 308, 309 extend from the inert gas output slots 112 to the edges of the deposition head 30. In alternative embodiments, the extended inert zones 308, 309 can include additional output slots 112 or other gas supply features. Additionally, the extended inert zones 308, 309 can include exhaust slots 114, or other exhaust features, to provide additional protection/separation from the external environment 15.

Using any of the embodiments of deposition head 30 of FIGS. 2A-2C, an SALD deposition process can be accomplished by oscillating the position of the substrate 97 across the deposition head 30 (in the in-track direction indicated by the motion arrow 98) for the number of cycles necessary to obtain a uniform deposited film of the desired thickness for the given application.

Figure 3A:
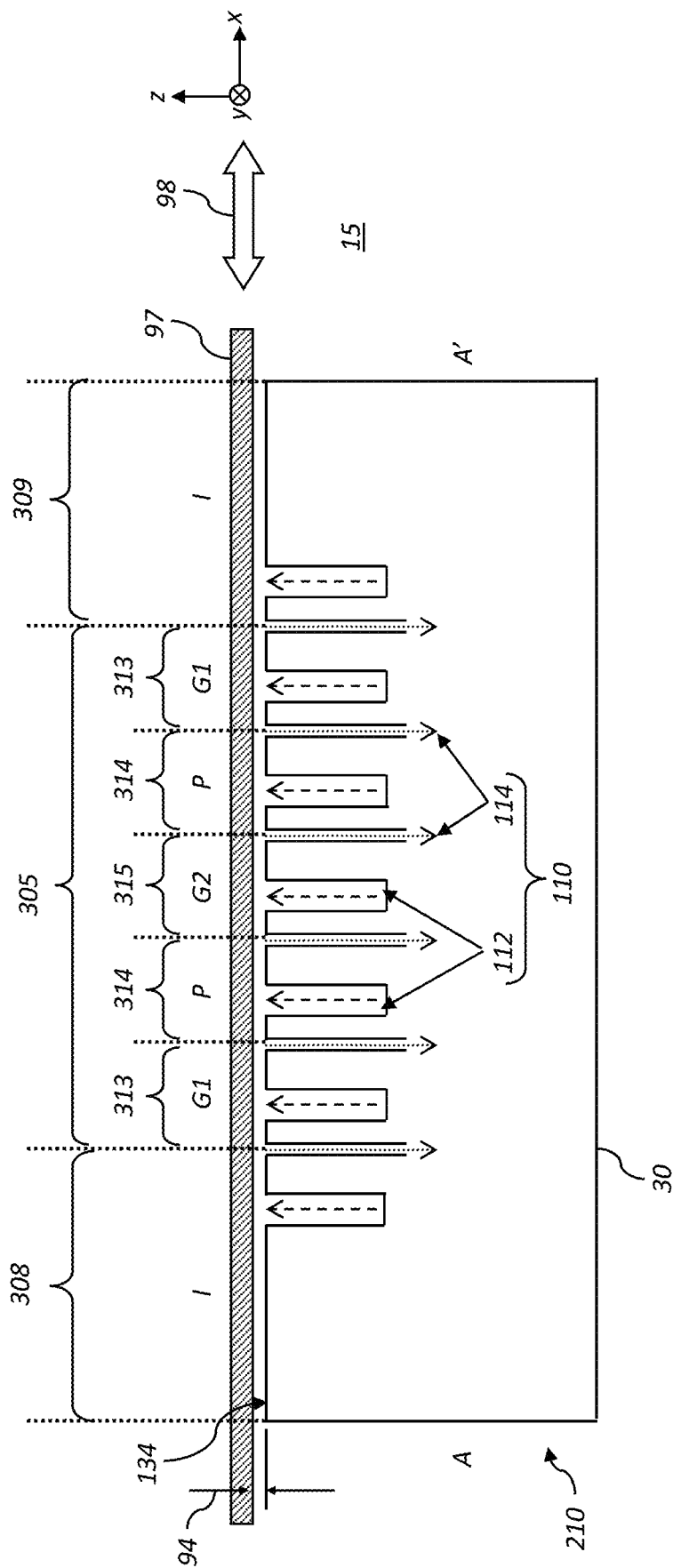
FIG. 3A is a cross-sectional side view of an alternative embodiment of an SALD deposition head having 1.5 ALD cycles.
Figure 3B:
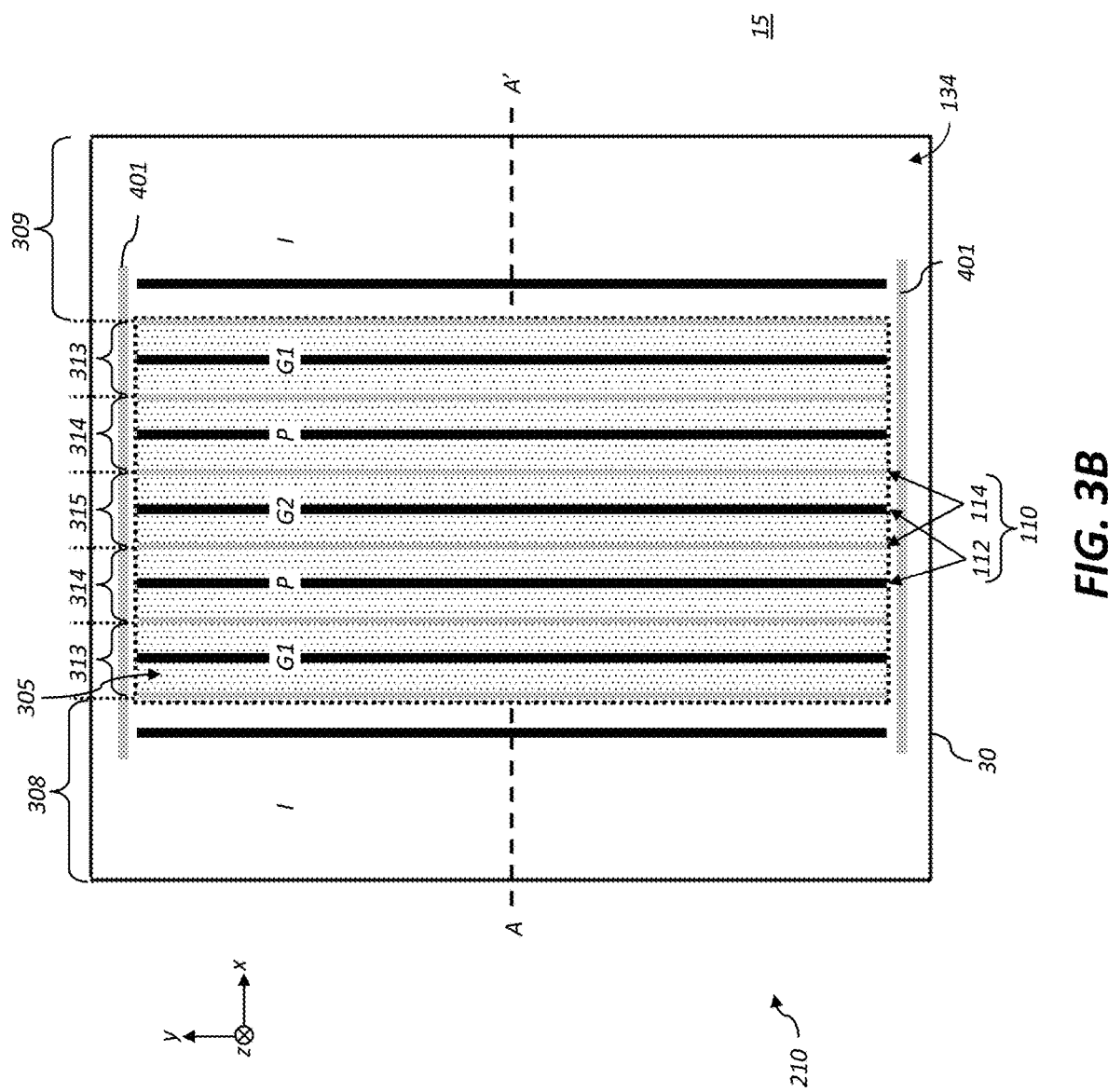
FIG. 3B is a plan view of the SALD head of FIG. 3A.

FIG. 3A is a cross-sectional view of a deposition head 30 illustrating a preferred embodiment of the present invention where the deposition zone 305 is arranged to be symmetric, so that as the substrate 97 is moved relative to the deposition head 30 a position can "see" a full cycle exposure in either a forward or reverse direction. FIG. 3B illustrates a plan view corresponding to the cross-sectional view of FIG. 3A, where the cross-sectional view is taken along the line A-A' of the plan view. In common parlance, the deposition head 30 illustrated in FIG. 3A-3B can be referred to a "one-and-a-half cycle head" or a "1.5 cycle head." Moving from left-to-right through the deposition zone 305, the substrate 97 is exposed to (in order) a first reactive gas zone 313 where the substrate is exposed to a first reactive gas G1, an inert purge zone 314 where the substrate is exposed to an inert purge gas P, a second reactive gas zone 315 where the substrate is exposed to a second reactive G2, another inert purge zone 314 where the substrate is exposed to the purge gas P, and another first reactive gas zone 313 where the substrate is exposed to the first reactive gas G1. Moving in the reverse direction from right-to-left through the deposition zone 305, the substrate 97 is exposed to the same sequence of gases as in the forward (left-to-right) direction, namely the first reactive gas G1, the inert purge gas P, the second reactive gas G2, the inert purge gas P, and the first reactive gas G1. The advantage of this symmetry is that feeding the substrate 97 from left-to-right or right-to-left results in equivalent exposure, and entrance and exit sides of the deposition head 30 depend of the direction of relative motion of the substrate 97 not the design of the deposition head 30.

As with the previous embodiments, the gas zones (or regions) are between the substrate 97 and the deposition head 30. The labels in FIG. 3A are placed above the substrate for clarity and to further emphasize the small working distance 94 between the process-side of substrate 97 and the output face 134 of the deposition head 30 enabled by the use of a vacuum-preloaded gas bearing deposition head 30. As illustrated in the plan-view of FIG. 3B, in addition to the output slots 112 (shown as black lines) and the exhaust slots 114 (shown as gray lines) in the deposition zone 305 (shown as a shaded area), there are additional output slots 401 orthogonal to the gas slots 110 in the deposition zone 305. The additional gas output slots 401 provide inert gas to the cross-track edge region of the deposition head 30, providing further isolation of the deposition zone 305 from the external environment 15.

The exemplary gas bearing deposition head 30 of FIG. 3A has gas slots 110 corresponding to 1.5 ALD cycles to provide the proper sequence of gas exposure in the forward and reverse directions. As the substrate 97 is oscillated back and forth over the deposition head 30, it will provide only a single ALD cycle (one G1 and one G2 exposure) per single direction pass over the deposition head 30, therefore a round trip oscillation provides two ALD cycles. Furthermore, when the second precursor G2 is reactive with the external environment, while the first precursor G1 is not, this arrangement provides additional protection against unwanted reactions involving G2. An example of a precursor pair that would benefit from this arrangement is water and trimethylaluminum (TMA), where water is the non-reactive precursor G1 and TMA is the highly reactive precursor G2.

The deposition head 30 is preferably constructed of a material which does not react with the precursor gases and can withstand the required temperatures without significant deformation. One preferable material is stainless steel. It is recognized that other materials can also be used, but differential thermal expansions must be kept low to prevent distortions. As described, the deposition head 30 delivers multiple reactive and inert process gasses through output face 134. Connection of the various gas sources to the deposition head 30 can be accomplished using individual pipe or tubing connections distributed about the periphery of the deposition head 30. In an exemplary configuration, commercially available fittings, such as Swagelok VCR series components, are used for gas source connections. In preferred embodiments, the gases are supplied to the deposition head 30 via a manifold.

A relatively clean external environment is useful to minimize the likelihood of contamination, but is not necessary. Full "clean room" conditions or an inert gas-filled enclosure can be used in systems of the present invention, however preferred embodiments do not be require control of the external environment and are advantaged for that reason. The apparatus of the present invention is advantaged in its capability to perform deposition onto a substrate 97 over a broad range of temperatures, including room temperature, or near-room temperature, in some embodiments. The apparatus of the present invention can operate in a vacuum environment, but is particularly well suited for operation at or near atmospheric pressure. In preferred embodiments, the SALD process can be performed at or near atmospheric pressure and over a broad range of ambient and substrate temperatures, preferably at a temperature of under 300° C.

An SALD deposition head operating as a vacuum-preloaded gas bearing has been described in the aforementioned U.S. Pat. No. 7,572,686 (Levy et al.), which is incorporated herein by reference. As noted, the use of a vacuum-preloaded gas bearing can provide efficiency of materials utilization, freedom from gas intermixing, and fast reaction kinetics due to the very small gap between the substrate (deposition side) and the output face of the deposition head. Desired gaps for prior art optimum operation are less than 50 µm, in some cases less than 30 µm. The present invention has a preferred operation with a substrate-head fly height (i.e., process gap, $d_p$) of less than 30 µm, or even less than 10 µm which is practical and preferred for stable vacuum-preloaded bearing operation with minimal gas flows. Experimental measurements using the process parameters of the present invention have more preferred gaps of approximately 5 µm, enabled by careful co-optimization of the mass flows of reactant and inert gasses, as well as exhaust vacuum levels. This preferred operation condition is within a range more restrictive than previously contemplated and enables the coating of much larger substrates than could be accomplished using a similar geometry with a gap of 30 µm. Furthermore, in preferred embodiments of the present invention, the coating of large substrates can be accomplished with the use of a vacuum attached substrate backer, with an associated weight.

As noted, the use of vacuum preloading is a means to improve gap control between the SALD deposition head and the substrate to improve gas confinement, avoid intermixing, and increase reaction kinetics. U.S. Pat. No. 7,572,686 describes an operation condition wherein the vacuum "pressure" at the exhaust slots is at least 2× the weight per unit area of the substrate (expressed in equivalent pressure units evaluated over the area of the output face). In this previous vacuum-preloaded gas bearing design it is taught that the deposition head may be traversed across the fixed substrate wherein the center of gravity of the deposition head would always be over the substrate. Embodiments of the present invention enable the coating of substrates that are significantly longer than a fixed-position deposition head, and provide for a greater extent of substrate motion in gas bearing SALD systems, and are desirable for use in a modular SALD system. The present invention addresses issues of operation during loading, preheating, and depositing when using a gas bearing deposition head that is smaller than the substrate being coated, and in particular for systems where the region of the substrate not over the deposition head is subject to an external environment.

Referring back to FIGS. 3A and 3B, the vacuum-preloaded gas bearing deposition head 30 provides gas pressure against substrate 97, such that the working distance 94 is maintained, at least in part, by the force of pressure that is exerted. By maintaining some amount of gas pressure between output face 134 and the process surface of the substrate 97, the apparatus of the present invention provides at least some portion of an air bearing, or more properly a gas fluid bearing, between the deposition head 30 and the substrate 97 as illustrated in FIG. 3A. Importantly, the effect of controlling the working distance 94, or gap, between the deposition head 30 and the substrate 97 using a gas fluid bearing generates a pressure profile in the deposition zone 305 which advantageously maintains the isolation of the reactive gas zones. By allowing the substrate 97 to float on the gas flows from the deposition head 30, pressure fields are set up in the reactive gas zones 313, 315 and purge zones 314 cause the gases to be directed from the output slots 112 to the exhaust slots 114 with little or no intermixing with other gas streams, particularly when operated as a vacuum-preloaded gas bearing. One advantage of maintaining the working distance 94 using this gas bearing design is the allowance of essentially frictionless motion of the substrate 97 over the deposition head 30 using any suitable type of transport mechanism. Alternatively, the deposition head 30 can be caused to "hover" above the surface of substrate 97 as it is channeled back and forth, sweeping across the surface of substrate 97 during materials deposition.

A deposition process can be accomplished using the SALD system of FIG. 3A by oscillating the substrate 97 across the deposition head 30 for the number of cycles necessary to obtain a uniform deposited film of the desired thickness for the given example. In alternative embodiments, other motion profiles are used which have an oscillatory component with net forward movement of the substrates. A substrate positioner module 280 (FIG. 1) is used to move the substrate 97 in preferred embodiments of the present invention with a specified motion profile. As previously described, the substrate positioner module 280, or substrate positioner, is configured to position and move the substrate in the x-y plane. The substrate positioner module 280 can be considered as the payload for a motion actuator (not shown) such as a linear motion controller. As shown in FIG. 3A, the substrate 97 has a length in the in-track direction (x-direction) that is longer than the length of the output face 134 and longer than the length of the deposition zone 305. In preferred embodiments of the present invention the substrate positioner module 280 is configured, via the motion actuator, to control the motion of the substrate 97 in a specified motion profile that prevents a region on the substrate 97 where material has been deposited from being exposed to the external environment 15 prior to having achieved a final material deposition amount.

Advantageously, the deposition head 30 can be fabricated at a smaller size than the substrates that it will be used to coat. Furthermore, the geometry of the deposition head shown in FIG. 3A allows for the output slots 112 and the exhaust slots 114 to be positioned in close proximity to each other, often at distances which are difficult to achieve for other types of deposition heads. For example, in one embodiment, the output slots 112 have a width of 0.005 inches (0.127 mm) and is extended in length to about 3 inches (75 mm). Advantageously, the SALD system of the present invention may be used to coat substrates 97 that are significantly longer than the length of the deposition head 30 using a simple oscillating motion while simultaneously maintaining the distance between the deposition head 30 and the substrate 97 using a vacuum-preloaded gas bearing design. Without the use of a vacuum-preloaded gas bearing design, long substrates 97 would require mechanical positioning and constraint in the z-direction due to tipping forces that will be better understood with respect to the discussion of FIGS. 4A-4C.

Figure 4A:
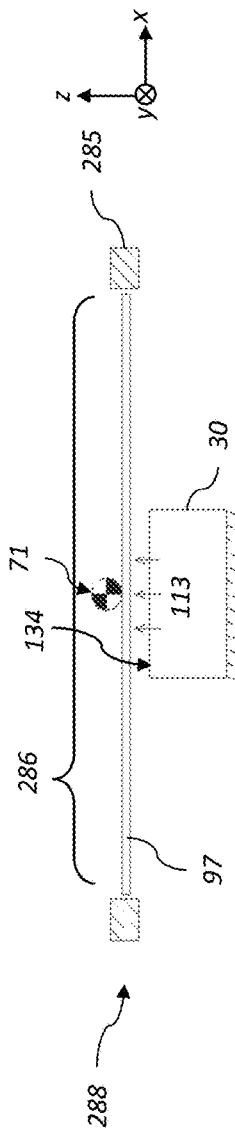
FIGS. 4A-4C are cross-sectional views illustrating the range of motion of a substrate relative to a non-vacuum-preloaded gas bearing deposition head.
Figure 4B:
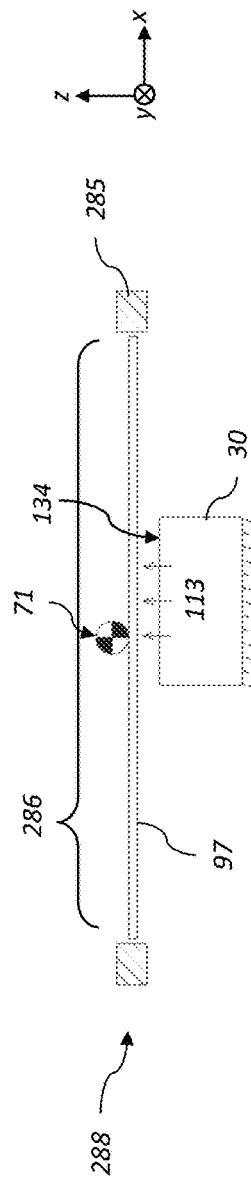
Figure 4C:
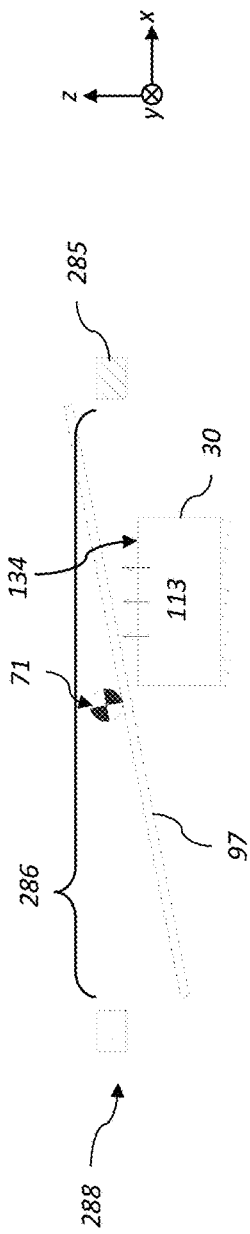

The resultant force vector of a gas film emanating from the output face 134 of the deposition head 30 can be determined by the area integral of the gas pressure distribution over the output face 134. For purposes of simplified discussion, a deposition head 30 having elongated output gas slots in the cross-track direction, as in FIGS. 3A-3B, will be considered illustrative of deposition heads 30 of various comparable geometries. In the following examples, the pressure distribution along the direction of the elongated output slots 112 will be considered uniform and edge effects along the lateral edges ignored. This enables a 2-D representation which is illustrated in the following figures. For non-vacuum-preloaded gas bearing designs having an output face with a uniform pattern of pressurized slots, orifices, or porous media, the resultant force vector acts at the area centroid of the pattern and is a directed outward along the normal of the output face. An example non-vacuum-preloaded gas bearing design is illustrated in FIGS. 4A-4C, which includes three equidistantly spaced parallel elongated output slots. Force vectors 113 are shown corresponding to the net force from each output slot.

FIGS. 4A-4C illustrate the issues associated with the use of a gas bearing deposition head 30 without vacuum preloading. These figures are cross-sectional views through the substrate positioner 288, substrate 97 and deposition head 30. The interaction with the center of gravity 71 of the rigid substrate 97 is shown in various substrate positions. As was described above, a motion actuator (not shown) will move a substrate positioner module 280 (FIG. 1); the substrate positioner 288 illustrated is a component of a substrate positioner module 280. In this example, the substrate positioner 288 consists of a frame 285 having a frame opening 286. The substrate 97 fits within the frame opening 286, positioning it in x-y, but allowing for free movement in the z-direction. Moving the substrate positioner 288 causes the substrate 97 to move laterally over the output face 134 of the deposition head 30 in accordance with a specified motion profile without constraining motion of the substrate 97 in a direction normal to the output face 134 of the deposition head 30.

As shown in FIGS. 4A-4B, such an arrangement is stable as long as the center of gravity 71 of the rigid substrate 97 is located above the output face 134 of the deposition head 30. In FIG. 4B the substrate 97 has been moved to bring the center of gravity 71 to the edge of the deposition zone (i.e., over the outermost slot). The substrate 97 has a weight vector acting in a downward direction, and the weight vector can pass through the area bounded by the outermost output slots while maintaining levitation and staying "attached" to the head provided that the pressure from the deposition head 30 was adequate. Under these conditions, the substrate can be traversed or reciprocated while maintaining the weight vector within the bounds of the deposition zone. In the case of FIG. 4B, the gas flow from the deposition head 30 is such that there is only a region of positive pressure as indicated by force vectors 113, which provides no restoring force to stabilize the substrate 97. As shown in FIG. 4C when the motion profile includes moving a center of gravity of the rigid substrate 97 beyond the edge of the last output slot, the substrate 97 will tip and the coating integrity is lost, and therefore the non-vacuum-preloaded deposition head 30 of FIGS. 4A-4C is unable to coat longer substrates 97 without additional mechanical constraints and complexities. This represents a substantial limitation on the range of motion for the substrate 97 relative to the deposition head 30 and results in a very small area in the center of the substrate 97 being available for deposition.

Figure 5A:
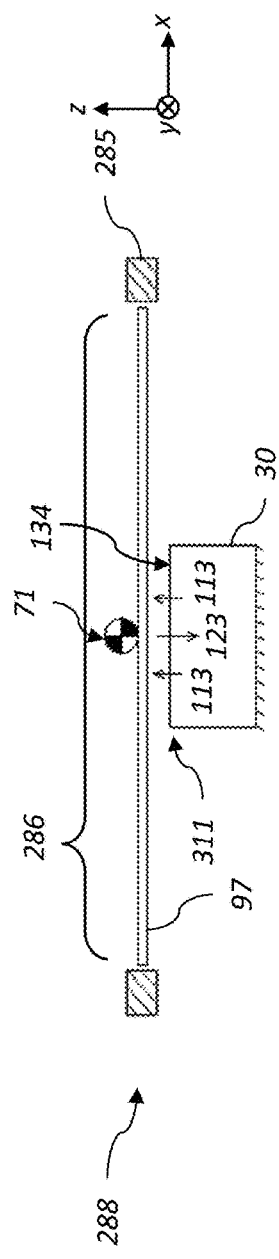
FIGS. 5A-5D are cross-sectional views of an exemplary embodiment illustrating the range of motion of a substrate relative to a vacuum-preloaded gas bearing deposition head.
Figure 5B:
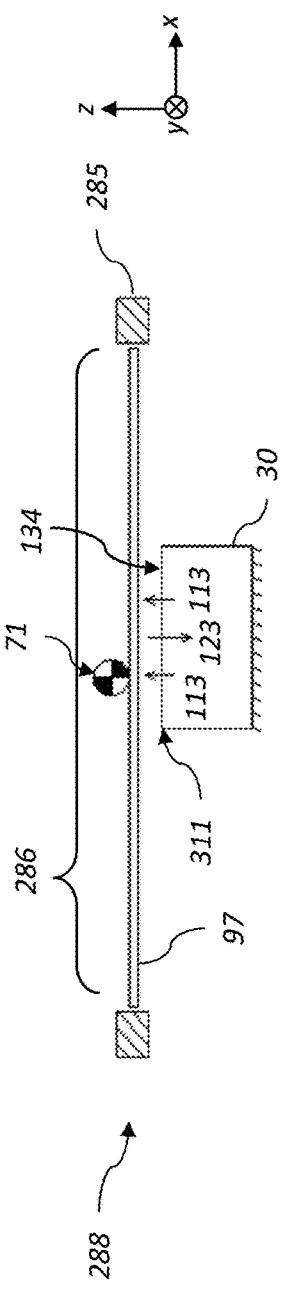
Figure 5C:
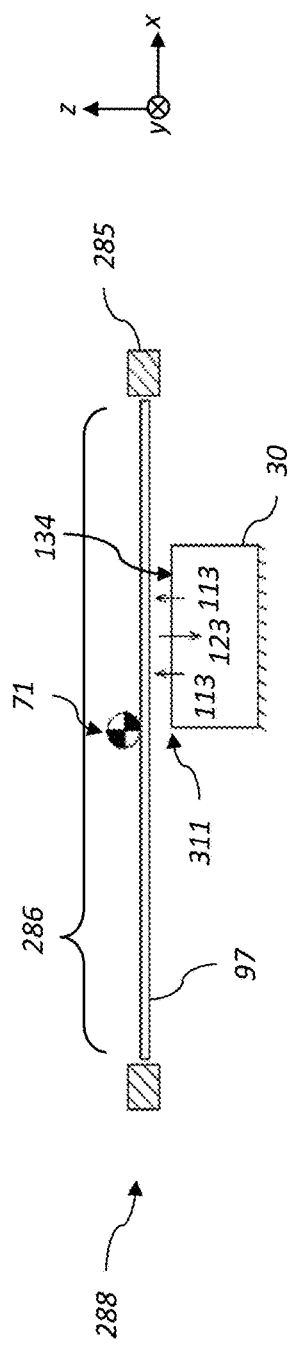
Figure 5D:
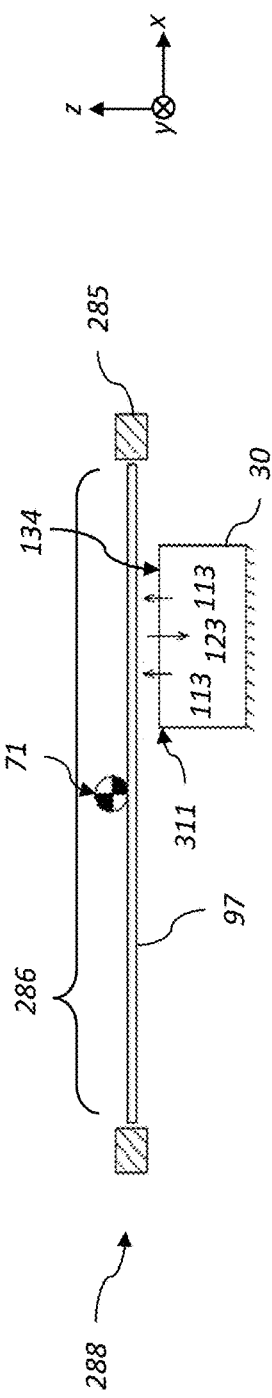

FIGS. 5A-5D illustrate the use of a vacuum-preloaded gas bearing deposition head 30 in accordance with an exemplary embodiment of the present invention in a similar arrangement to that shown in FIGS. 4A-4C. For an output face 134 comprised of uniformly distributed alternating positive and negative pressure regions, such as illustrated in FIG. 3A, the resultant force vector is also normal to the output face 134 but may be directed toward or away from the output face 134 (depending on the relative intensity of the positive and negative force vectors). In a vacuum-preloaded gas bearing deposition head 30, the direction and magnitude of the resultant force depends on the gap distance between the output face 134 and the substrate 97 and changes from a positive (repulsive) condition when the substrate 97 is close, to negative (attractive) condition when the substrate 97 is further away. One minimalist example of this preloaded bearing is a single elongated vacuum exhaust slot positioned centrally between two parallel output slots (or output channels) as illustrated in FIGS. 5A-5D. The force arrows 113 correspond to regions of positive pressure formed above the output slots 112 (FIG. 3A) and the force arrow 123 corresponds to regions of negative pressure formed above the exhaust slots 114 (FIG. 3A). When the center of gravity 71 of the substrate 97 has been moved beyond the edge of the deposition head 30 as illustrated in FIG. 5D, the exhaust flow into the deposition head 30 contributes to an integrated pressure across the output face 134 that provides a net force on the substrate 97 in a direction towards the output face 134. This net force enables the system to counterbalance the weight of the substrate 97 so that the sum of moments on the substrate 97 about the first edge of the output face 134 is zero even when the center of gravity 71 is beyond the edge 311 of the deposition head 30. This compensating force advantageously allows for a much larger coating area using a reciprocating motion than could be accomplished using a non-vacuum-preloaded gas bearing design, or stated another way enables a much larger range of motion in the motion profile.

In general, vacuum-preloaded gas bearing deposition heads 30 have an output face 134 with a plurality of output openings (e.g., output slots 112 in and FIG. 3A) and one or more exhaust openings (e.g., exhaust slots 114 in FIG. 3A). The output openings can also be called source openings. The exhaust pressure at the exhaust openings is less than ambient pressure, and the output pressure at the output openings is greater than that at the exhaust openings. Generally, the pressure at the outermost output openings will be greater than ambient pressure.

In some embodiments, the substrate 97 is attached to a backer device during deposition. The backer device can be used as heat source for the substrate, or to stiffen otherwise flexible substrates. A substrate backer that is temporarily attached to the substrate 97, by vacuum for example, is intended to move with the substrate 97 during relative motion between the substrate 97 and a fixed deposition head 30. The backer attachment can provide greatly increased rigidity and flatness to flexible substrates 97. A backer device useful in the present invention can be larger than the substrate 97, as might be used to stabilize piece-parts of flexible substrate 97 or approximately the same size as the substrate 97, or significantly smaller than the substrate 97 when the substrate 97 is rigid and self-supporting. The backer device may have a similar aspect ratio and/or surface area as the substrate 97, or may have a different design. For instance, a backer device with a square contact area could be attached to round planar substrate 97, like a wafer for example. Many other configurations are possible and fall within the scope of the present invention.

FIGS. 6A-6C illustrate the issues associated with the use a gas bearing deposition head 30 without vacuum preloading to support a substrate unit 74 that includes the substrate 97 and a backer device 70, and are analogous to FIGS. 4A-4C. As shown, the substrate 97 is attached to backer device 70. The attachment force used to hold the backer device 70 and substrate 97 in contact can be provided using any means known in the art including mechanical means, and is preferably achieved by a vacuum force. In the illustrated configuration, the backer device 70 fits within frame opening 286 in frame 285 of the substrate positioner 288, and the substrate 97 is positioned below the frame 285. As was described above, a motion actuator (not shown) will move the substrate positioner 288 during thin film deposition. The substrate positioner 288 is configured to move the backer device 70 and the attached substrate 97 laterally over the output face 134 of the deposition head 30 in accordance with a specified motion profile without constraining motion of the backer device 70 and the substrate 97 in a direction normal to the output face 134 of the deposition head 30. The backer device 70 has a weight vector that passes through the mass centroid of the substrate 97, and the combination of the backer device 70 and substrate 97 is herein referred to as the substrate unit 74. The combined substrate unit 74 has a center of mass 71. The substrate unit 74 is levitated in the condition where the weight vector is over the deposition head 30 and the pressure in the bearing region is adequate to support the weight of the substrate unit 74. In a non-vacuum-preloaded configuration, the substrate unit 74 can be traversed or reciprocated over a comparable distance similar to the case illustrated in FIGS. 4A-4C, where the substrate unit 74 contains only the substrate 97 (with no backer).

As shown in FIGS. 6A-6B, at best, such an arrangement is stable for as long as the center of gravity 71 of the substrate unit 74 is located above the region bounded by the positive pressure of the output slots, typically the deposition zone. FIG. 6B is analogous to FIG. 4B, illustrating the condition where the substrate unit 74 has been moved to a position bringing the center of gravity 71 to the edge of the last output slot. The substrate unit 74 is now at (or beyond) the tipping point in the case of FIG. 6B, where the gas flow from the non-vacuum-preloaded gas bearing deposition head 30 is such that there is only a region of positive pressure as shown by force vectors 113, which provides no restoring force to stabilize the substrate unit 74. As shown in FIG. 6C when the substrate unit 74 is moved to a position where the center of gravity 71 of the substrate unit 74 is beyond the last output channel, the substrate will tip and the coating integrity is lost. As noted above, this represents a substantial limitation on the range of motion for the substrate unit 74 relative to the deposition head 30 and results in a very small area in the center of the substrate 97 being available for deposition.

Figure 7A:
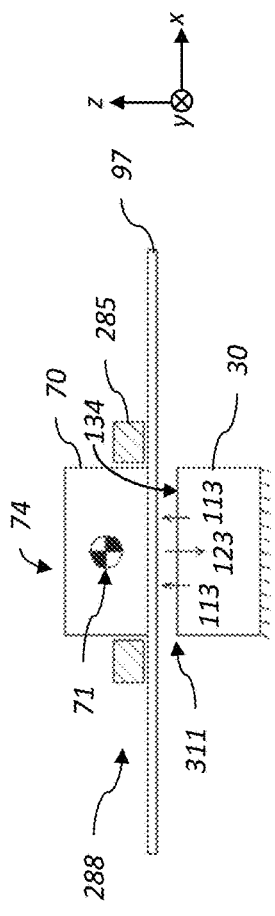
FIGS. 7A-7C are cross-sectional views of an exemplary embodiment illustrating the range of motion of a substrate unit including a backer device relative to a vacuum-preloaded gas bearing deposition head.
Figure 7B:
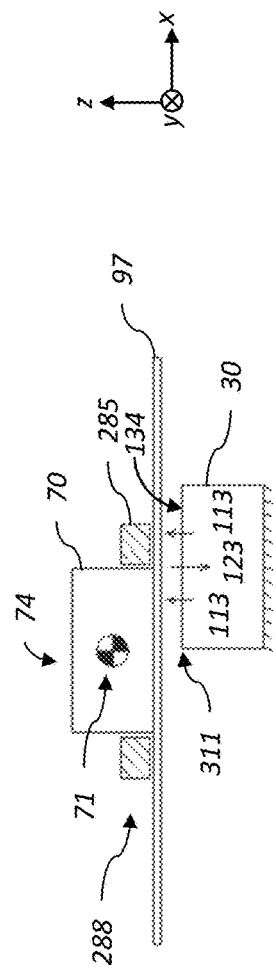
Figure 7C:
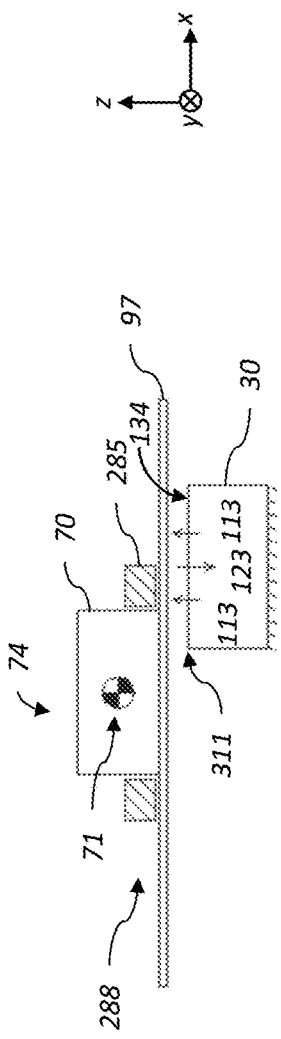

FIGS. 7A-7C illustrate an exemplary embodiment using a vacuum-preloaded gas bearing deposition head 30 together with a substrate unit 74 including a substrate 97 and a backer device 70. The force arrows 113 correspond to regions of positive pressure formed above the output slots 112 (FIG. 3A) and the force vector 123 corresponds to a region of negative pressure formed above an exhaust slot 114 (FIG. 3A). As shown in FIG. 7C, in this embodiment, the exhaust flow into the deposition head 30 contributes to an integrated pressure across the output face 134 that provides a net force on the substrate 97 in a direction towards the output face 134 to counterbalance the weight of the substrate unit 74 so that the sum of moments on the substrate unit 74 about the edge 311 of the output face 134 is zero at a much larger range of positions in the motion profile. This compensating force advantageously allows for a much larger coating area using a reciprocating motion than could be accomplished using a non-vacuum-preloaded gas bearing design, or stated another way, a much larger range of motion in the motion profile. This basic arrangement is compatible with a wide range of substrate units 74, including those described above.

As illustrated in FIGS. 2A, 2B, 3A, and 3B, the deposition head 30 of the present invention preferably has extended inert zones 308, 309 on either side of the deposition zone 305. These inert zones 308, 309, as previously described, have a length and contain an output slot which provides an inert gas. The inert zones have an associated pressure which is positive, with respect to the air pressure in the external environment 15, and so provides a repulsive normal force on the substrate unit 74. When the substrate unit 74 is moved to a position where the center of gravity 71 is displaced from the area centroid of the active area of the vacuum-preloaded gas bearing deposition head 30, and in particular outboard of the output slot 112 of the inert zone 308, 309, there will be a position where the resultant force from the preloaded gas bearing changes from repulsive to attractive. The actual displacement where this occurs depends on the inert zone length and pressure. When the center of gravity 71 of the substrate unit 74 is outboard of the center of the inert zone length, and still over the deposition head 30, the force in the active zone is attractive. In practice, the location that the net force that the deposition head 30 imparts on the substrate unit 74 changes from repulsive (floating) to attractive (preventing the substrate unit 74 from detaching/tipping) is determined by the pressure gradient in the inert zone 308. Referring to FIGS. 5D and 7C, when the deposition head 30 is configured consistent with a vacuum preload gas bearing deposition head 30 as illustrated in FIGS. 2C, 3A, and 3B, the vertical forces include the downward force of the substrate unit 74 weight, the upward lift from the inert zones 308, 309, and the net force from the preloaded active zone (from the distributed output slots 112 and exhaust slots 114). The forces in the inert zones 308, 309 and deposition zone 305 are variable depending on the position of the substrate unit 74. At positions wherein the center of gravity 71 of the substrate unit 74 is outboard of an inert zone center, the force component in the active zone is downward, as described above.

In the present invention, static equilibrium of the substrate unit 74 is accomplished when the sum of forces acting in the vertical direction is zero and $$\Sigma F_z = 0 \tag{1a}$$

$$\Sigma M_0 = 0 \tag{1b}$$

where $F_Z$ is the z-component of the forces on the substrate unit 74 (where the z-direction is normal to the output face 134), and $M_0$ are the moments acting around a specified point. It is convenient to compute the moments about the substrate unit 74 centroid so that the substrate unit 74 weight is not a factor. For the 2-D simplified example with an arbitrary pressure distribution for rectangular substrate having a weight per unit width, it can be shown that these equilibrium conditions yield the following equations:

$$\frac{W}{w} = \int^{Substrate} P(x)dx \tag{2a}$$

$$0 = \int^{Substrate} P(x) \cdot (x - x_0)dx \tag{2b}$$

where P(x) is the gauge pressure distribution above the deposition head 30 as a function of x (i.e., the position in the in-track direction), W is the weight of the substrate unit 74, w is the width of the substrate in the cross-track direction (i.e., the y-direction), and $x_0$ is the x-position of the center of gravity 71 of the substrate unit 74.

When the output face 134 is discretized into regions, such as inert zones 308, 309 and a deposition zone 305, the pressure distribution over those regions can be represented by equivalent force vectors according to the following integrals:

$$F_e = w \int_A^B P(x)dx \tag{3a}$$

-continued $$Xe = \frac{\int_A^B x \cdot P(x)dx}{\int_A^B P(x)dx} \quad (3b)$$

where $F_e$ is the magnitude of an equivalent normal force vector, $X_e$ is the x position at which the equivalent force vector acts, and the limits of integration A and B correspond to the x positions of the boundaries of the respective zones.

Figure 8:
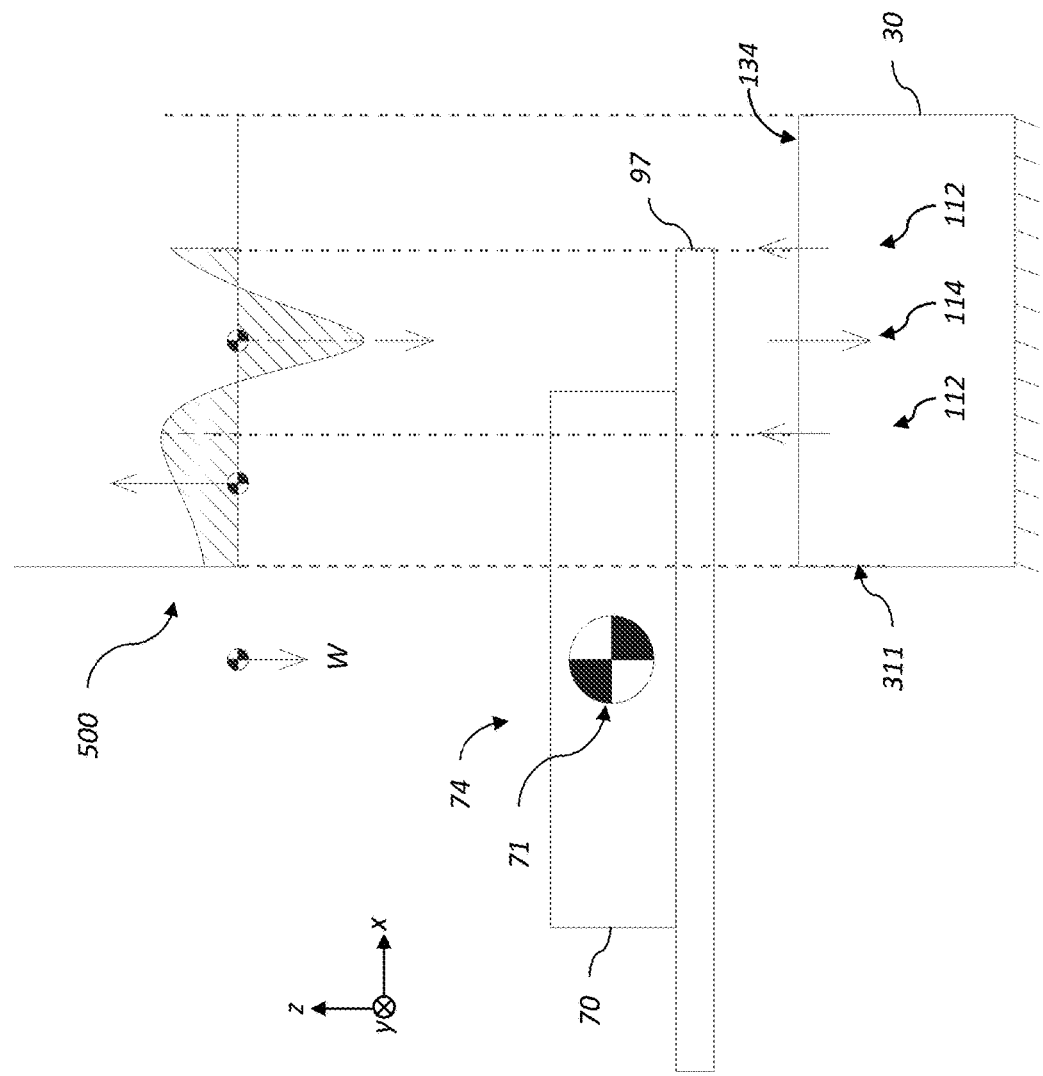
FIG. 8 illustrates a pressure profile between a substrate unit and a vacuum-preloaded gas bearing deposition head when the center of gravity of the substrate unit is moved beyond the edge of the deposition head.

For the example of a symmetric head having two output slots 112 and one exhaust slot 114, the characteristic continuous pressure distribution and equivalent force vectors when the mass centroid offset is outside of the deposition head boundary are shown in the pressure distribution plot 500 of FIG. 8. (The position of the substrate unit 74 relative to the deposition head 30 is the same as that illustrated in FIG. 7C.) For ease of understanding, there are dashed-vertical lines extending from the edges of the deposition head 30 to the corresponding pressure-distribution plot. The weight of the substrate unit 74 is shown by the vector acting through the center of gravity 71 of the substrate unit 74. Alternatively, FIG. 9 illustrates the piecewise uniform distributed loads for the same arrangement of substrate unit 74 and deposition head 30.

Figure 9:
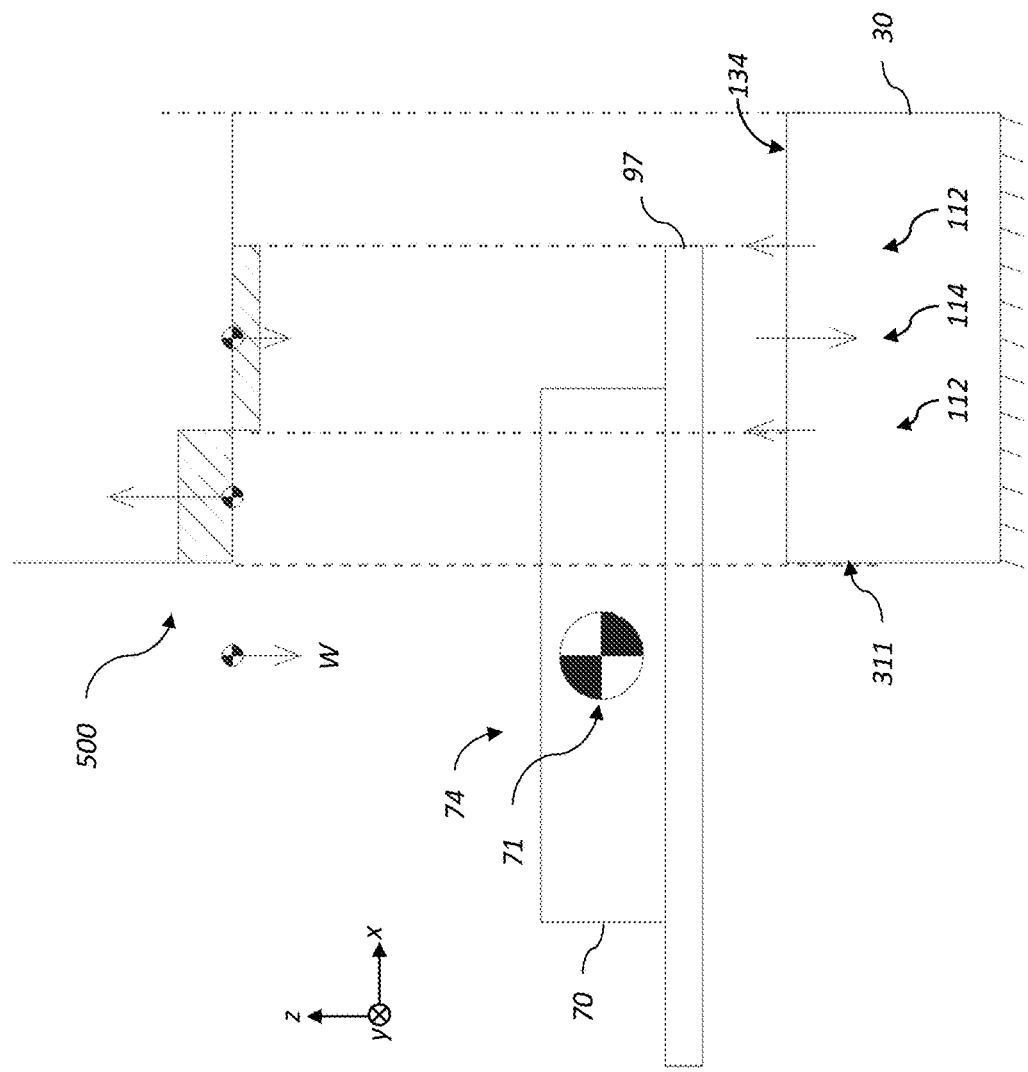
FIG. 9 is a simplified pressure profile corresponding to the example of FIG. 8.

Referring to FIG. 9, the vertical forces include the downward force of the weight of the substrate unit 74, the upward lift from the inert zone (outboard of the last output channel), and the net force from the preloaded central-active zone. The forces in the inert zone and active zone are variable depending on the position of the substrate unit 74. At positions where the center of gravity 71 of the substrate unit 74 is outboard of the inert zone center, the force component in the active zone is downward. The preloaded active zone is capable of a finite maximum downward force based on the exhaust port area, the vacuum level, and to a degree the friction factor of the source slots. In the limit, the downward force can be only as high as 1 atmosphere times the area of the deposition zone.

In some embodiments, the vacuum level is set by controlling a restriction (or orifice) to a vacuum source, and as such is not dynamically controlled. In these embodiments, the attractive force is set when the center of gravity 71 of the substrate unit 74 is centered over the deposition head 30 and is adjusted to an optimal value for a static equilibrium preload. In other embodiments, the vacuum level may be dynamically controlled such that the attractive force is increased as the center of gravity 71 of the substrate unit 74 is extended beyond the edge 311 of the deposition head 30.

Figure 10:
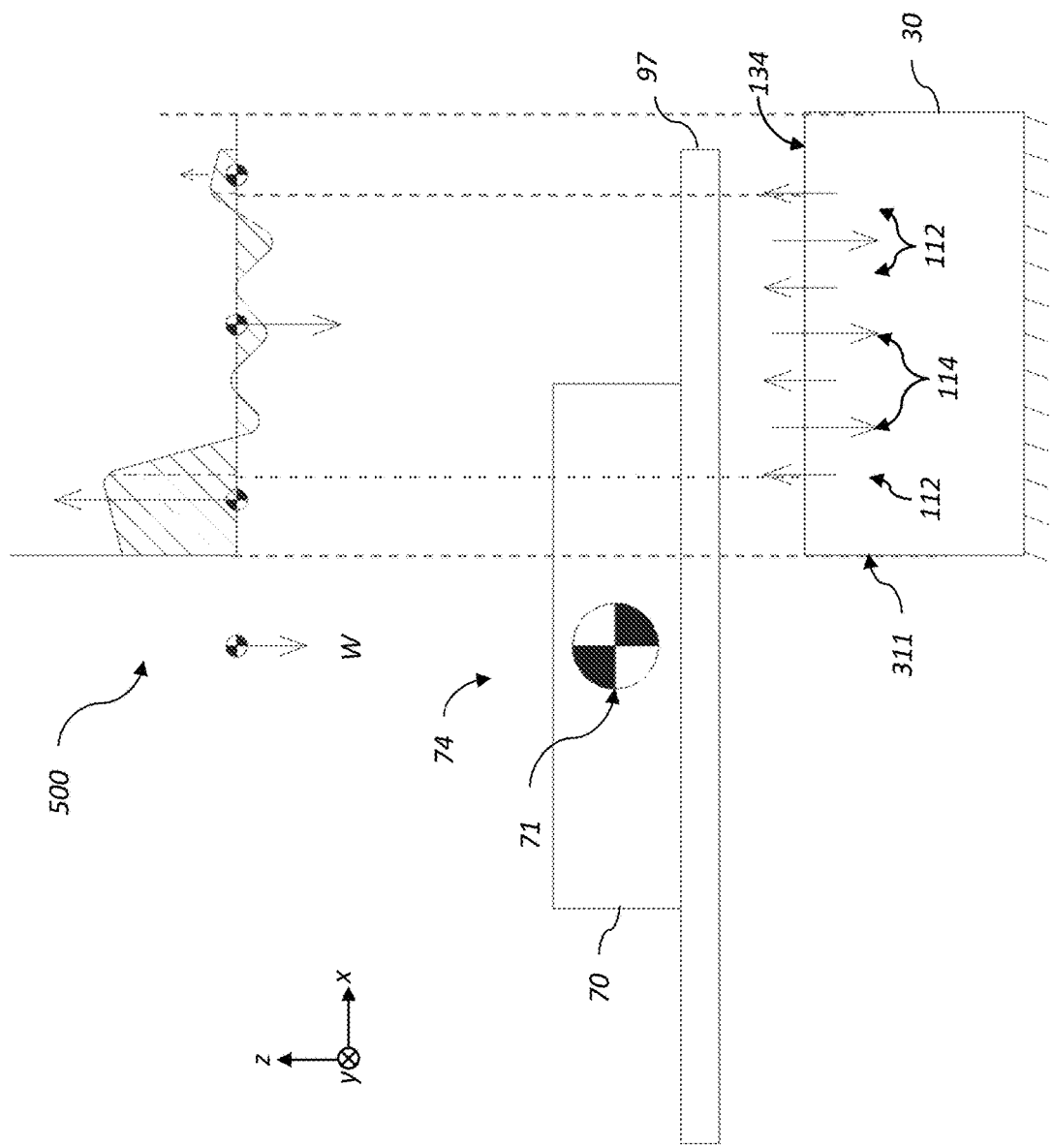
FIG. 10 illustrates a pressure profile between a substrate unit and a vacuum-preloaded gas bearing deposition head having alternating output and exhaust zones when the center of gravity of the substrate unit is moved beyond the edge of the deposition head.

The actual pressure distribution is determined by the design of the deposition head 30, and as such may be arbitrarily complex; an example deposition head with 4 output channels and 3 exhaust channels is illustrated in FIG. 10 along with the corresponding pressure distribution plot. It is advantageous that the pressure in the outermost output slots 112, which is the source for the inert zone, be independently determined relative to the source pressures in the deposition zone.

The maximum allowable displacement of the substrate 97 relative to a vacuum-preloaded gas-bearing deposition head 30 is not obvious; prior art disclosures suggest that the limit is reached when the trail edge of the substrate uncovers an exhaust (vacuum) slot and thus compromises the vacuum at other commonly ported slots. The present invention operates at conditions where the center of gravity of the substrate unit 74 is beyond the edge of the deposition head 30, allowing for greater coating area than prior art systems. When the center of gravity of the substrate unit 74 is beyond the edge of the deposition head 30, the sum of forces and moments about the edge of the deposition head 30 for equilibrium is given by:

$$0 = \overline{P}_{inert} \cdot L_{inert} + \overline{P}_{deposition} \cdot L_{deposition} - \frac{W}{w} \quad (4a)$$

$$0 = \overline{P}_{inert} \cdot L_{inert} \cdot \frac{L_{inert}}{2} + \overline{P}_{deposition} \cdot L_{deposition} \cdot \frac{L_{Head}}{2} - \frac{W}{w} \cdot X_0 \quad (4b)$$

where $L_{head}$, $L_{inert}$ and $L_{deposition}$ are the lengths of the deposition head, the inert zone and the deposition zone, respectively, and $\overline{P}_{inert}$ and $\overline{P}_{deposition}$ are the average pressures in the inert and deposition zones, respectively.

In order to maintain an equilibrium condition such that the substrate unit 74 remains in a vacuum-preloaded condition with the deposition head 30, the sum of the moments must equal zero. If the center of gravity 71 of the substrate unit 74 is extended beyond the distance from the edge 311 of the deposition head 30 where the sum of the moments is zero, then an equilibrium can't be achieved and the substrate unit 74 will detach and tip away from the deposition head. It should be understood from examination of Eqs. (4a)-(4b) that minimizing the weight of the substrate unit 74 and maximizing the vacuum preload (vacuum at the exhaust channels), advantageously provides an increased range of motion of the substrate unit 74, and therefor coating area. Embodiments of the present invention enable the coating of the maximum possible area on a piece-part substrate. In a preferred operating mode, the motion profile is configured such that the extent of substrate motion moves the center of gravity 71 of the substrate unit 74 beyond the edge of the deposition head 30 during a portion of the substrate motion cycle. In embodiments of the present invention, the extent of motion is less than the tipping point, where the substrate 97 would become detached from the deposition head 30. Preferred motion profiles limit the range of substrate motion so that the substrate edge is prevented from entering the deposition zone, ensuring that the deposition zone is bounded by the substrate at all positions in the motion profile. In preferred embodiments of the present invention, the motion profile is optimized for the substrate unit 74, such that these limiting distances are designed to be the same so that neither is limiting before the other.

FIGS. 11A-11C and FIGS. 12A-12C illustrate embodiments which include additional outboard support elements 95 together with the vacuum-preloaded deposition head 30 in order to increase the in-track length of the substrate 97 that can be coated without the substrate 97 tipping. The outboard support elements 95 are arranged such that they engage with the substrate 97 and provide a support force before it reaches a position that would otherwise result in tipping, or detachment from the vacuum-preloaded deposition head 30. These additional outboard support elements 95 are preferably placed on either side of the deposition head 30, in order to maximize possible substrate travel, so that its area may be best utilized without tipping. The outboard support elements 95 can be mechanical elements such as shelves or rollers, as illustrated in FIGS. 11A-11C, placed to engage the substrate 97 before tipping. In alternative embodiments, the outboard support elements 95 can be independent gas bearings as illustrated in FIGS. 12A-12C.

The outboard support elements 95 keep the substrate 97 from tipping without interfering with the operation of the deposition head 30.

It is also possible to counteract the tipping tendency by applying counter moments to the substrate as a function of the substrate position via elements connected to the backer device 70. Various mechanisms known in the art can be used to apply the counter moments including torsion springs, cantilever springs, coil springs, leaf springs, magnetic actuators, electromagnetic actuators, gas bellows and pneumatic cylinders. In one embodiment illustrated in FIGS. 13A-13C, a first component or vertical cantilever spring 65 is attached to the top of the backer device 70. The vertical cantilever 65 engages a second component or stop pins 66 which are located at an offset distance, providing a counter moment to the backer as the cantilever spring 65 is deflected by further lateral motion of the substrate 97. Alternatively, a first component or rigid vertical element 75 can be connected to the backer device 70 as shown in FIGS. 14A-14C. The vertical element 75 engages with a second component or springs 76 which are located at an offset distance on either side of the deposition head 30, providing a counter moment to the backer device 70 as the spring 76 is compressed by the vertical element 75.

Figure 16A:
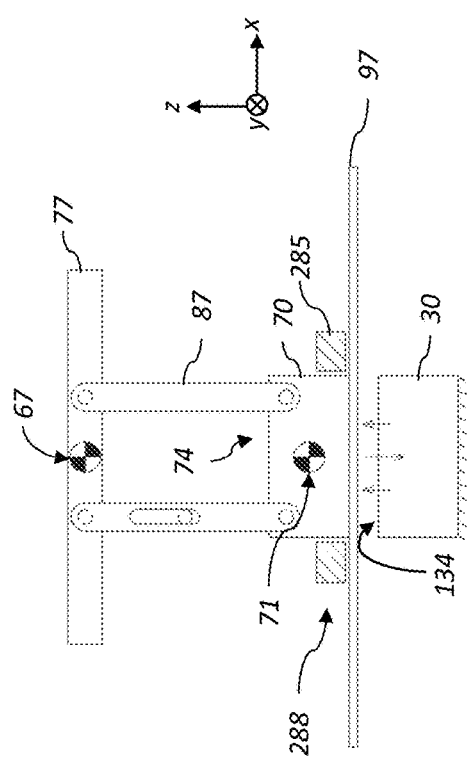
FIG. 16A-16B are cross-sectional views of an exemplary embodiment illustrating the range of motion of a substrate unit including a backer device relative to a vacuum-preloaded gas bearing deposition head, wherein a counter weight mechanism including linkages is used to extend the range of motion.
Figure 16B:
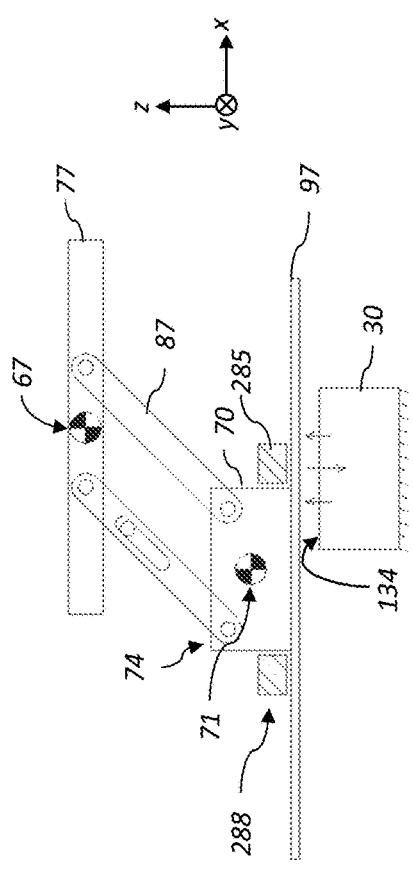

FIGS. 15A-15B, and FIGS. 16A-16B illustrate alternative embodiments in which the backer system includes one or more counter weights 77 (having a center of gravity 67) that move in a lateral direction opposite to the substrate 97 to produce counter moments and postpone tipping. The counter weights 77 can be moved by means such as connecting linkages and levers, or cables, or independent motion actuators. The embodiment of FIGS. 15A-15B uses connected cables having a length between the frame 285 of the substrate positioner and the counter weight 77. FIG. 15B illustrates the position of the substrate 97 and counter weight 77 after movement from a starting position of FIG. 15A. The embodiment of FIGS. 16A-16B uses linkages 87 between the backer 70 and the counter weight 77. FIG. 16B illustrates the position of the substrate 97 and counter weight 77 after movement from a starting position of FIG. 16A.

In alternative embodiments, the deposition head 30 is oriented such that the output face 134 of the deposition head 30 is in a vertical plane (with respect to gravity) and with the primary motion axis also in the vertical direction. For convenience, this orientation will be referred to as the vertical orientation. With the deposition head 30 in a vertical orientation, there are no longer concerns with tipping due to the force of gravity acting on an overhung substrate 97. As in the previously described horizontal orientation, the vacuum preload from the vacuum-preloaded gas bearing deposition head 30 provides pitch and roll stability to the substrate unit 74, and defines and maintains the z position of the substrate unit 74 at the equilibrium fly height (head-to-substrate gap).

In alternative embodiments, the sALD system of the present invention can utilize an additional compensating weight on the back of the substrate 97. In these alternative embodiments, the compensating weight will impart a downward force vector toward the output face 134. The force will preferably be within the area of the deposition head 30 defined by the outermost output slots 112, more preferably will be centered on the deposition head 30. The force imparted by the compensating weight enables the substrate 97 to be levitated given a sufficient positive pressure vector and to stay loaded to maintain a constant and small gap between the substrate and the deposition head 30. Furthermore, in some embodiments, the compensating weight can be constrained to remain over the deposition head 30, enabling the substrate 97 to be moved over the deposition head 30, and for the center of mass 71 to be moved beyond the edge of the deposition zone. (For example, see the dual gas-bearing system described in commonly-assigned, co-filed U.S. patent application Ser. No. 15/458,262 (now U.S. Pat. No. 10,422,038) to Spath, entitled "Dual gas bearing substrate positioning system," which is incorporated herein by reference.)

Figure 17C:
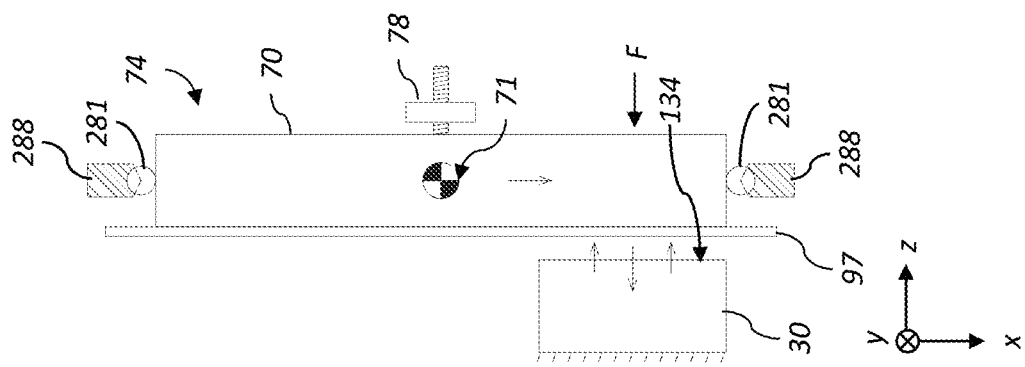
FIG. 17A-17C are cross-sectional views of an exemplary embodiment illustrating the range of motion of a substrate unit relative to a vertically-oriented vacuum-preloaded gas bearing deposition head.
Figure 17B:
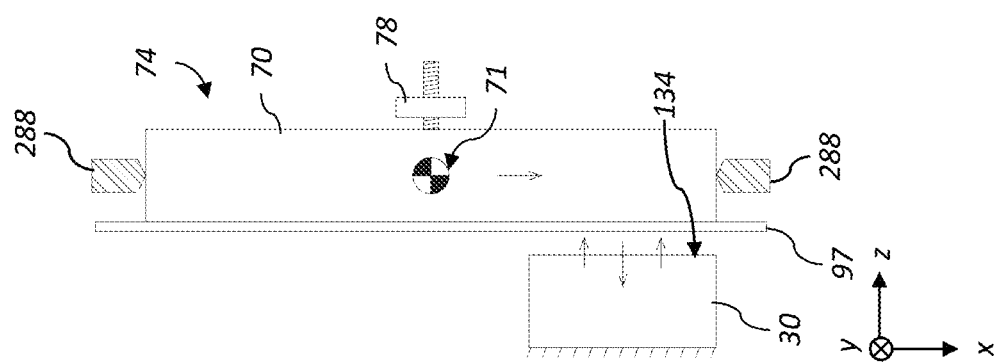
Figure 17A:
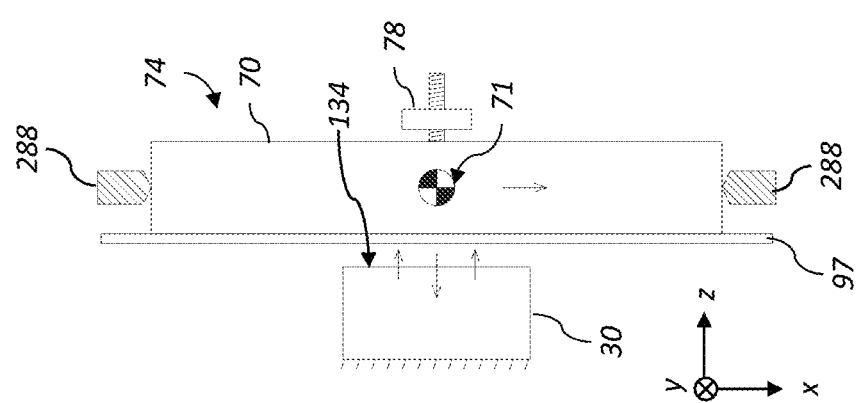

A vertically oriented SALD system for coating long substrates can be better understood with respect to FIGS. 17A-17C. (Note that the axes have been rotated so that the orientation relative to the output face 134 of the deposition head 30 is the same as it had been in the horizontal orientation.) As illustrated in FIG. 17A, the substrate unit 74 includes a substrate 97 and a rigidly attached backer device 70. The substrate positioner 288 engages with backer device 70 at contact location(s) along the line of action of the gravity vector from the center of gravity 71 of the substrate unit 74 (the combined substrate 97 and backer device 70). This is consistent with horizontally oriented systems, where it is preferred that the contact of the substrate positioner 288 and the center of gravity of the substrate unit 74 be in the plane of the center of gravity 71 to minimize acceleration effects on pitching moment. In the vertically oriented system, this contact location of the substrate positioner 288 prevents pitching moments due to gravitational acceleration as well as acceleration of the substrate positioner 288. In practice, substrates 97 to be coated using vertically-oriented SALD system can be composed of a wide range of materials with a range of density properties, and a range of sizes (width, length and thickness). To enable the vertically-oriented SALD system to compensate for variations in the substrate properties, an adjustable counter mass 78 is provided on the backer unit 70 which allows the position of the net center of gravity 71 to be maintained in line with the pivot axis, as illustrated in FIGS. 17A-17C. As illustrated, the counter mass 78 can be a simple threaded cylinder arranged on a stud; any other common means which provide an adjustable counter mass 78 are also within the scope of the present invention.

In this vertical configuration, as the substrate unit 74 is moved by the substrate positioner 288, the center of gravity 71 of the substrate unit 74 can be moved outside of the range of the deposition head without impacting the gap between the output face 134 and the process-side of the substrate 97 as illustrated in FIG. 17B. As seen, the center of gravity 71 of the substrate unit 74 is directly above the lower contact with the substrate positioner 288, and has been moved to be above the deposition head 30, outside of the area of the substrate 97 which is interacting with the deposition head 30. The substrate unit 74 is stabilized by the vacuum-preloaded deposition head 30. Furthermore, the vacuum preload from the deposition head 30 provides pitch and roll stability to the substrate unit 74, and also defines and maintains the z-position of the substrate unit 74.

To allow freedom for the substrate unit 74 to equilibrate in pitch, it is preferred that the contact between backer device 70 and substrate positioner 288 be confined to a line, which allows for unencumbered pitch rotation. This "line" may be defined by two discrete points, according to basic geometry. The two point (minimum) contact between the substrate positioner 288 and the substrate unit 74 desirably constrains the yaw orientation of the substrate unit 74.

In an alternative embodiment illustrated in FIG. 17C, the line contact is provided by a roller 281 incorporated into the substrate positioner 288. Alternatively, the roller 281 could be incorporated into the backer unit 70 of the substrate unit 74. In preferred embodiments where the line contact is provided by a roller 281, there is greater freedom for the substrate unit 74 to equilibrate in pitch and z. In more preferred embodiments, the line contact is defined by two independent roller segments that are collinear but free to rotate individually, advantageously allowing the substrate unit 74 to have the desirable freedom to seek equilibrium in roll, in addition to pitch and yaw.

Figure 18B:
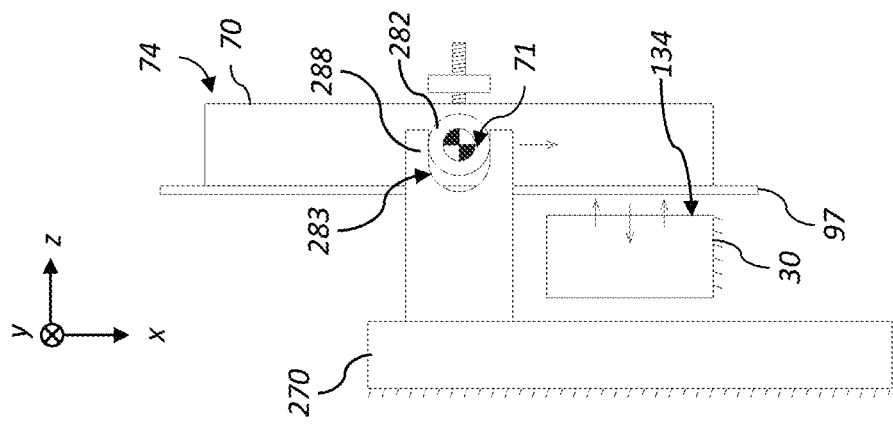
FIG. 18A-18B are cross-sectional views of an exemplary embodiment illustrating the range of motion of a substrate unit including a backer device relative to a vertically-oriented vacuum-preloaded gas bearing deposition head, wherein the substrate unit include roller bearings that fit within yoke features on the substrate positioner.
Figure 18A:
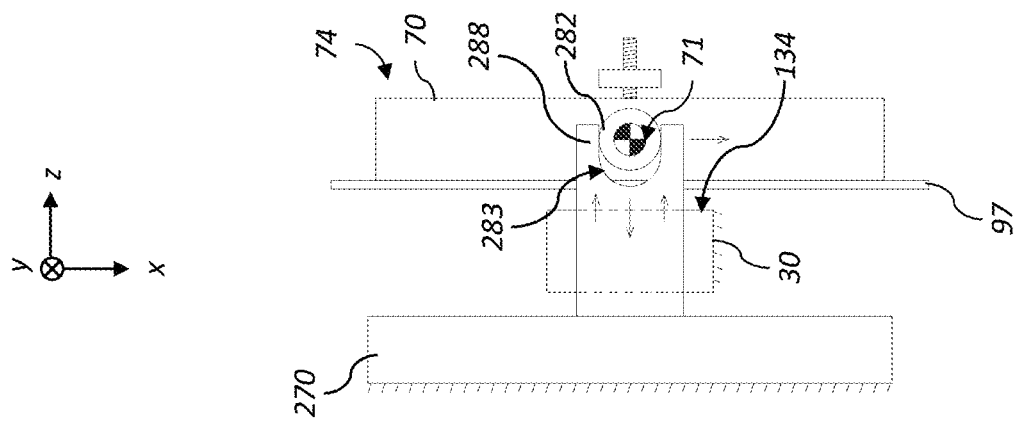

In an alternative embodiment illustrated in FIGS. 18A-18B, a single pair of roller bearings 282 are provided on the backer device 70 which engage with a substrate positioner 288 having mating yoke features 283. The roller bearings rotate around an axis extending in the cross-track (y) direction. The yoke features 283 are oriented to enable the roller bearings 282 to freely move in the direction normal to the output face 134 of the deposition head 30 (i.e., the y-direction). This configuration provides the desired constraints and degrees of freedom with a preferred engagement of the substrate positioner 288 with the relative motion means (primary motion actuator). As illustrated, the depth of the yoke feature 283 is sufficient to provide clearance to prevent bottoming of the rollers. In the embodiment illustrated in FIG. 18A, the roller axis is arranged to pass through the center of gravity 71 of the substrate unit 74 and provides neutral pitch stability. Alternatively, the roller axis can be arranged to pass above the center of gravity 71 of the substrate unit 74 and providing positive pitch stability. This configuration of the roller axis provides the advantage that the substrate unit 74 will not tip, even if vacuum preload provided by the deposition head 30 is interrupted. The open yoke features 283 on the substrate positioner 288 advantageously provide for easy removal and loading of substrates 97 over the output face of the deposition head 30.

In vertically oriented SALD systems, the substrate positioner 288 bears a load component due to the weight of the substrate unit 74. Therefore, it is desirable that the contact (interface) between the substrate unit 74 (load) and the substrate positioner 288 be as low friction as possible in the direction normal to the output face 134 of the deposition head 30 (i.e., the z-axis) so as to avoid interference with the vacuum-preloaded gas bearing functionality of the deposition head 30. Low friction bearing devices known to one skilled in precision mechanical design can be employed in accordance with the present invention to minimize this friction component. Exemplary embodiments include one or more ceramic hybrid ball bearings, such as of silicon nitride or similar balls, and high speed steel races. These are particularly low friction and tolerant of elevated temperatures, and will not artificially restrict the process temperatures of the SALD system (e.g., up to 350° C.). In addition to the rolling element bearings discussed above, conventional independent gas bearings acting on a face perpendicular to the output face of the deposition head can be employed in alternative embodiments. The stability of the substrate unit 74 is provided by the vacuum-preloaded deposition head 30, therefore, these additional bearings do not need to provide orientation stability other than yaw, which is readily accomplished by two "point source" bearings at a suitable distance apart.

Figure 19A:
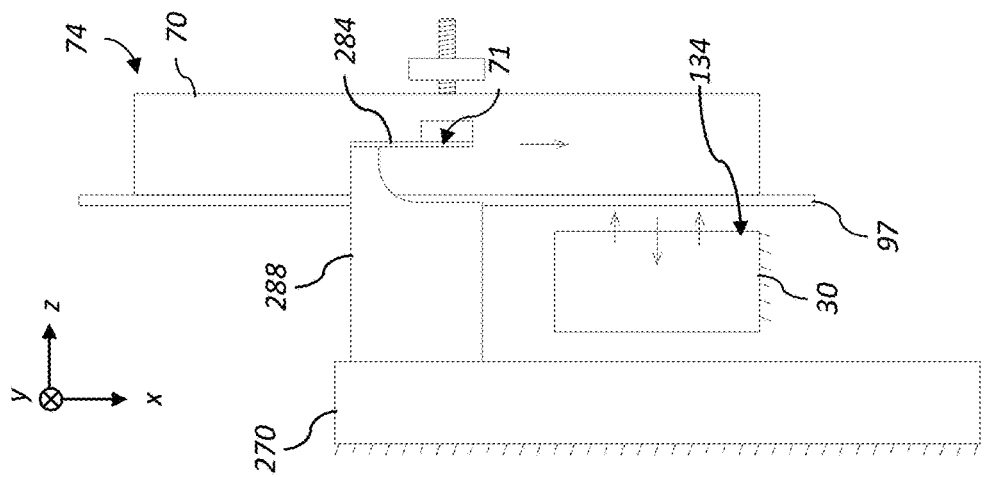
FIG. 19A-19B are cross-sectional views of an exemplary embodiment illustrating the range of motion of a substrate unit including a backer device relative to a vertically-oriented vacuum-preloaded gas bearing deposition head, wherein the substrate unit is connected to the substrate positioner using flexures.
Figure 19B:
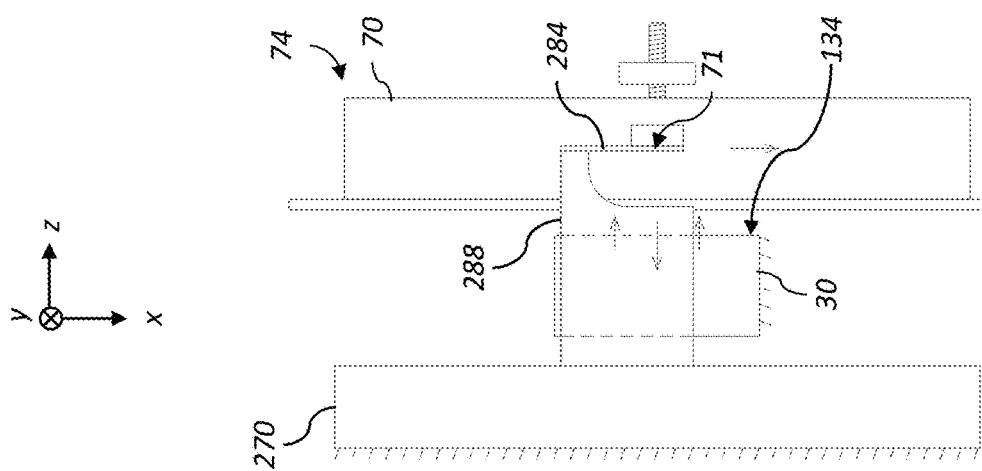

The functional requirement of the support element on the substrate positioner 288 is that it can constrain three degrees of freedom of motion of the substrate unit 74, including one rotation and two translations. In some embodiments of the present invention, such as the exemplary configuration shown in FIGS. 19A-19B and FIGS. 20A-20B, the support elements of the substrate positioner are flexures 284, which provide a zero friction means of support for the substrate unit 74 to the substrate positioner 288. The flexures 284 can comprise sheet or wire elements. The flexures can be provided by a single planar sheet or two parallel sheets joined by a common rigid member, as shown in FIGS. 19A-19B. In the illustrated configuration, the attachment of the "free end" of the flexures 284 to the substrate unit 74 is by means of bosses having surfaces aligned with the axis of the center of gravity 71 of the substrate unit 74. The plane of the flexures 284 is parallel to the output face 134 of the deposition head 30. The "fixed" end of the flexures 284 is attached to a bracket on the substrate positioner 288. The substrate positioner 288 is attached to the relative motion means 270 (i.e., the primary motion actuator).

Alternative embodiments providing equivalent constraints utilize three flexures 284, where two of the flexures 284 are located in the plane of the center of gravity 71 of the substrate unit 74 and oriented parallel to the output face 134 of the deposition head 30. These flexures 284 constrain motion in x and yaw. A third flexure 284 (not shown) is arranged in the direction parallel to the output face 134 of the deposition head 30 and perpendicular to the primary motion axis (i.e., the x-axis), intersecting the center of gravity 71 of the substrate unit 74 in a plane parallel to the first flexures 284, and is preferably in the same plane as the first two wire flexures. This flexure 284 constrains the payload from translation in y. The necessary degrees of freedom to allow equilibration of the substrate 97 to the output face 134 of the deposition head 30, including pitch, roll, and translation in z, are advantageously preserved in this alternative embodiment.

In some embodiments of the SALD system of the present invention, the backer device 70 provides heat to the substrate 97. In these embodiments, in addition to supporting the substrate 97 by either vacuum attachment or gas bearing floatation, the flexures 284 between the substrate unit 74 and the substrate positioner 288 can be advantageously utilized to deliver electrical energy or fluid flows. In one embodiment, two parallel sheet metal flexures 284 are utilized to provide electrical current to heater elements or thermoelectric Peltier modules incorporated in the backer device 70. Suitable conductive and insulating materials are used as necessary to define the current flow. In some embodiments electrically resistive properties of a porous membrane utilized in the backer device 70 can be used as a heating element.

In another embodiment, two of the wire flexures are used to source and sink electrical energy while the third element is tubular and is used to convey vacuum or air to the face of the backer device 70 that faces the substrate 97. The principle mechanical load is a result of acceleration in the primary motion direction, so the solid metallic wires are preferably oriented in that direction. The tubular element may be soft tubing, such as silicone, because the forces in the y direction are minor and y position is not critical. The straight path of the gas supply tube avoids disturbing forces caused by Bourdon tube effects (i.e., forces due to pressure applied to unequal areas on inside on outside of bends).

The electrical energy conveyed to the backer device 70 can be modulated as a means to communicate process conditions to or from the backer to the system controller by means known to one skilled in electronics. Properties and process conditions that can be communicated include temperature, pressure, acceleration, sample presence, and amount of thin-film growth. The backer device 70 can include sensors and signal conditioning electronics in such embodiments. In some embodiments, communication can be accomplished by means of RF or optical links. While, as described, the flexures 284 are clear implementations of the necessary functionality, they are not exhaustive of the possible arrangements that could provide similar functionality which are also included within the scope of the present invention.

In configurations such as that shown in FIGS. 7A-7C, the weight of the backer unit including the backer device 70 can provide a useful contribution to preload the substrate 97 and deposition head 30 when the output face 134 of the deposition head 30 is in a horizontal plane. This component of preload is particularly useful for enhancing safety in the event of loss of exhaust vacuum, and thus loss of vacuum preload in the deposition head 30. This weight component may also be a critical factor in a proven deposition head design and operating condition. When the output face 134 of the deposition head 30 is oriented in a vertical plane as in the configuration of FIGS. 19A-19B, the weight of the substrate unit 74 no longer contributes to preload. When desired, an equivalent preloading force can be introduced in the horizontal direction by means of additional hardware.

Figure 20B:
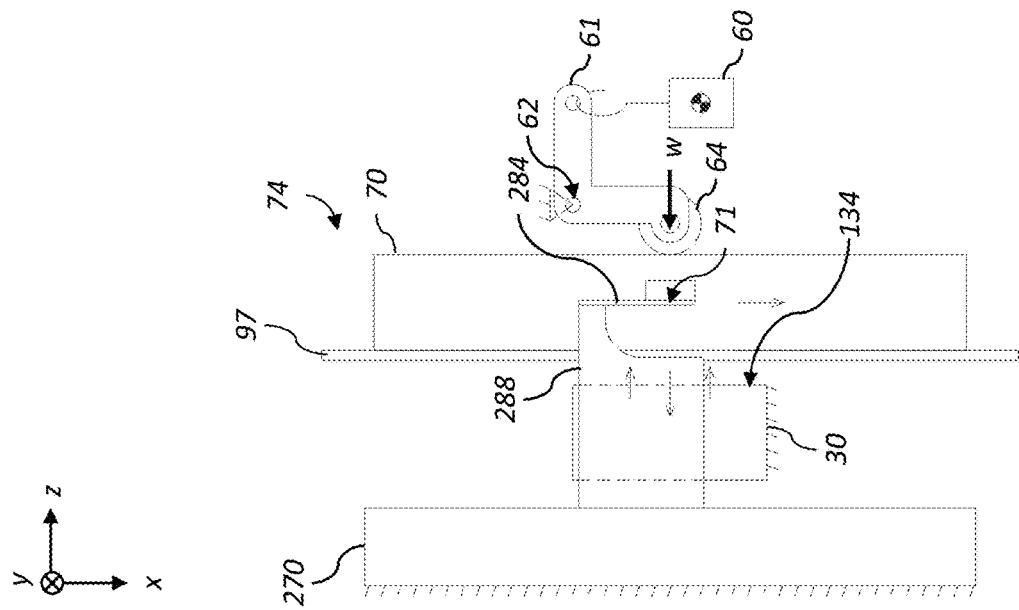
FIG. 20A-20B are cross-sectional views of exemplary embodiments similar to that of FIGS. 19A-19B wherein a force mechanism is used to apply a constant force onto the back surface of the substrate unit.
Figure 20A:
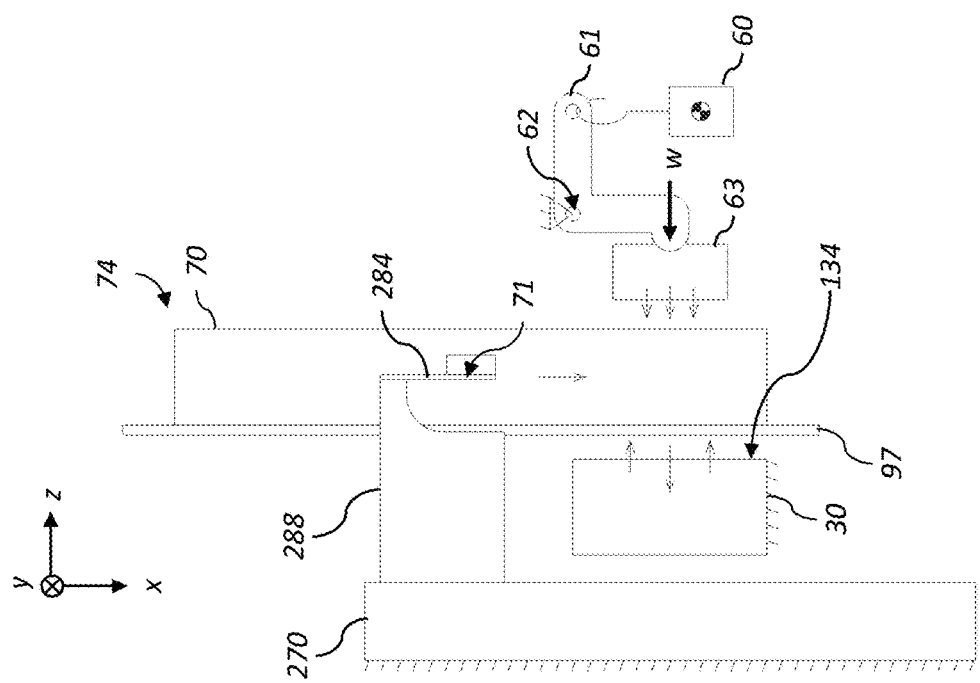

The apparatus illustrated in FIGS. 20A-20B illustrate exemplary means for providing a substantially constant horizontal force which is independent of substrate thickness variation, and without introducing any disturbing moments to the substrate unit 74. The weight of a mass 60 is redirected by a lever 61 which pivots around pivot point 62 and applied to a bearing which in turn conveys the force to the substrate unit 74. The pivot point 62 of lever 61 is fixed with respect to machine ground. The line of action of the force imparted to the substrate unit 74 passes through the center of the output face 134 of the deposition head 30. In FIG. 20A, the bearing is a conventional gas bearing 63, such a porous graphite air bearing, having an axi-symmetric design and a spherical mounting seat so that its alignment conforms to any imperfection in planarity or parallelism of the outside face of the substrate unit 74. As shown in FIG. 20B, the bearing that interfaces to the substrate unit 74 can also be a rolling element bearing 64, such as a ball bearing, whose axis is in a plane parallel to the output face 134 of the deposition head 30 and aligned in the transverse direction. The outer race of the rolling element bearing 64 may have a spherical contour such that point contact between the outer race and the outside face of the substrate unit does not constrain roll of the substrate unit 74 about the primary motion axis. The rolling element bearing may advantageously be constructed of high temperature compatible materials, such as ceramic balls and high speed steel races so that the substrate unit 74 may be operated at temperatures up to 350° C.

The use of a fixed weight and a lever provides an easy to understand illustration of a means to provide a constant horizontal force to the substrate unit 74 without introducing problematic forces or moments that would disturb the ability of the substrate unit 74 to be freely guided by the preloaded gas bearing interface of the deposition head 30. It is understood that other means of imparting a horizontal force component the substrate unit 74 can be employed, such as described in the context of other embodiments and configurations of the present invention and are within the scope of the invention (e.g., mechanisms employing magnetic attraction or repulsion, or pneumatic bellows). Linear bearings and/or flexures can be used to (re)direct the applied force in the desired direction normal to the output face 134 of the deposition head 30. Preferably, the force producing apparatus is advantageously designed to be easily disengaged to facilitate loading and unloading of the substrate 97.

Figure 21:
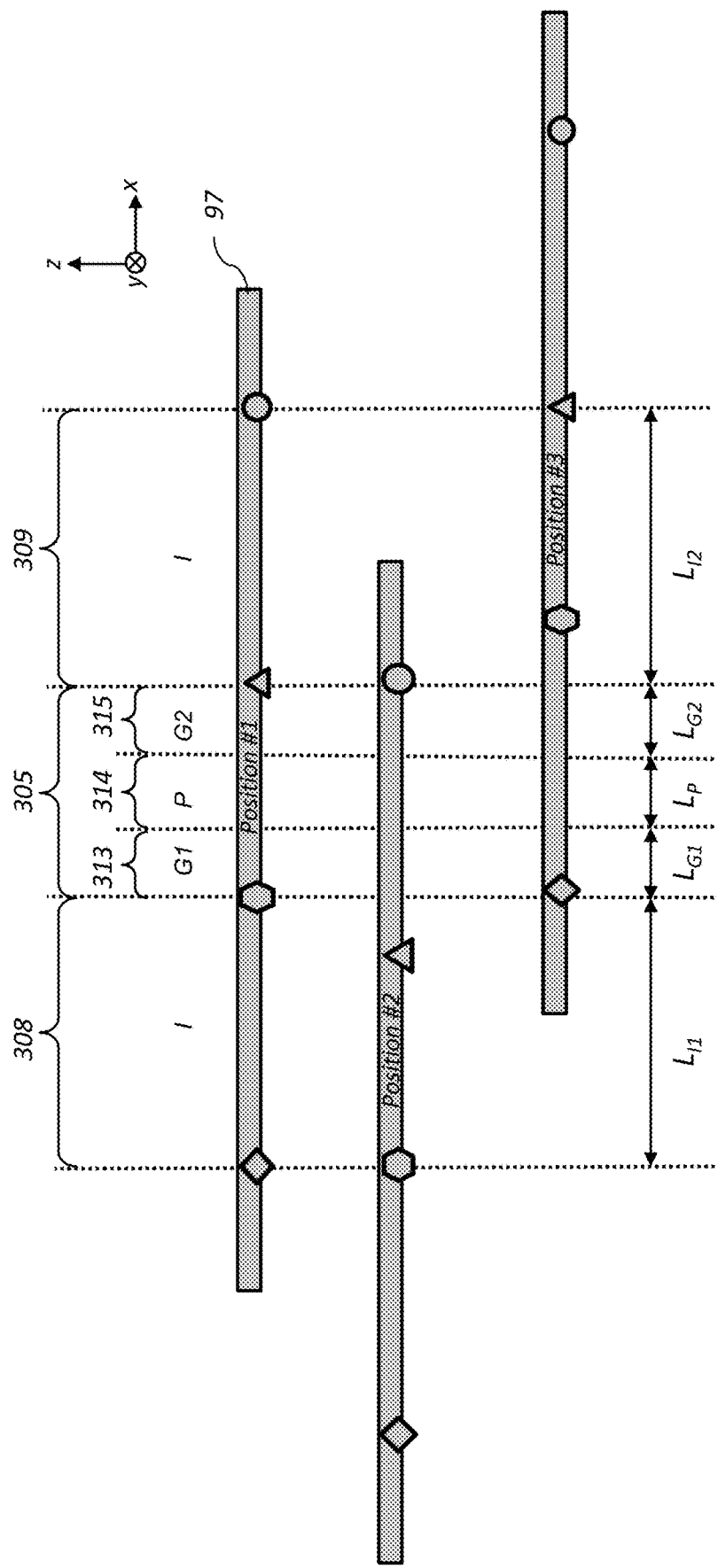
FIG. 21 illustrates various quantities affecting the maximum allowable substrate motion during ALD deposition with a one-cycle ALD deposition head.

As mentioned earlier, one of the advantages of the present invention is the ability to coat substrates 97 that are much longer than the length of the deposition head, including continuous substrates in a roll-to-roll mode. In preferred embodiments of the present invention the external environment 15 is not required to be strictly controlled, and as such the motion of the substrate 97 during deposition is controlled so as to protect the "active growth region" from entering the external environment 15. FIG. 21 illustrates the limits of substrate motion when subjected to the constraint of controlled environment, using the simple one-cycle ALD deposition head discussed with respect to FIGS. 2A-2C. For clarity, in FIG. 21 the deposition head 30 is not shown, and rather focuses on the gas zones formed between the substrate 97 and the deposition head 30 (which are common to all head embodiments and geometries). FIG. 21 illustrates the substrate 97 at three different positions in the motion profile. At Position #1, the substrate 97 is centered with respect to the deposition zone 305. Using Position #1 as a starting place, four positions have been marked on the substrate—a diamond corresponding to the outer edge of the first inert zone 308, a hexagon for the outer edge of the first reactive gas zone 313, a triangle for the outer edge of the last reactive gas zone (i.e., second reactive gas zone 315), and a circle for the outer edge of the second inert zone 309. The region of substrate 97 in the deposition zone 305 can be considered as an "active growth region". In order to keep the hexagonal point in a controlled environment once it has experienced an exposure to the first precursor (i.e., the first reactive gas) it must be controlled to remain within the first inert zone 308, as illustrated by Position #2 in FIG. 21. Similarly, to keep the triangle point in a controlled environment after it has experienced exposure to the last precursor (i.e., the second reactive gas) it must be controlled to remain within the second inert zone 309, as illustrated by Position #3 in FIG. 21. When the substrate is moved in a simple oscillating, or reciprocating, motion profile with equal forward and backward motion, the area of the substrate that can be coated while controlling the environment of the active coating area is limited by the size of the inert zones 308, 309. The motion profiles of the present invention, which provide the ability for longer coatings while preventing the active growth area of substrates 97 from experiencing the external environment during deposition, are constrained as a function of the lengths of the inert zones 308, 309. In FIG. 21, $L_{I1}$ is the length of the first inert zone 308, $L_{G1}$ is the length of the first reactive gas zone 313, $L_P$ is the length of the purge zone 314, $L_{G2}$ is the length of the second reactive gas zone 315, and $L_{I2}$ is the length of the second inert zone 309. Regardless of the number of gas zones within the deposition zone, there will be a first reactant zone 316 adjacent to the first inert zone 308 and a last reactant zone 317 adjacent to the second inert zone 309.

Figure 22:
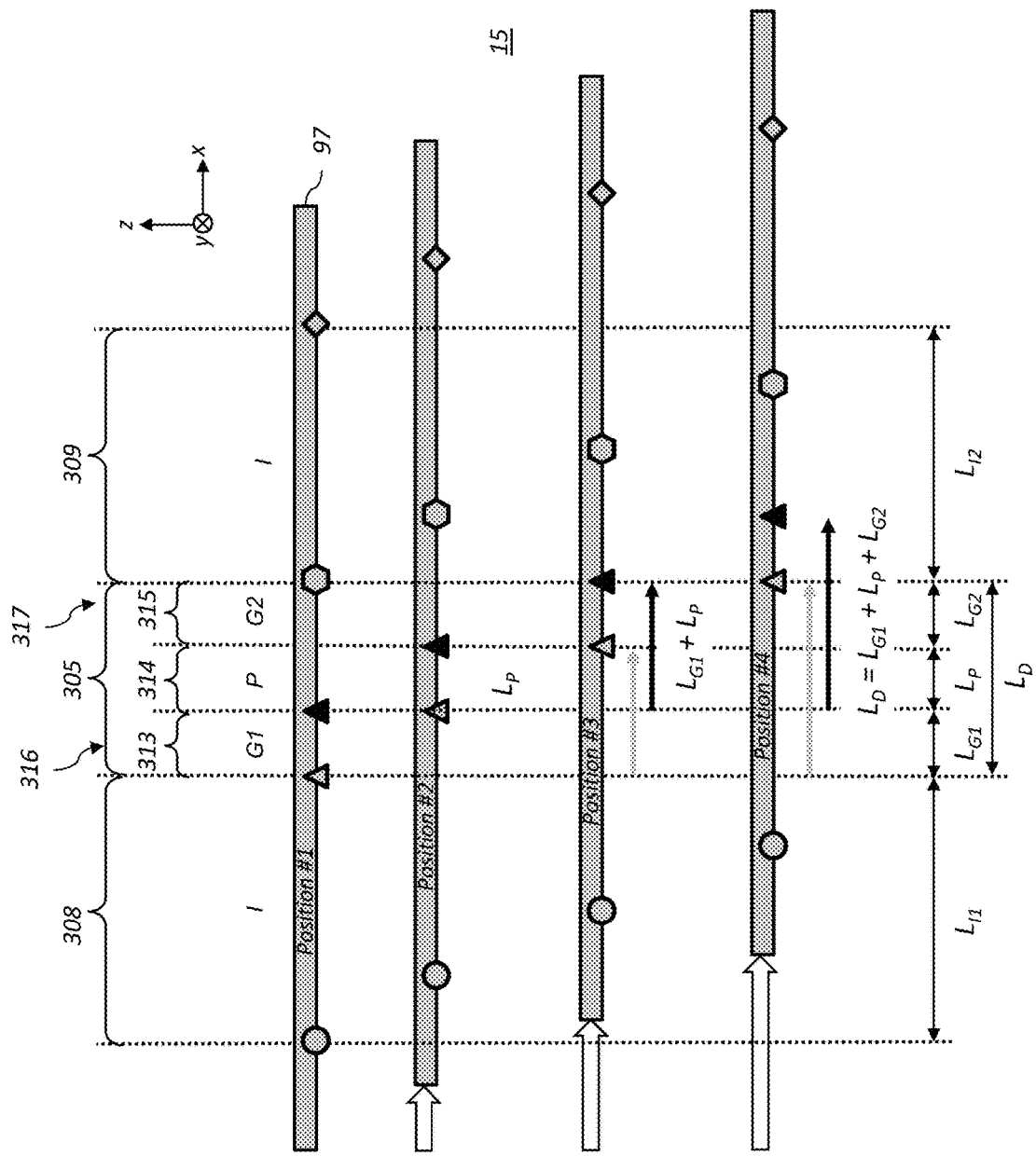
FIG. 22 illustrates various quantities affecting the minimum amount of substrate motion required for ALD deposition with a one-cycle ALD deposition head.

In order to "see" a full ALD cycle a point on the substrate 97 must be exposed to each of the reactive gases. By examination of FIG. 22, one can see that the distance required for a full cycle is slightly longer than the distance of the purge zone 314 such that the point will move from a portion of the first reactant zone 313 containing the first reactive precursor G1, through the purge zone 314 and into a portion of the second reactant zone 315, containing the second reactive precursor G2 thereby experiencing the sequential gas exposure of G1-P-G2. Similarly, in the reverse, or backward, direction a point on the substrate 97 will experience exposure to the gases in the deposition zone in the order of G2-P-G1. "Position #2" of FIG. 22 illustrates this minimum required movement where the substrate 97 has been moved a distance of $L_P$ to the right from the starting position (i.e., "Position #1"). The point on the substrate 97 indicated by a black triangle has moved from the edge of the first reactive gas zone 313 to the edge of the second reactive gas zone 315, and would therefore see the two necessary reactants. However, it can also be seen that the point on the substrate 97 indicated by the lighter triangle while having a full exposure to G1, will not experience the G2 precursor; and in a simple oscillatory motion, no growth would occur at this point. In motion profiles with continuous forward motion, there would similarly be no further growth at the solid dark triangle point.

"Position #3" of FIG. 22 illustrates the position of the substrate 97 after it has been moved a distance of $L_P+L_{G1}$ to the right from the starting position (i.e., "Position #1"). The points on the substrate 97 indicated by both the dark and light triangle markers have moved from exposure in the G1 region to a position in G2 region, and would see the two necessary reactants. This distance of $L_P+L_{G1}$ represents the minimum movement (in either direction) of sufficient interest for simple oscillatory motion, and for movement in a motion profile with continuous forward motion. As shown, the region of the substrate 97 between the two triangle markers will be exposed to both reactive gas zone 313, 315. However, it can also be seen that the lighter triangle while having a full exposure to G1, will experience a minor amount of the G2 precursor. Therefore, in some embodiments it is desirable that the minimum motion be greater than $L_P$ $L_{G1}$. "Position #4" illustrates a preferred minimum motion requirement of the present invention, showing substrate after it has been moved a distance of $L_{G1}+L_P+L_{G2}$ to the right from the starting position (i.e., "Position #1"), which is equal to the length of the deposition zone 305. In all cases, in order to maintain control of the growth region environment, the length of the inert zones 308, 309 ($L_{I1}$ and $L_{I2}$) must be greater than or equal to the longest length of movement in any motion profile.

Figure 23:
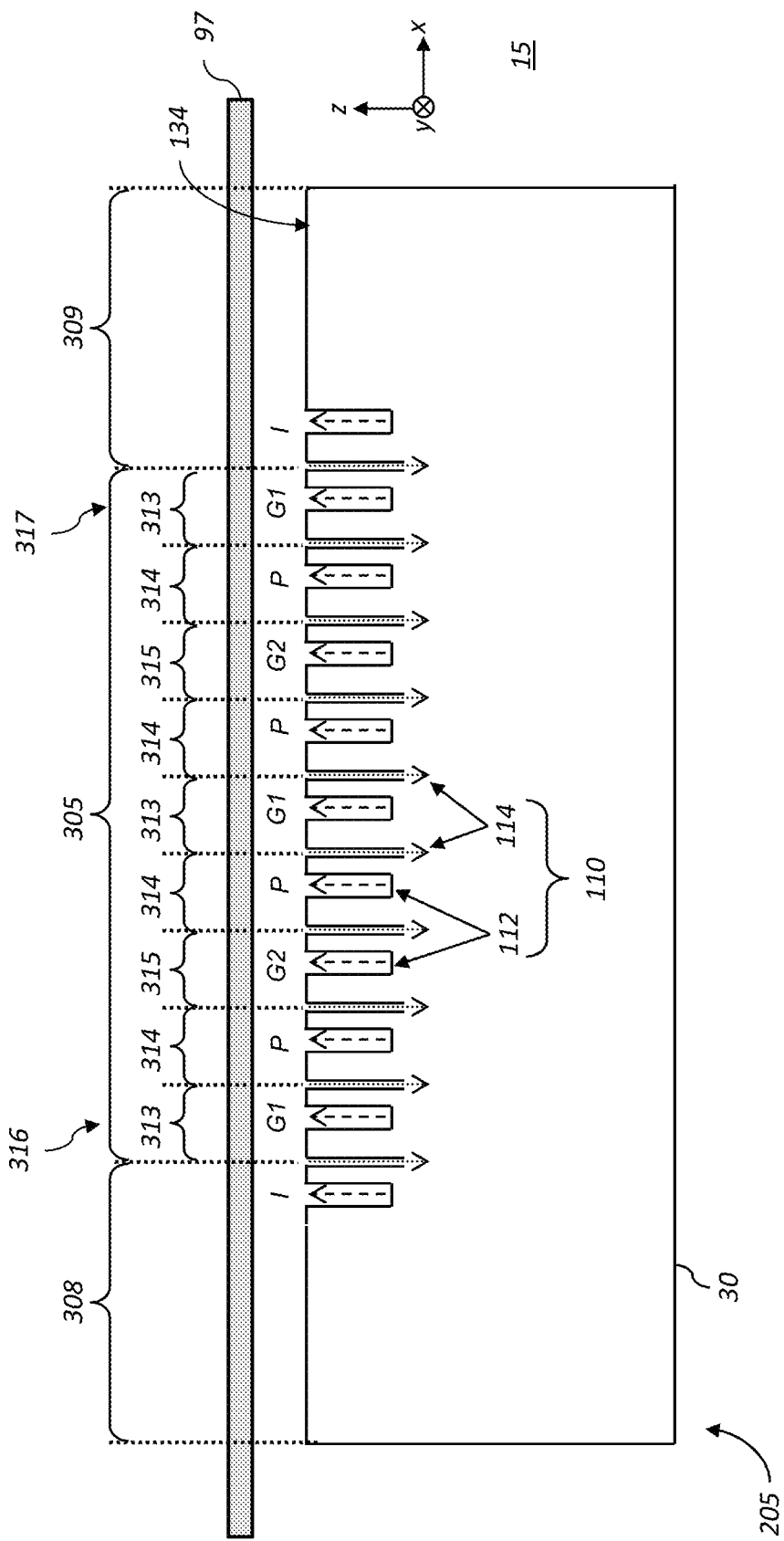
FIG. 23 illustrates an exemplary 2.5-cycle ALD deposition head.

In preferred embodiments, the motion profile of the present invention is used with deposition units having multiple ALD cycles; while increasing the number of cycles is useful, there is a relationship between the number of cycles in a deposition head 30 and the physical size of the deposition head 30, which will limit the minimum substrate size that can be coated and impact the cost of the system. The size and cycle count of the deposition head 30 can be optimized for a given application. The deposition head illustrated in FIG. 23 has a deposition zone 305 with symmetry containing 2.5 ALD cycles, and operates in a similar manner to the deposition heads of FIG. 2C and FIG. 3A and should be understood from the previous description. As illustrated, the first reactant zone 316 and the last reactant zone 317 of the deposition zone both contain the first reactive gas G1. As shown in FIG. 23, the gases are introduced and exhausted in alternating output and exhaust channels 112, 114 in the output face 134 of a vacuum-preloaded gas bearing deposition head 30. For the purposes of useful motion profiles for SALD deposition, the arrangement of the gas zones between the deposition head 30 and the process side of the substrate 97 is the relevant feature. However, vacuum-preloaded gas bearing designs are preferred deposition head 30 embodiments for reasons discussed earlier. The deposition head 30 illustrated in FIG. 23 illustrates a number of desirable aspects of exemplary embodiments of the present invention, firstly the two extended inert zones 308, 309 have the same length, the gas regions have symmetry, each of the purge zones 314 within the deposition zone 305 have equivalent lengths, and finally the first reactive gas zones 313 and the second reactive gas zones 315 each have the same length. In preferred embodiments, all of the various process gas zones (i.e., the first reactive gas zones 313, the purge zones 314, and the second reactive gas zones 315) within the deposition zone 305 each have the same length.

In FIG. 23, the inert zones 308 and 309 are shown with a single output slot 112 which supplies the inert gaseous materials. In other embodiments (not shown), the inert zones 308 and 309 can include a plurality of output slots 112 through which the inert gaseous materials are supplied, and optionally can also include additional exhaust slots 114. In some configurations, this approach can be used to extend the vacuum-preloading region.

Figure 24:
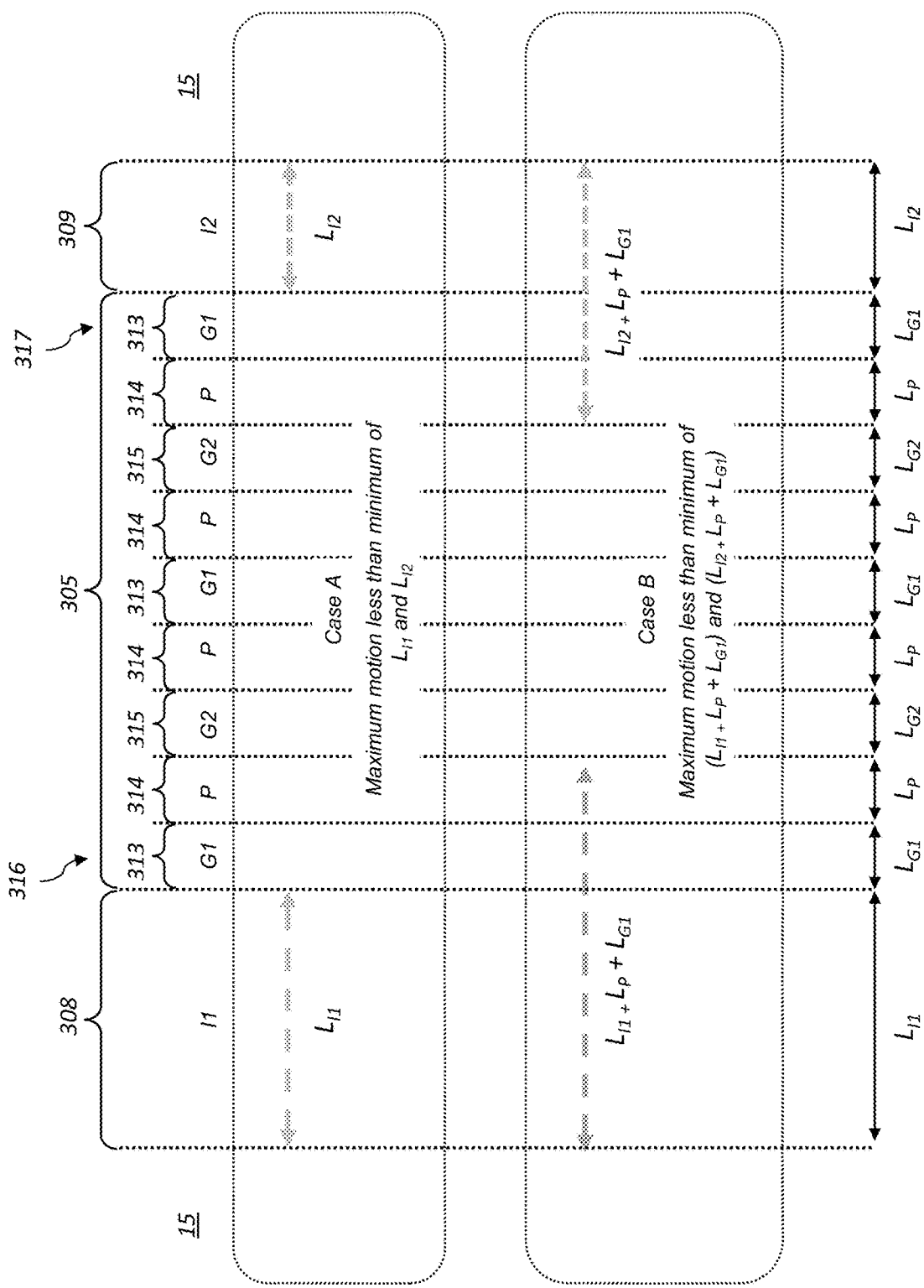
FIG. 24 illustrates various quantities affecting the maximum allowable substrate motion during ALD deposition for the deposition head of FIG. 22.

FIG. 24 illustrates an alternative embodiment with inert zones 308, 309 having different lengths (i.e., $L_{I1} \neq L_{I2}$). All other aspects are the same as the gas zones of FIG. 23. "Case A" illustrates the movement limitation on the motion profile when portions of the substrate 97 that have been exposed to the reactive gas in the first reactant zone 316 and the last reactant zone 317 (in this example, the first reactive gas G1) cannot be allowed to travel outside of the inert zones 308, 309 during the deposition process. In this case, as with FIG. 21, the maximum movement of the motion profile during deposition is the minimum length of the either inert zone: $Min(L_{I1}, L_{I2})$.

"Case B" illustrates the movement limitation on the motion profile when the reactive gas in the first reactant zone 316 and the last reactant zone 317 (in this example, the first reactive gas G1) does not react with the external environment 15 such that portions of the substrate 97 that have been exposed to G1 can be allowed to travel outside of the inert zones 308, 309 during the deposition process. For example, in instances where G1 is a water vapor, passage of a point on the substrate 97 that has been exposed to G1 into a relatively clean external environment will not cause any adverse surface reactions. That point will traverse the inert zone and be "re-exposed" to G1 prior to having a next exposure to G2. In this case, the first exposure to G2 sets the initiation point of the active deposition region such that the maximum movement of the motion profile during deposition is the minimum length from the edge of the deposition head to the outer edge of the second reactive gas zone 315: $Min(L_{I1}+L_{G1}+L_P, L_P+L_{G1}+L_{I2})$. In general, the maximum movement of the motion profile will be limited by the minimum distance between a reactant zone having a reactive gas that will react with the external environment 15 and the outer edge of the inert zone.

From the descriptive discussion of SALD above, it should be clear that the reactive gasses G1, G2 need to be isolated from each other (i.e., by the inert purge gas flows), and contained between the output face 134 of the deposition head 30 and the substrate 97 to prevent them from reacting with each other away from the substrate surface. The reactive gasses G1, G2 also generally need to isolated from the external environment to maintain purity and avoid unwanted reactions. Lastly, the surface of the substrate 97 that is reacting with the reactive gasses to build up a deposited layer should be isolated from the external environment 15 during deposition to avoid contamination, as discussed above. One of the advantages of the current invention is that it provides a motion profile that enables the coating of long substrates 97 using a small deposition head 30 and simultaneously prevents the growth region of the substrate 97 from being exposed to the external environment 15 until the completion of the desired coating thickness, or equivalently until the desired number of ALD cycles has been achieved.

The previous discussion of the motion profile has focused on a simple reciprocating, or oscillatory, motion profile, where the center of gravity 71 of the substrate unit 74 is moved back and forth an equal distance relative to the center of a deposition head 30. This motion profile limits the region of uniform coating that can be achieved with a small deposition head 30. There is a need for a motion profile that can provide a net forward motion in the in-track direction (i.e., the x-direction). Preferred embodiments of the present invention use a motion profile that enables a large coating area while preventing atmospheric (external environment 15) exposure during growth. An exemplary motion profile for use in the present invention uses a repeating "ooching" motion, wherein the forward in-track motion is incrementally larger than the reverse, or backward, in-track motion resulting in a net-forward motion of the substrate during each cycle of the motion profile. In order for the substrate 97 to have a net-forward motion a repeating motion profile of the present invention uses a forward motion portion "f" which is longer than a backward motion portion "b". The difference between the forward motion portion and the backward motion portion will herein be referred to as the "ooch distance" given by $\Delta x = f - b$.

Figure 25:
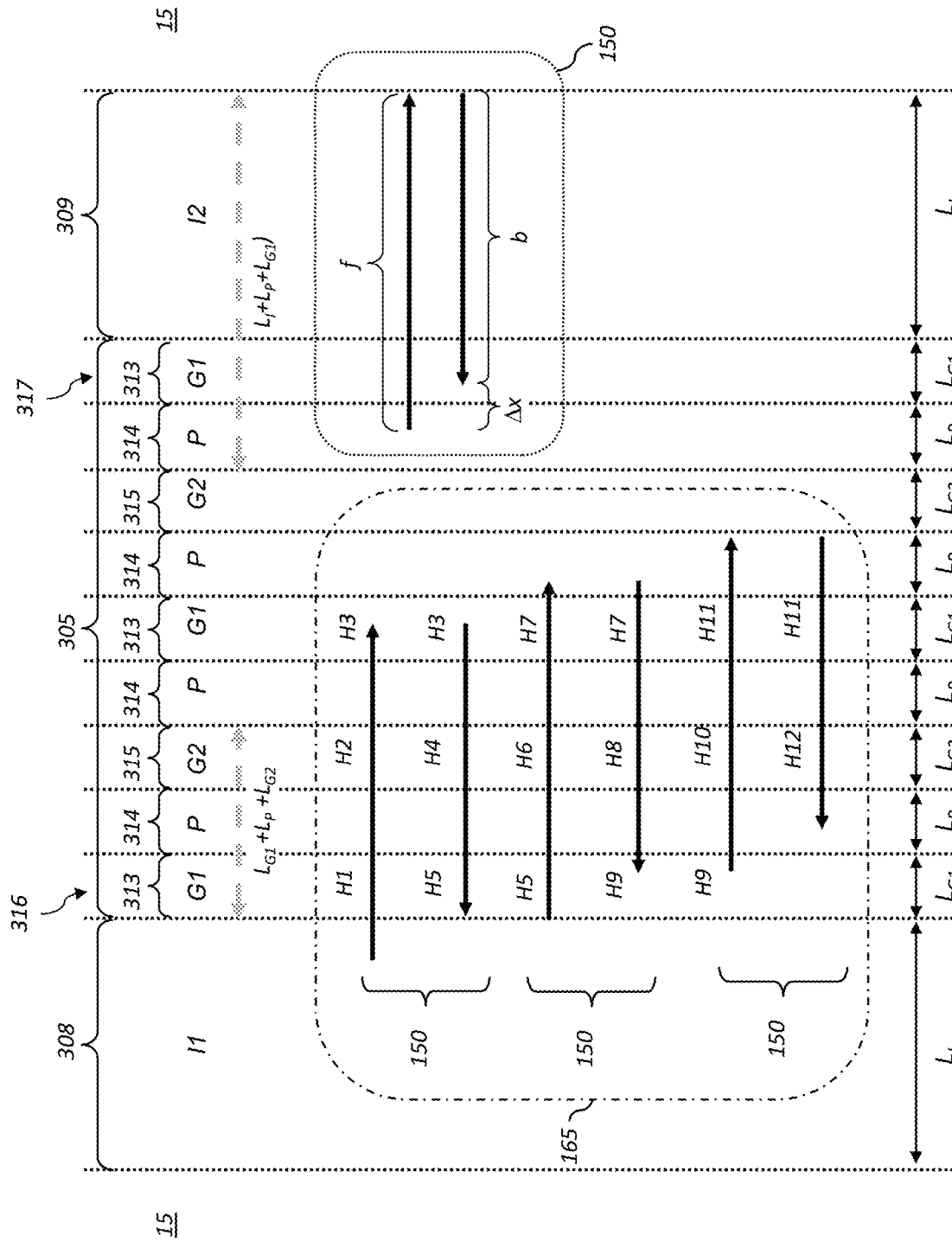
FIG. 25 illustrates the use of a repeating motion profile for performing ALD deposition using the deposition head of FIG. 22.

FIG. 25 illustrates aspects of an exemplary motion profile of the present invention that enable the dual benefits of long coating and protected coating region. The gas zones illustrated in FIG. 25 are those that would be generated from deposition head 30 of FIG. 23 having symmetry, including inert zones 308, 309 of equal length, and should be understood from the previous description. The repeating motion profile is provided by repeating a motion profile oscillation 150 that includes a forward motion portion f and a backward motion portion b, providing a net forward motion of $\Delta x$. In this example, the substrate surface after exposure to the first reactive gas G1 is not reactive with the external environment 15, and therefore the movement limitation is set to the broader limitation discussed earlier such that $f \leq L_I + L_{G1} + L_P$. To ensure that each point on the substrate 97 receives a full exposure of both reactive gases in both the forward and backward directions, the minimum backward motion should be greater than the sum of the lengths of a first reactive gas zone 313 and a purge zone 314 such that $b \geq L_P + L_{G1}$. In the motion profile oscillation 150 of FIG. 25, the backward motion is longer than the sum of the lengths of the first reactive gas zone 313, a purge zone 314 and a second reactive gas zone 315 such that $b \geq L_{G2} + L_P + L_{G1}$. Given the repeating nature of the motion profile, subsequent motion profile oscillations 150 are initiated at the end of the backward motion portion of the previous motion profile oscillation 150.

A repeating motion profile 165 including a sequence of three motion profile oscillations 150 is shown for illustration. A point on the substrate 97 that starts at the position of the tail of the forward motion vector in the first motion profile oscillation 150 will first pass through a first reactive gas zone 313 where it will be exposed to the first reactive gas G1 providing a $1^{st}$ "half reaction" H1. After passing through a purge zone 314, it will then pass through a second reactive gas zone 315 where it will be exposed to the second reactive gas G2 providing a $2^{nd}$ half reaction H2. Then, after passing through another purge zone 314, it will then enter another first reactive gas zone 315 where it will be exposed again to the first reactive gas G1 providing a $3^{rd}$ half reaction H3. The substrate 97 will then change directions and move backwards for the backward motion portion. The initial portion of the backward motion portion will still be a part of the $3^{rd}$ half reaction H3 since the point never leaves that gas zone. During the backward motion portion that point on the substrate 97 will then experience a $4^{th}$ half reaction H4 and a $5^{th}$ half reaction H5. At the end of the illustrated three repeat profile segments, it can be seen that the point on the substrate 97 will have undergone 12 half reactions (H1-H12). For a two reactive precursor ALD system two half reactions equals one ALD cycle, and therefore the substrate 97 will have experienced six ALD cycles.

Figure 26:
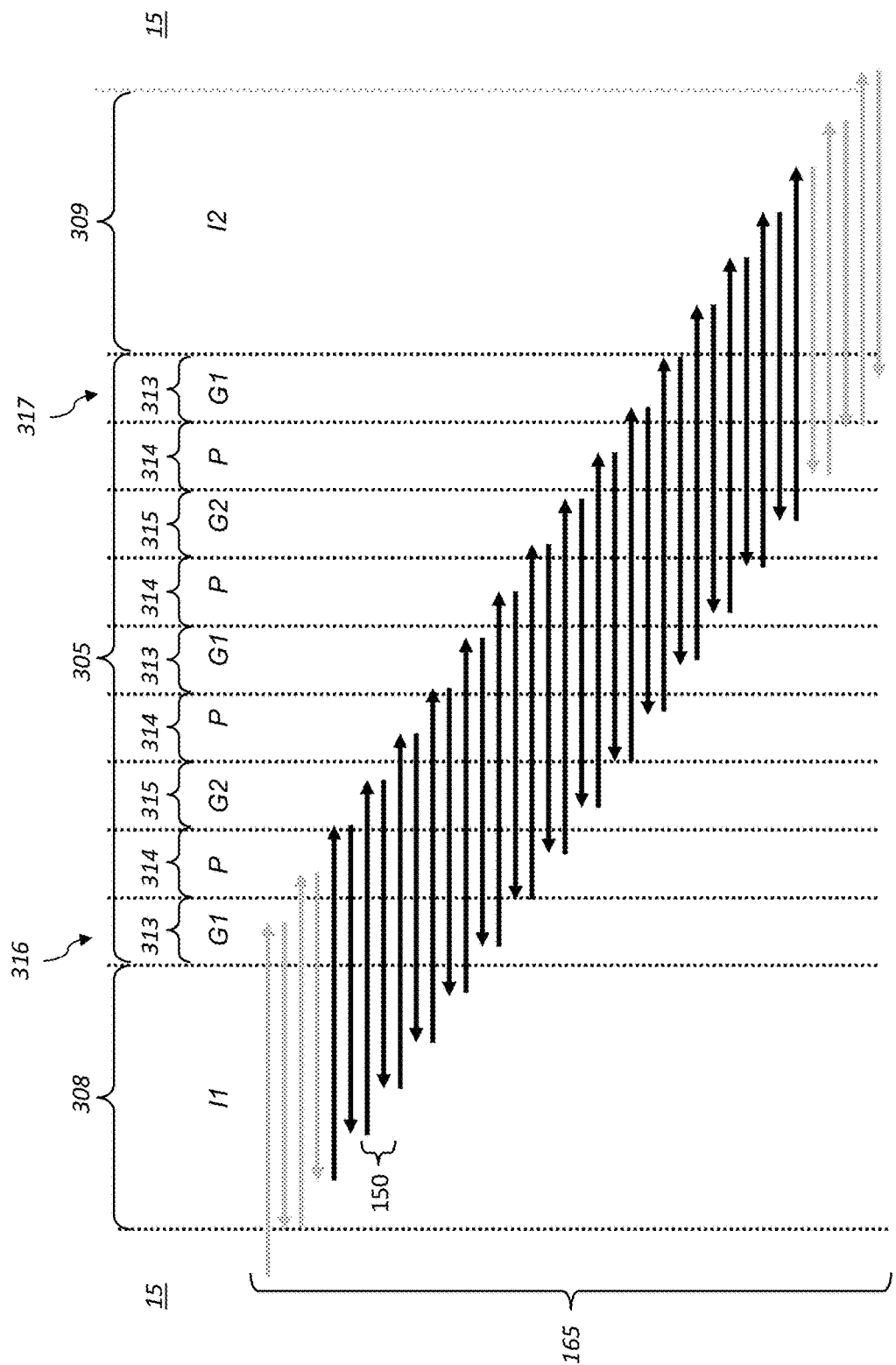
FIG. 26 illustrates exemplary repeating motion profiles useful for performing ALD deposition using the deposition head of FIG. 22.

FIG. 26 illustrates the movement of a single point on the substrate 97 moving using a repeating motion profile with the motion profile oscillation 150 of FIG. 25. As illustrated in FIG. 26, the "gray" arrows indicate movement prior to and after the time when active growth (i.e., deposition) is occurring, and the "black" arrows indicate movement during the time when active growth is occurring. As can be seen, during deposition the environment experienced by the active growth region is limited to that which is provided by the deposition head 30 using the inventive motion profile such that the active growth region is not exposed to the external environment 15. The total number of ALD cycles experienced by a point on the substrate 97 can be controlled by using an appropriate combination of the forward motion distance f and the ooch distance $\Delta x$ for a given head geometry. For an appreciable coating thickness, it is necessary that the substrate experience multiple ALD cycles. Typical ALD growth rates range from sub-angstrom to 3 angstroms per cycle, therefor multiple cycles are needed for even nanometer thicknesses of material. In order to manage the overall size of the deposition head 30, the ooch distance $\Delta x$ is typically quite small, and therefore the forward motion distance f and the backward motion distance b are nearly equivalent. In preferred embodiments $\Delta x$ is less than the length of any single process gas zone within the deposition zone 305 (i.e., the length $L_{G1}$ of the first reactive gas zones 313, the length $L_P$ of the purge zones 314, and the length $L_{G2}$ of the second reactive gas zones 315) as shown in FIGS. 25 and 26. Any repeating motion profile where f is greater than b, and b is greater than $L_P$, will have growth as the substrate travels in a net in-track direction and is within the scope of the present invention.

The motion profile of the current invention advantageously prevents an active growth region of the substrate 97 from being exposed to the external environment 15 prior to the completion of the desired deposition. In general, to prevent exposure to the external environment during the forward motion portion, the forward distance f of the repeating motion profile should be less than the sum of the lengths of the second inert zone 309, the last reactant zone 317 and the purge zone 314. Likewise, to prevent exposure to the external environment during the backward motion portion, the backward distance b of the repeating motion profile should be less than the sum of the lengths of the first inert zone 308, the first reactant zone 316 and the purge zone 314. In the more restrictive case where the gas in the last reactant zone 317 will react with the external environment, the forward distance f of the repeating motion profile should be less than the length of the second inert zone 309. Likewise, if the gas in the first reactant zone 316 will react with the external environment 15, the backward distance b of the repeating motion profile should be less than the length of the first inert zone 308.

Figure 27:
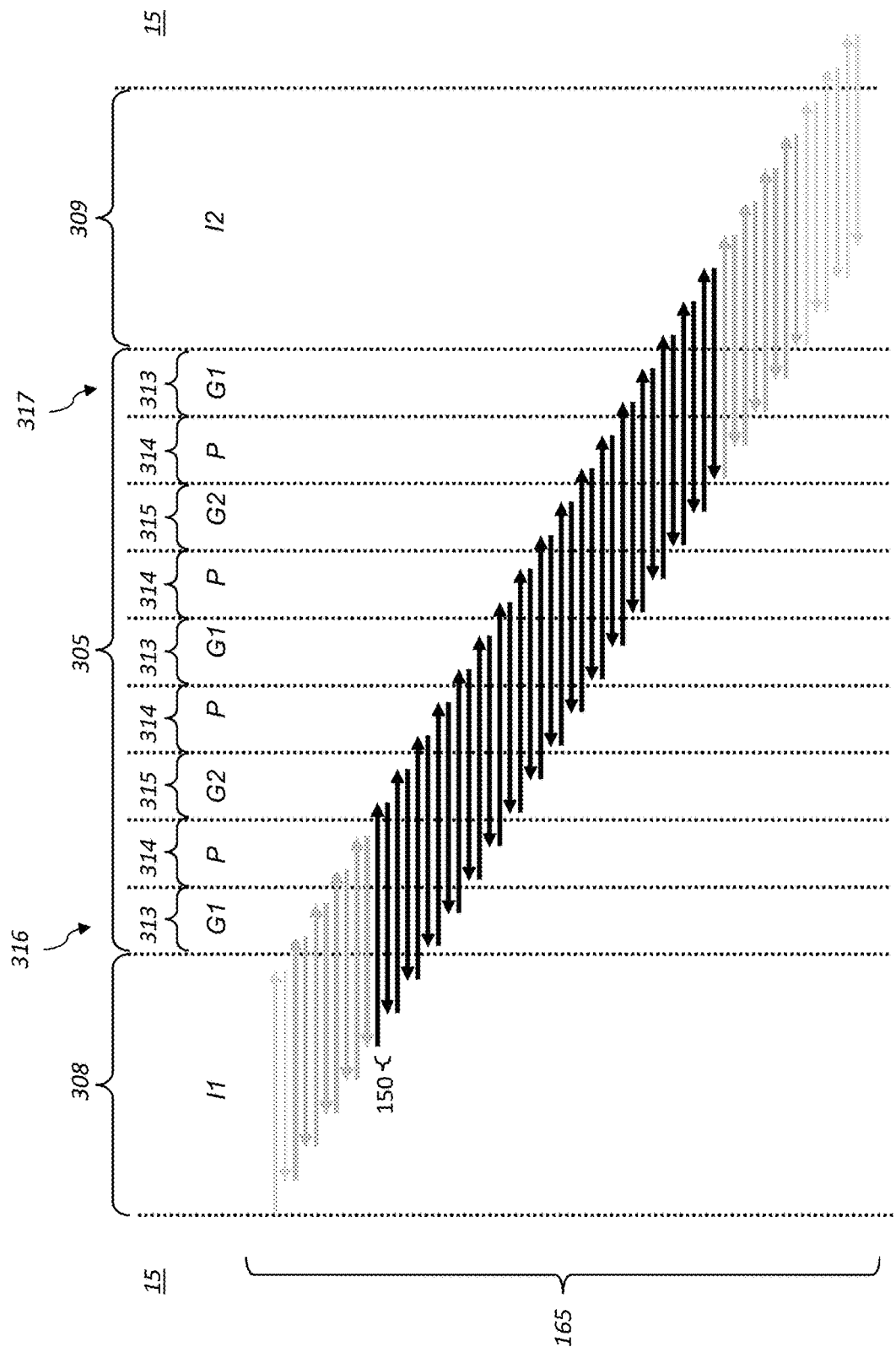
FIG. 27 illustrates exemplary repeating motion profiles useful for performing ALD deposition using the deposition head of FIG. 22.

FIG. 27 illustrates the movement of a single point on the substrate moving using a repeating motion profile with motion profile oscillations 150 which satisfies the more restrictive conditions appropriate for cases where the gases in the first reactant zone 316 and the last reactant zone will react with the external environment 15. In this figure, the light gray arrows indicate motion profile oscillations 150 where the point on the substrate 97 is not exposed to either of the reactive gases G1, G2; the dark gray arrows indicate motion profile oscillations 150 where the point on the substrate is exposed to only the first reactive gas G1, and the black arrows correspond to motion profile oscillations 150 where the point on the substrate is exposed to both of the reactive gases G1, G2 such that ALD growth is actively occurring. As can be seen, during deposition the environment experienced by the active growth region is limited to that which is provided by the deposition head 30 using the inventive motion profile.

As the substrate 97 moves into the deposition zone 305 it may experience multiple exposures to the first reactant zone 316, however without exposure to a second reactive gas zone 315 no ALD cycle growth will occur. Once the substrate 97 has progressed into the deposition zone 305 to a point where the growth region of interest has entered the left-most second reactive gas zone 315, signally the start of ALD cycle growth, the substrate motion is controlled such that the growth region is prevented from moving beyond the inert zones 308, 309 and into the external environment 15. After the point of the substrate has exited the right-most second reactive gas zone 315 for the final time, it is no longer necessary to make sure that it does not move beyond the second inert zone 309 and into the external environment 15 since ALD growth will no longer occur.

In accordance with preferred embodiments, the motion profile of the present invention provides a net-forward motion, with the forward motion portion being longer than the backward motion portion. Since the backward distance is the smaller, or limiting travel distance, the substrate must move backward by an amount sufficient to experience an ALD cycle. As described above, the backward motion distance of the motion profile of the present invention is therefore greater than the purge zone length ($L_P$), and more preferably is greater than the sum of the lengths of the purge zone 314, a first reactive gas zone 313 ($L_P+L_{G1}$) or the sum of the lengths of the purge zone 314, a second reactive gas zone 315 ($L_P+L_{G2}$), whichever is larger.

The repeating motion profile 165 of the present invention is used to coat substrates 97 whose length is greater than the length of a deposition unit 30, wherein the deposition unit 30 has extended end inert zones 308, 309 and a central deposition zone 305. As described, preferred embodiments provide the gas zones using a single deposition head 30. In alternative embodiments, multiple heads maybe be arranged in a deposition unit to provide the necessary gas zone, as described in commonly-assigned, U.S. patent application Ser. No. 15/458,297 (now U.S. Pat. No. 10,501,848), which is incorporated herein by reference, so long as they provide a controlled environment with the previously described gas zones between the surface of the deposition unit and the process side of the substrate 97 during active growth. The maximum size of substrate 97 that can be coated using the repeating motion profile 165 of the present invention is only limited by the substrate handling capability of the overall deposition system, and not by either the deposition unit or the profile. As such, the repeating motion profile of the present invention is advantaged for depositing on continuous web substrates using systems such as those described in commonly-assigned, U.S. patent application Ser. No. 15/458,270 (now U.S. Pat. No. 11,248,292), Which is incorporated herein by reference.

Due to the cyclic-nature of ALD, there will be "lead-in" and "trailing" sections of growth on the substrate 97 on either side of a region of uniform thickness. The lead-in and trailing sections are a result of the requirement that the deposition zone 305 be covered by a substrate during the flow of reactive gases, and as such the points on the substrate in the lead-in (or trailing) region will begin (or end) the motion profile at different points in the ALD cycle and therefore receive varying amounts of deposition. In preferred embodiments of the present invention, the length of the substrate is sufficient to achieve the desired uniform coating region.

Figure 28:
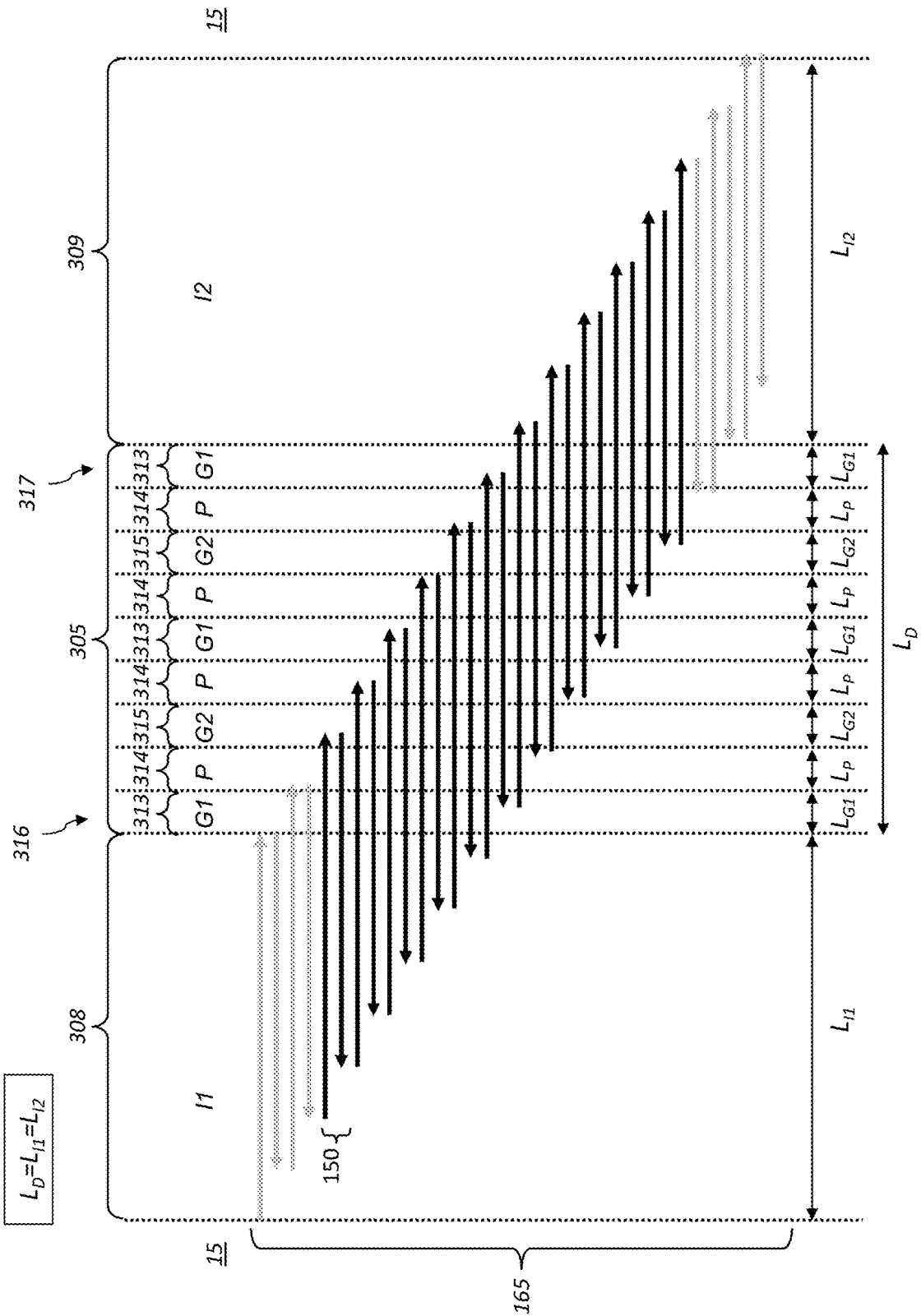
FIG. 28 illustrates an exemplary repeating motion profile useful for performing ALD deposition using a deposition head where the inert zones and the deposition zone have equal lengths.

Since increasing the number of ALD cycles (and thereby increasing the layer thickness) can be easily obtained by decreasing the ooch distance Δx of the repeating motion profile 165, SALD deposition heads with a fewer number of cycles and short deposition zones 305 are viable alternatives to those with long deposition zones 305 having many cycles, advantageously serving to minimize both the footprint of the deposition system (and the deposition head 30) and the substrate waste during operation. Deposition heads 30 that provide gas zones having symmetry are most preferred. Deposition heads 30 having inert gas zones 308, 309 that are substantially equal in length to the deposition zone 305 as illustrated in FIG. 28 have some advantages in the present invention. By increasing the length of the inert zones 308, 309, the maximum allowable forward distance f of the repeating motion profile 165 is increased allowing for exposure to more ALD cycles during a single forward motion. Since reversing direction inherently requires the motion controller to slow down, stop, reverse direction and accelerate, minimizing the number of turns will increase the overall deposition rate out of the deposition system. However, inert zones 308, 309 that are longer than the deposition zone 305 do not result in the active growth region being exposed to additional reactive gases with increasing forward distance f, and come at a penalty of increased deposition system size. In some exemplary embodiments, the lengths of the inert gas zones 308, 309 are greater than or equal to half the length of the deposition zone 305 and less than or equal to the length to the deposition zone 305 (i.e., $L_D/2 \leq (L_D, L_{I2}) \leq L_D$). In the case where high temperature deposition is required, longer inert gas zones 308, 309 can be used to insure that the substrate 97 comes to thermal equilibrium before it reaches the active deposition region.

Figure 29:
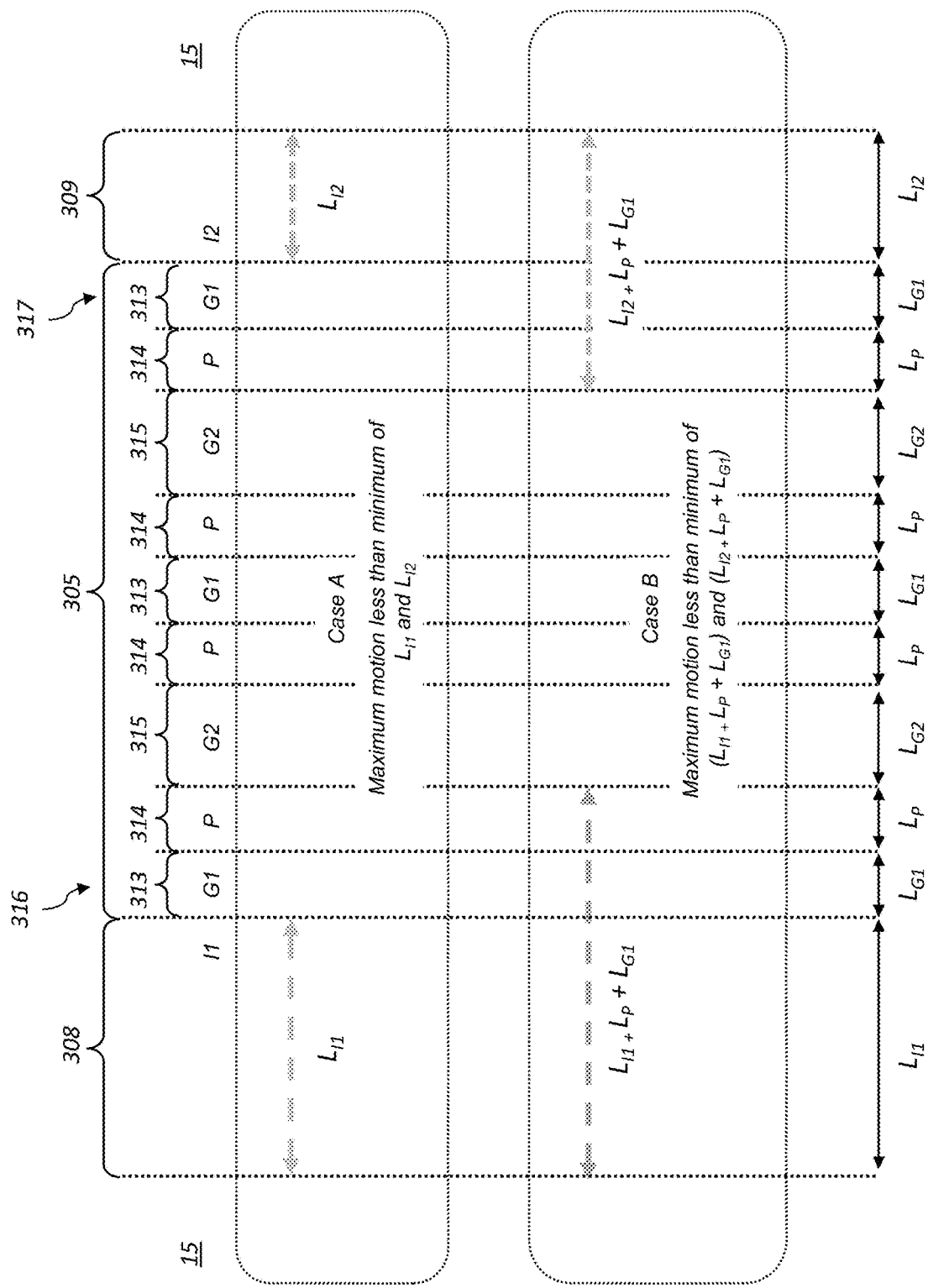
FIG. 29 illustrates various quantities affecting the maximum allowable substrate motion during ALD deposition with a 2.5-cycle ALD deposition head having reactive gas zones with unequal length.

The previous illustrations described embodiments wherein the various reactive gas zones 313, 315 and purge zones 314 had the same length. This is not a requirement of the current invention, and in some embodiments the lengths of the purge zones 314 and reactive gas zones 313, 315 can be different. For example, in some cases it may be desirable to have the length of the purge zones 314 be longer than the length of the reactive gas zones 313, 315. An exemplary configuration where the purge zones 314, the first reactive gas zones 313, and the second reactive gas zone 315 have different lengths is illustrated in FIG. 29. In this case, the motion limitations will be equivalent to those discussed earlier with respect to FIG. 24. Other configurations are possible, and are only limited by fabrication and practical constraints and are considered part of the present invention as long as they provide continuous forward motion using a repeating motion profile, while keeping the active growth region protected during the growth event. For example, deposition zones 305 including two ALD cycles such that the last reactant zone 317 is a second reactive gas zone 315. In this case, the motion limitations will be somewhat different for the case where only the second reactive gas G2 reacts with the external environment. In this case, the maximum motion will be limited by: $\text{Min}(L_{I1}+L_{G1}+L_P, L_{I2})$.

It is useful to consider how one would use the repeating motion profile of the present invention to achieve a desired number of ALD cycles, or a given coating thickness. As should be apparent from the earlier figures, during the motion profile any point on the substrate 97 can spend a variable amount of time in any given reactant zone. The necessary values of the forward motion distance f, the backward motion distance b and the ooch distance Δx can be determined experimentally or calculated, such as by using the relative kinetics of the half reactions and the "dwell time" in any gas zone. As the growth during different portions of the motion profile may deviate from conditions that yield saturated growth, the number of half reaction gas exposures necessary will increase and therefore the associated ooch distance will decrease in order to achieve the desired layer thickness. Therefore, using a fully saturated ALD approximation to calculate the necessary number of repeats (oscillations) within the deposition zone to achieve the necessary number of half-cycles, as well as the associated ooch distance will provide an approximation of the useful operating conditions.

The following example illustrates how the growth process can be modeled as a function of the system parameters. Consider a point on the surface of the substrate 97 which remains within the deposition zone 305 during a motion profile oscillation 150. At any time, the point can be said to have a surface state according to the last reactive gas to which the point was exposed. For an SALD deposition head 30 having output slots for two reactive gasses G1 and G2, the point on the surface can be in two states. The "original" state, for this discussion can be considered to correspond to the first reactive gas (e.g., G1) that the point was exposed to on its initial entry into the deposition zone 305. Subsequent exposure of the point on the surface to the second reactive gas (e.g., G2) changes the surface state from its original state. A subsequent exposure to first reactive gas causes the surface state to return to its "original" surface state. A "growth" event is counted each time the surface state is returned to its "original" state. Exposure to a purge gas (e.g., P), an inert gas (e.g., I1 or I2), or atmosphere in the case of non-atmospherically sensitive reactants, does not cause a change to the surface state in either direction. Repeat exposure to the last seen reactive gas, even with an exposure to a non-reactive gas in between, does not cause a change in surface state.

Figure 30:
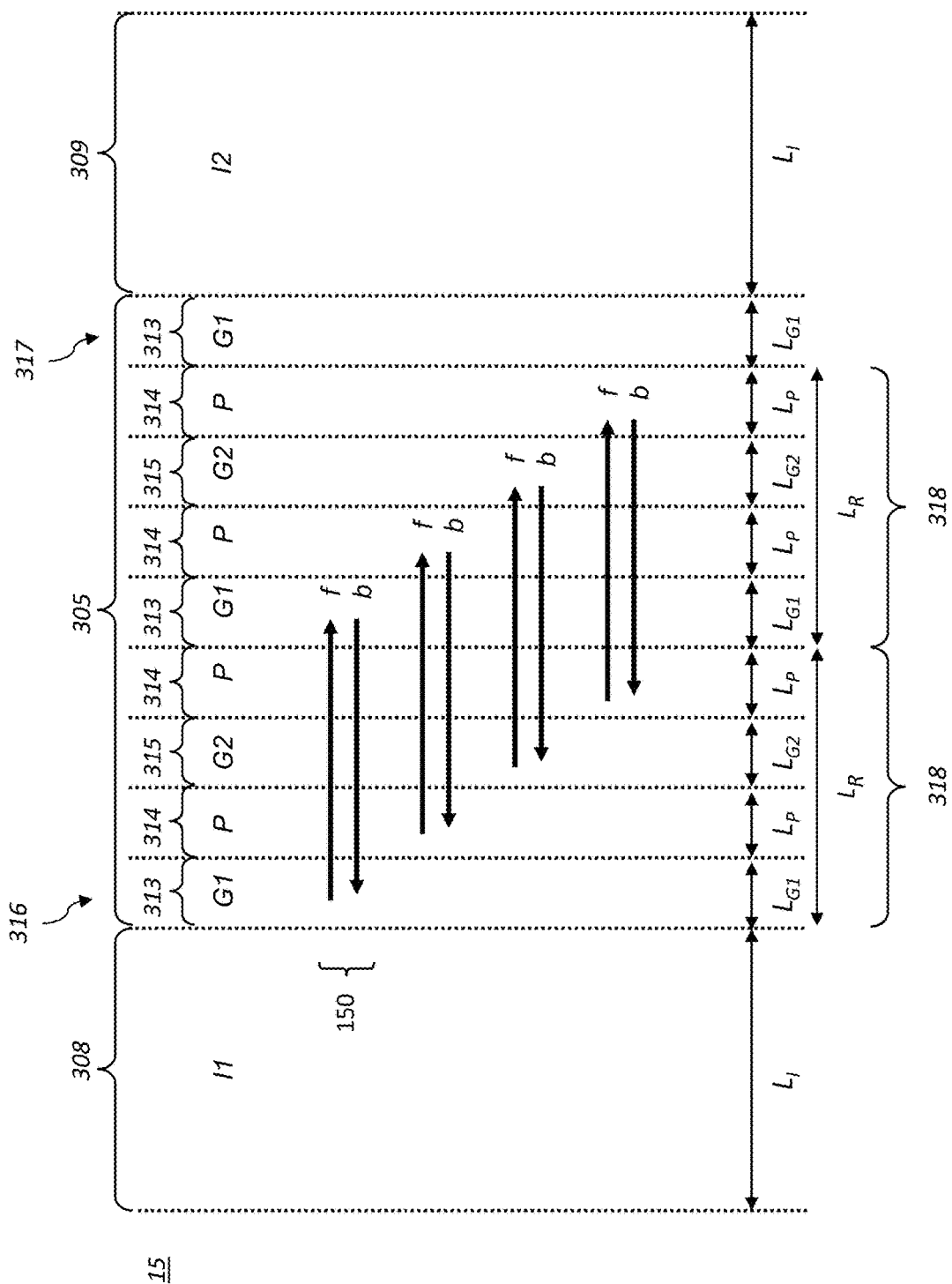
FIG. 30 illustrates the use of a repeating motion profile for performing SALD deposition using the deposition head of FIG. 22 where the forward motion distance is equal to a repeat cycle.

Consider the example illustrated in FIG. 30 of a symmetric 2.5 cycle deposition head 30 having a deposition zone 305 including repeat units 318 of an ALD cycle (where each repeat unit 318 includes a first reactive gas zone 313, a purge gas zone 314, a second reactive gas zone 315 and another purge gas zone 314) The repeat units are followed by a terminating ½ cycle having a final first reactive gas zone 313 and a terminating purge gas zone (which is coincident an inert zone 309 in the illustrated embodiment). In the illustrated example, the forward motion distance f is set to be equal to the length $L_R$ of a single repeat unit 318 (i.e., $f=L_R=L_{G1}+L_P+L_{G2}+L_P$). In preferred embodiments, the ooch distance Δx=f−b is small relative to the forward and backward motion distance (i.e., Δx<<f, b) so that b≈f. The number of growth events completed during a single oscillatory motion of the point on the surface depends on the zones in which the turnaround points of the motion profile oscillation 150 occur. When $f=L_R$, the turnaround points in a particular motion profile oscillation 150 will always occur in the same gas zone type (i.e., each turn around occurs in the same gas composition). In a preferred embodiment, the length $L_I$ of the inert zones 308, 309 is greater than or equal to the length $L_R$ of the repeat unit 318, and more preferably is at least 125% of the length $L_R$ of the repeat unit 318. In some exemplary configurations, the length $L_I$ of the inert zones 308, 309 is substantially equal to an integer multiple of the length $L_R$ of the repeat unit 318. Within the context of the present invention, "substantially equal" means equal to within 5%.

By examination of FIG. 30, it can be seen that when the turnaround points are within a reactive gas zone 313, 315 (i.e., within a G1 or G2 zone), the point on the surface will experience two growth events per oscillation (e.g., if the point starts in a first reactive gas zone 313, it will start in a G1 state, then will go to a G2 state, a G1 state, a G2 state, then back to a G1 state). Similarly, when the turnaround points are located within a purge zone 314, the point on the surface will experience a single growth event per oscillation.

For this exemplary analysis, it will be assumed that the reactive gas zones 313, 315 have a same length so that $L_G=L_{G1}=L_{G2}$. The purge gas zones will also have a same length so that $L_P=L_{P1}=L_{P2}$. The length of the repeat cycle is therefore $L_R=2\cdot L_G+2\cdot L_P$, where $L_G$ is not necessarily equal to $L_P$. The average number of growth events per oscillation $N_G$ can be calculated by weighting the number of growth events for a motion profile oscillation 150 starting in the different zone types by the probability of starting in those zone types:

$$N_G = 2\left(\frac{2L_G}{L_R}\right) + 1\left(\frac{2L_G}{L_R}\right) \qquad (5)$$

The above equation indicates that growth is bounded by $1<N_G<2$, where faster growth is favored by having the reactive gas zones 313, 315 occupy a greater percentage of the repeat length $L_R$. This is strictly true only when the purging operation is "perfect" and all reactions are saturated (i.e., fully completed in the available exposure time). In practice, optimization for a particular application may be useful. For the simplest case where $L_G=L_P$, Eq. (5) simplifies to $N_G=3/2$.

With the deposition zone 305 having an integer $N_R$ full ALD cycles plus ½ terminating cycle, the number of oscillations that it takes for a point to completely transit the working portion of the deposition zone (i.e., inclusive of all repeats 318, where the growth rate is given by Eq. (5)), is $N_O=N_R\cdot L_R/\Delta x$. The total number of growth events $N_T$ that the point on the substrate experiences as it transits the working portion of the head (inclusive of all repeats 318) is given by:

$$N_T \approx N_G \cdot N_O \qquad (6)$$

Note that the number of oscillations for the point on the substrate to transit across the full expanse of the deposition zone 305 will be somewhat more than $N_O$ as it is necessary to clear the terminating half cycle, and is: $N_{OD}=(N_R+1/2)\cdot L_R/\Delta x$.).

This simplified example neglects the transition regions that occur where the point is entering and leaving the deposition zone 305 where it will experience a reduced number of growth events per oscillation ($0<N_G<1$ when $f=L_R$). A more generalized analysis will be presented later which accounts for the transition regions at the start and end of the active growth region where the substrate will experience growth, but where the growth has not yet reached the steady state.

An interesting class of solutions exist where the number of cycles is $N_R+1/2$ and $N_R>1$, which affords an opportunity for the forward motion distance f to be chosen as an integer multiple of $L_R$ such that $f=K \cdot L_R$, where K is an integer $\leq N_R$. If the ooch distance $\Delta x$ is scaled in proportion to K but is still small relative to $L_P$ and $L_G$, the total number of growth events for a point will approximately be independent of K but will still be directly dependent on N. The actual growth amount may be slightly dependent on K due to interactions between the reaction kinetics and velocity profile (i.e., the acceleration and terminal velocity), which may be a minor function of f.

The above examples illustrate that the total number of growth events $N_T$ is deterministic based on knowledge of the deposition head geometry and the motion profile imparted to the substrate 97. For a given apparatus, the total number of growth events, and therefore the amount of material that is deposited on the substrate, can be modified by choosing appropriate values for the motion profile (for example, $\Delta x$ given a fixed $f=L_R$). Other combinations of head design and motion can also be readily analyzed using a similar approach.

These examples should not be taken to be limiting. One skilled in the art will recognize that other choices can be made in deposition head design and motion parameter selection in order to co-optimize other system level considerations such as overall physical size and mechanical dynamics. For example, to minimize the size of the deposition head 30, the pattern of gas zones in the deposition zone 305 can include as little as one cycle (i.e., $N_R=1$) with no terminating ½ cycle, such as the example discussed earlier with respect to FIG. 21. To minimize the required size for the inert zones 308, 309, the forward motion distance f can be reduced to slightly larger than $L_P$ while still enabling growth to occur (albeit at a reduced average rate per oscillation). In this case, there will be only one growth event per cycle.

In practice, the forward motion distance f is not restricted to integer multiples of $L_R$, and may be greater or less than that physical distance as illustrated by the motion profiles in FIGS. 25-28. The following analysis is generalized to consider other deposition head geometries and values for f. For this analysis, a fully saturated ALD approximation will be used. For the purposes of this discussion, the growth from the motion profile and the associated deposition zone 305 will be treated separately from the constraints of the inert zones 308, 309 (i.e., the constraints for maintaining the active deposition region on the substrate 97 in an inert environment separate from the external environment 15).

Figure 31:
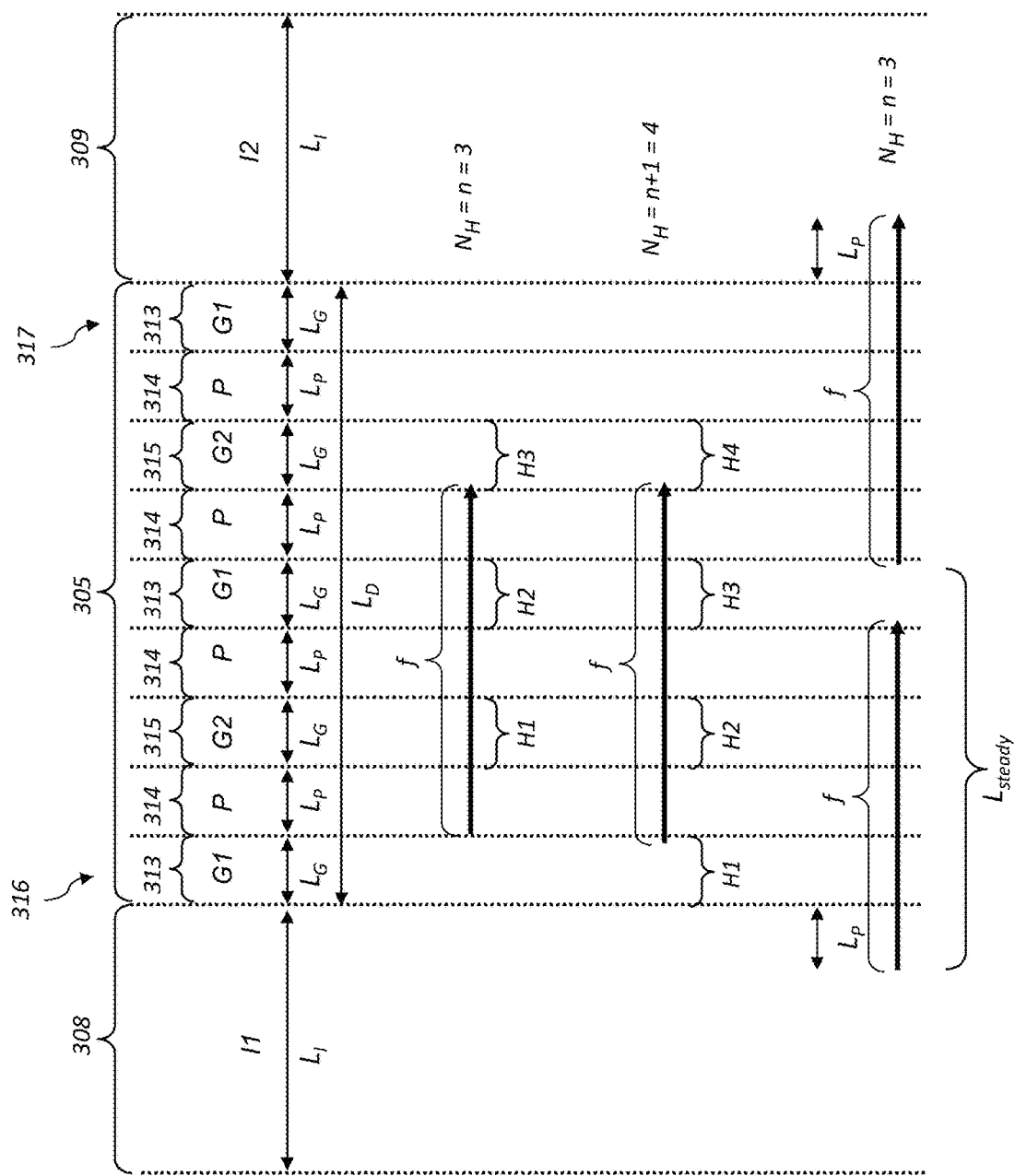
FIG. 31 illustrates various quantities relating to the computation of the number of ALD growth events.
Figure 32:
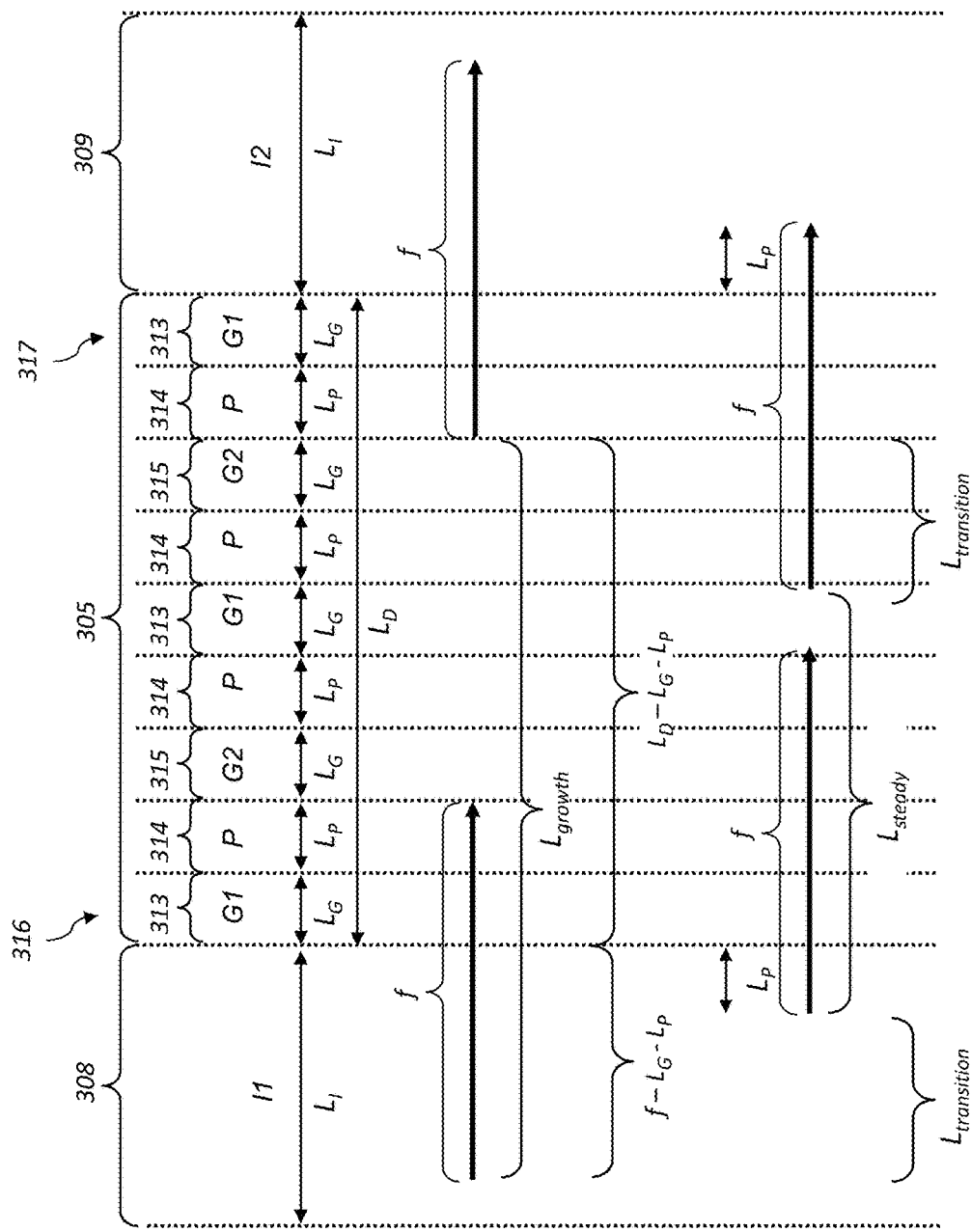
FIG. 32 illustrates various quantities relating to the computation of the number of ALD growth events.

From inspection of FIGS. 25-28, it can be seen that the motion profile oscillation 150 results in exposure of a point on the substrate to a number of half reactions, which should be understood to be equivalent to the state-change treatment in the previous discussion. It is useful to understand the number of half reactions during any portion of the repeating motion profile. FIG. 31 illustrates a general method for calculating the number of half reactions, using the deposition head geometry and motion profile of FIG. 26, with the simplification that $L_G=L_{G1}=L_{G2}$. It should also be understood that the deposition zone 305 contains a number of reactive gas zones 313, 315, and the length of the deposition zone is equal to $L_D=N_{rgz} \cdot L_G+(N_{rgz}-1) \cdot L_P$, where $N_{rgz}$ is the number of reactive gas zones 313, 315. As discussed above, the minimum forward motion distance to achieve a reaction is the length of the purge zone (i.e., $f>L_P$). As illustrated in FIG. 31, if the forward motion is initiated at the boundary of the first reactant zone 316 and the following purge zone 314, but slightly inside of the purge zone 314, then the number of half reactions $N_H$ available is equal to an integer n, where it can be shown that $n=\text{int}[(f+L_G)/(L_G+L_P)]$, where $\text{int}[\cdot]$ is the integer operator. If instead, the forward motion is initiated at the boundary of the first reactant zone 316 and the following purge zone 314, but slightly inside of inside of the first reactant zone 316, then it can be shown that the number of half reactions in equal to $N_H=n+1$. In the example of FIG. 31, f is slightly longer than $3 \cdot L_P+2 \cdot L_G$ so that $n=3$. A "maximum average growth region" where a point on the substrate 97 experiences the maximum growth allowed by the combination of the motion profile oscillation 150 and the geometry of the deposition head 30. The maximum average growth region can also be considered the "motion-profile-defined growth region", or the "steady growth region" having a length $L_{steady}=L_D+2L_P-f$, as can be seen in FIG. 32 this region begins at a distance $L_P$ before the start of the deposition zone 305 and ends at a point at the start of a forward motion portion which terminates at a distance $L_P$ after then end of the deposition zone 305, provided that $L_{I1} \geq L_P$ and $L_{I2} \geq L_P$. The steady growth region can also be considered a "plateau" region or "uniform growth" region, where a point on the substrate in this steady growth region with have, on average, the same number of growth events in each repeat of the repeating motion profile. Within this region, each forward and backward motion portion will experience either n or n+1 half reactions, which can be used to determine the average growth per oscillation.

FIG. 32 illustrates the definition of some terms that can be useful for understanding the growth characteristics. As the substrate moves into the deposition zone from the left-to-right, ALD growth is only initiated after exposure to both reactive gases G1 and G2. Therefore, the first motion profile cycle that will cause growth on the substrate 97 corresponds to a forward motion portion that just enters the left-most second reactive gas zone 315. Similarly, the last motion profile cycle that will cause growth on the substrate 97 corresponds to a forward motion portion that starts just within the right-most second reactive gas zone 315. The "active growth region" corresponds to motions profile cycles having starting positions between these two extremes, and is shown with a length $L_{growth}$. It can be seen that the length of the active growth region is given by:

$$L_{growth} = (f - L_G - L_P) + (L_D - L_G - L_P) \quad (7)$$
$$= f + L_D - 2 \cdot (L_G + L_P)$$

For exemplary motion profile cycles of the present invention, the net forward movement of each repeat unit is the ooch distance $\Delta x$, therefore the number of motion profile cycles where growth occurs is equal to $L_{growth}/\Delta x$. Similarly, the net forward velocity $V_{forward}$ that the substrate 97 moves through the deposition region is equal to the $\Delta x$ divided by the time to complete one motion profile cycle, or approximately:

$$V_{forward} \approx \frac{\Delta x}{t_{osc}} = \frac{\Delta x}{(f+b)/|V_{motion}|} = \overline{|V_{motion}|} \frac{\Delta x}{(f+b)} \quad (8)$$

where $\overline{|V_{motion}|}$ is the average speed that the substrate is moved during the forward and backward motion portions. Note that the time for acceleration at the turn arounds of the motion profile will reduce the average $V_{forward}$ to a value less than the peak speed and the actual average speed will be dependent on the acceleration, terminal speed, and f+b used in the motion control.

As the substrate 97 moves into and out of the active grown region, there will be transition regions at the start and end of the active growth region where the substrate will experience growth, but where the motion profile has not yet advanced far enough to be fully with in the steady state growth region. In the transition regions, the number of half reactions that the substrate is exposed to is less than the number of half reactions that the substrate experiences when the motion profile is fully within the steady growth region. For a symmetric head, the transition regions will also be symmetric, and the difference between the length of the active growth region $L_{growth}$ and the length of the steady growth region $L_{steady}$ will be the twice the length of the transition region $L_{transition}$:

$$L_{growth} = L_{steady} + 2L_{transition} \quad (9)$$

In the illustrated example, the number of half-reactions will be 2 throughout the entire transition region. For cases where n>3, the number of half-reactions will transition from 2 at the outer boundary to n at the boundary of the transition regions with the steady growth region.

Symmetric deposition heads, and therefore symmetric transition regions, are not a constraint of the present invention. It should therefore be understood that the size of the transition regions, and the number of half reactions as a function of position within the transition regions, can be independently calculated/determined for the leading and trailing transition zones.

As illustrated in FIG. 25, at every "turnaround-event" the subsequent exposure to a reactive gas is the same as the previous exposure in the opposite direction. This is true within the repeat unit, and between repeat units. Using the simplification that $\Delta x$ is very small relative to f and b in preferred embodiments, and therefore that f b (i.e., f/b≈1), it can be shown that the average number of half reactions $H_r$ in the steady growth region for a full forward and backward motion profile cycle is given by:

$$H_r = 2 \cdot F_r - 2 \quad (10)$$
$$= 2 \cdot ((f + L_G)/(L_G + L_P)) - 2$$

where $F_r = (f+L_G)/(L_G+L_P)$ is the average number of half reactions in the forward motion portion within the steady growth region. $H_r$ is bounded by the number of half reactions available in the deposition zone such that $H_r$ is the minimum of $2 \cdot F_r - 2$ and $2 \cdot N_{rgz} - 2$, where $N_{rgz}$ is the number of reactive gas zones 313, 315.

As discussed earlier, in the transition regions, the number of half reactions transitions from n at the boundary of the steady growth region to 2 at the edge of the active growth region. It can be shown that the average number of half reactions in the transition region can be calculated using the following equation:

$$T_r = \frac{n \cdot (F_r - 0.5) - 0.5 \cdot n^2 - 1}{F_r - 2} \quad (11)$$

Using these equations, the bounds on f and $\Delta x$ can be determined for any deposition zone having symmetry. For any defined ooch distance $\Delta x$ and forward motion f, the number of oscillations (i.e., the number of repeats of the motion profile oscillation 150) that have growth will be equal to $N_O = L_{growth}/\Delta x$, of which the number of oscillations in the steady growth region will be given by $N_{OS} = L_{steady}/\Delta x$ and the number of oscillations in the transition region will be given by $N_{OT} = 2 \cdot L_{transition}/\Delta x$ for cases where the lengths of the transition zones ($L_{entrance}$ $L_{exit}$) are equivalent, more generally $N_{OT} = (L_{entrance} \ L_{exit})/\Delta x$. The total number of growth events $N_T$ (which will be equal to the total number of half reactions divided by 2) will therefore be given by:

$$N_T = \frac{1}{2}[2 \cdot T_r \cdot N_{OT} + H_r \cdot N_{OS}] \quad (12)$$
$$= \frac{1}{2}\left[2 \cdot T_r\left(\frac{L_{transition}}{\Delta x}\right) + H_r\left(\frac{L_{steady}}{\Delta x}\right)\right]$$

These equations can be rearranged to solve for the required ooch distance $\Delta x$ to give a desired total number of growth events $N_T$, given a head geometry and a specified value of the forward motion distance f. Similarly, they can be used to solve for the forward motion distance f given a specified ooch distance $\Delta x$. These equations make the assumption that any exposure to a reactive gas results in a full half reaction of growth, the exact growth for any motion profile will be dependent on the reaction kinetics and these equations should therefore be seen to provide bounding values; for example, these equations can be used to determine the maximum ooch value for a desired value of $N_T$. Since the number of growth events $N_T$ will experience a range of gas exposure times, the coating thickness may be less than what would be expected based on a steady-state ALD growth per cycle (GPC) calculation. Similar equations can be derived to apply for deposition zones 305 without symmetry. As noted, the length of each transition zone will need to be handled separately.

As discussed earlier, there is no particular benefit to a forward motion portion f that is substantially longer than the length of deposition zone 305, but it causes no harm if the inert zones 308, 309 are sufficiently long. One limiting example corresponds to the case where the length of the steady growth region is zero (i.e., $L_{steady}=0$). This will correspond to the case where $f=L_D+2 \cdot L_p$. The length of the growth region will be $L_{growth}=2L_D-2L_G$, and the length of the transition region will be $L_{transition}=L_{growth}/2$. The value of n will be given by one more than the total number of reactive gas zones 313, 315 ($n=N_{rgz}+1$), and it can be seen that $F_r=n$ so that from Eq. (11), $T_r=(0.5 \cdot n^2 \cdot 0.5 \cdot n-1)/(n-2)$. Substituting into Eq. (12) gives:

$$N_T = T_r\left(\frac{L_{transition}}{\Delta x}\right) = T_r\left(\frac{L_{growth}}{2\Delta x}\right) \quad (13)$$
$$= T_r\left(\frac{L_D - L_G}{\Delta x}\right) = \frac{(0.5 \cdot n^2 - 0.5 \cdot n - 1)(L_G + L_P)}{\Delta x}$$

Solving for the ooch distance $\Delta x$ needed to provide a desired number of growth events $N_T$ gives:

$$\Delta x = \frac{(0.5 \cdot n^2 - 0.5 \cdot n - 1)(L_G + L_P)}{N_T} \quad (14)$$

The ratio of the forward motion portion to the backward motion portion (f/b) is a useful attribute for characterizing a repeat motion profile. At the limit where $L_{steady}=0$, it can be shown that:

$$\frac{f}{b} = \frac{(n-1) + L_P/(L_G + L_P)}{(n-1) + L_P/(L_G + L_P) - (0.5 \cdot n^2 - 0.5 \cdot n - 1)/N_T} \quad (15)$$

It can be seen that the absolute size of the deposition zone $L_D$ is not a factor in the ratio of f/b, rather it is the relative size of the purge zone length $L_P$ to the reactive gas zone length $L_G$. Furthermore, it can be seen that, consistent with the figures and earlier discussion, as the number of desired growth events $N_T$ increases, the ratio of f/b decreases (approaching 1.0 as growth events $N_T$ grows and the corresponding $\Delta x$ approaches 0.0). Additionally, as the number of reactive gas zones ($N_{rgz}$) decreases, the ratio of f/b will also decrease; therefore, deposition heads 30 having a smaller footprint due to fewer reactive gas zones 313, 315, will operate using a motion profile where f/b is close to 1.0. At the limit where the number of reactive gas zones 313, 315 in the deposition head is equal to the desired number of growth events $N_T$, then, the ratio of f/b is roughly 2. Therefore, motion profiles of the present invention have a ratio of f/b less than 2, preferably less than 1.5, more preferably less than 1.2. In most preferred embodiments, the ratio of f/b will be less than 1.1. As should be understood, the actual value of f/b will be determined based on the geometry of the actual deposition head and desired number of growth events $N_T$.

The present invention can be used with existing deposition head geometries, where the motion profile will be designed to get the desired coating given a specific deposition zone arrangement. In alternative embodiments, the present invention can be used to design optimized deposition zones, as well as overall output face features for deposition heads for specific applications.

Examples

Embodiments of the present invention enable coating lengths that are substantially longer than the in-track length of the deposition head 30. Coatings were generated to illustrate different aspects of the present invention. The thin film coatings of the material layers on glass substrates were accomplished in each of the examples using a spatial ALD deposition head 30 having a similar configuration to that illustrated in FIG. 23. The gas flows through the deposition head 30 were controlled such that during operation it was operated as a vacuum-preloaded gas-bearing deposition head 30. As the substrate 97 was moved relative to the deposition head 30, as described in each of the examples, the surface was exposed to the sequence of gaseous materials to perform ALD deposition.

Glass substrates 97 that were 2.5×2.5 inch squares or 2.5×5.0 inch rectangles were used. Each substrate 97 was attached to a heated backer device 70 to form a substrate unit 74 that was positioned over the output face 134 of the vacuum-preloaded gas-bearing delivery head 30. As described above, the separation between the substrate 97 and the output face 134 of the delivery head 30 was maintained by equilibrium between the flow of the gaseous materials supplied to the output slots 112 on the output face 134 and a slight amount of vacuum supplied to the exhaust slots 114. For all of the examples, the exhaust supply pressure was approximately 40 inches of water below atmospheric pressure. The purge gas P supplied in the purge zones 314 and the inert gas I supplied in the inert zones 308, 309 were pure nitrogen. The first reactive gas G1 supplied in the first reactive gas zones 313 was a mixture of nitrogen, water vapor, and optionally ammonia vapor (an oxygen reactive precursor O). The second reactive gas G2 supplied in the second reactive gas zones 315 was a metal reactive precursor M, and was one or a mixture of active metal alkyl vapors in nitrogen.

The metal alkyl precursors used in these examples were trimethylaluminum (TMA) and diethyl zinc (DEZ). The flow rate of the active metal alkyl vapor was controlled by bubbling nitrogen through the pure liquid precursor contained in an airtight bubbler by means of individual mass flow controllers. This saturated stream of metal alkyl was mixed with a dilution flow of nitrogen before being supplied to the deposition head 30. The flow of water vapor was controlled by adjusting the flow rate of nitrogen passed through pure water in a bubbler. This saturated stream of water vapor was mixed with a dilution flow before being supplied to the deposition head 30. The flow of ammonia vapor was controlled by passing pure ammonia vapor from the head space of a compressed fluid tank through a mass flow controller and mixing with the water vapor stream. All bubblers were held at room temperature. The temperature of the coating operation was established by controlled heating of both the deposition head 30 and the backer device 70 to a desired temperature. Experimentally, the flow rates of the individual gasses (in units of standard cubic centimeter per minute) were adjusted to the settings shown in table 580 of FIG. 33 for each of the material layers ($Al_2O_3$, ZnO and ZnO:N) coated in the examples contained herein. The flows shown are the total flows supplied to the coating device, and thus are partitioned equally among the individual gas zones of a common type. In all of the experimental examples, the growth temperature used was 200° C.

FIG. 34 shows a table 590 containing details for a series of comparative and exemplary SALD coatings made in accordance with embodiments of the invention. In all examples, deposition was initiated after placing the substrate 97 to be coated in a position where it was centered over the deposition head 30. After establishing the z-position via the gas bearing effect, the substrate 97 was moved a distance of half of the total forward motion in an in-track direction. For samples that were coated using a simple oscillating motion, the ooch distance is equal to zero, and therefore backward distance is equal to the forward motion distance. After completing the number of repeat motion units, the sample was returned to the center position for unloading from the deposition system. The deposition head 30 used for the examples was constructed such that the total in-track length of the head was 2 inches, and the length of the deposition zone 305 was $L_D$=0.9 inches. There were five reactive gas zones 313, 315 separated by four purge gas zones 314 having the pattern illustrated in FIG. 23. The zone lengths in the deposition zone were $L_{G1}=L_{G2}=L_P=0.1$ inches. The inert zones were roughly equivalent, and nominally were $L_{I1}=L_{I2}=0.55$ inches (14 mm).

As seen in Table 2 of FIG. 34, three materials were grown to evaluate the ooching motion profile. Starting with comparative example C1, a 2.5 inch square substrate was coated using a simple oscillating motion profile (with equal forward and backwards motion distances) for 30 oscillations to grow nominally 20 nm of ZnO:N. During the deposition, the center of gravity of the substrate unit 74 never traveled beyond the edge of the deposition head 30. The growth per cycle (GPC) of ZnO:N for the deposition temperature of 200° C. and a velocity of 50.8 mm/sec is approximately 1.9 Angstroms/cycle, therefore the total thickness of the deposited material was nominally about 23 nm.

For inventive example I1, a 2.5×5.0-inch substrate was coated using a simple oscillating motion profile (with equal forward and backwards motion distances) that moved the center of gravity of the substrate unit 74 beyond the edge of the deposition head 30 by about 15.25 mm. The number of oscillations for I1 was also 30, with the difference between I1 and C1 being the length of travel during the oscillations to enable coating a larger substrate area. As discussed earlier, the vacuum-preloaded deposition head 30 was able to maintain the gap between the substrate 97 and the output face 134 without tipping during deposition, and a uniform coating of ZnO:N was obtained over a coating length of approximately 2.5 inches. In example I1, the active deposition region of the substrate moved beyond the edge of the deposition head 30 so that it was exposed to the external environment 15 during growth.

Inventive example I2 demonstrates the use of a repeating motion profile where the forward motion distance f was larger than the backward motion distance b by an ooch distance Δx. In this example, the center of gravity of the substrate unit 74 was not moved beyond the edge of the deposition head 30. In order to prevent the exposure of the active deposition region to the external environment, the forward motion distance f was chosen to be 7.5 mm. The required ooching distance was then calculated and used to achieve the same number of ALD cycles as in the simple oscillating motion profile of comparative example C1. Inventive sample I2 produced an equivalent ZnO:N coating thickness to that in examples C1 and I1, but obtained it using the ooching motion profile. The uniform coating length was very short for I2, approximately 0.18 inches due to the prior art imposed limitation of maintaining the center of gravity over the deposition head.

Inventive example I3, combined the inventive aspects of examples I1 and I2 to coat a 2.5×5.0-inch substrate using the same ooching motion profile of example I2 for a larger number of oscillations to cover a larger substrate area. In this example, the center of gravity of the substrate unit 74 was moved beyond the edge of the deposition head 30 during both the beginning and end of the coating process by 15.25 mm. As discussed earlier, the vacuum-preloaded deposition head 30 was able to maintain the gap between the substrate 97 and the output face 134 without tipping during deposition, and a uniform coating of ZnO:N was obtained over a coating length of approximately 2.1 inches. In example I3, the active deposition region of the substrate was protected from the external environment during growth.

Comparative example C2, is similar to comparative example C1 with the following exceptions. A 2.5-inch square substrate was coated using a simple oscillating motion profile for 154 oscillations to grow nominally 50 nm of $Al_2O_3$. The growth per cycle (GPC) of $Al_2O_3$ for the deposition temperature of 200° C. and a velocity of 50.8 mm/s is approximately 0.812 Angstroms/cycle, therefore the total thickness of the deposited material was nominally about 50.0 nm.

Inventive examples I4 and I5 are similar to I1 and I3, respectively. Inventive example I4 illustrates the deposition of a uniform coating of $Al_2O_3$ with a larger number of oscillations using the same motion profile as Inventive example I1, where the center of gravity of the substrate unit 74 traveled beyond the edge of the deposition head 30 by about 15.25 mm. The number of oscillations for I4 was 154 (the same as comparative example C2). As with I1, the vacuum-preloaded deposition head 30 was able to maintain the gap between the substrate 97 and the output face 134 without tipping during the 154 oscillations, and a uniform coating of $Al_2O_3$ was obtained (over a length of approximately 2.5 inches). In example I1, the active deposition region of the substrate moved beyond the edge of the deposition head 30 so that it was exposed to the environment.

Inventive example I5 used a similar repeating motion profile to that of example I3. The same forward motion distance f of 7.5 mm was used, and the ooch distance was adjusted to achieve the desired number of ALD cycles for $Al_2O_3$. Inventive sample I4 produced an equivalent $Al_2O_3$ coating thickness to that in examples C2 and I5, but obtained it using the ooching motion profile for a uniform coating length of 2.1 inches which was protected from the external environment during growth. Furthermore, the vacuum-preloaded condition was maintained during the deposition event.

In Comparative example C3, a 2.5-inch square substrate 97 was coated using a simple oscillating motion profile (with equal forward and backwards motion distances) for 75 oscillations to grow nominally 57 nm of ZnO. During the deposition, the center of gravity of the substrate unit 74 never traveled beyond the edge of the deposition head 30. The growth per cycle (GPC) of ZnO for the deposition temperature of 200° C. and a velocity of 50.8 mm/s is approximately 1.9 Angstroms/cycle, therefore the total thickness of the deposited material was nominally about 57 nm.

In inventive example I6, a repeating motion profile was used where the forward motion distance f was larger than the backward motion distance b by an ooch distance Δx. In this example, the center of gravity of the substrate unit 74 was moved beyond the edge of the deposition head 30 by 3.8 mm. The forward motion distance f was chosen to be 10.16 mm (0.4 inches) which is equal to the length of one repeat unit (G1-P-G2-P). An ooch distance of Δx=0.1016 mm was used to achieve the same number of ALD cycles as in the simple oscillating motion profile of comparative example C3. Inventive sample I6 produced an equivalent ZnO central uniform coating thickness to that in examples C3, having a length of approximately 1.0 inch. Inventive example I7 is similar to and has the same uniform coating thickness as I6, however the total number of oscillations was increased to coat a longer region of the substrate, for a uniform coating region of approximate 1.9 inches.

As can be seen from the description of the inventive examples, and the information in Table 2 (FIG. 34) the present invention can be used to coat substrates 97 that are significantly longer than the in-track length of the deposition head 30. Furthermore, a repeat motion profile can be used to control the exposure of the active growth region to the external environment 15. The parameters of the repeat motion profile f and Δx can be selected to achieve the desired coating thickness given the deposition conditions used (temperature, velocity, and precursor concentration). The number of oscillations used with a given repeat motion profile can independently control the length of uniform coating area, which for the coating of continuous substrates can be set to a value to coat the length of web in a roll-to-roll operation.

The invention has been described in detail with particular reference to certain preferred embodiments thereof, but it will be understood that variations and modifications can be effected within the spirit and scope of the invention.

PARTS LIST 15 external environment
30 deposition head
60 mass
61 lever
62 pivot point
63 air bearing
64 rolling element bearing
65 cantilever spring
66 pin
67 center of gravity
66 stop pin
70 backer device
71 center of gravity
74 substrate unit
75 vertical element
76 springs
77 counter weight
78 counter mass
87 linkage
94 working distance
95 outboard support elements
97 substrate
98 motion arrow
110 gas slot
112 output slot
113 force vector
114 exhaust slot
123 force vector
134 output face
150 motion profile oscillation
165 motion profile
200 SALD system
205 deposition subsystem
210 deposition unit
270 relative motion means
280 substrate positioner module
281 roller
282 roller bearing
283 yoke feature
284 flexure
285 frame
286 frame opening
288 substrate positioner
305 deposition zone
308 inert zone
309 inert zone
311 edge
313 first reactive gas zone
314 purge zone
315 second reactive gas zone
316 first reactant zone
317 last reactant zone
318 repeat unit
321 left edge
322 right edge
401 output slots
500 pressure distribution plot
580 table
590 table

The invention claimed is:

1. A thin film deposition system, comprising:
a vacuum-preloaded gas bearing deposition head positioned in an external environment having an ambient pressure, the deposition head having an output face facing a first substrate surface of a substrate and being configured to expose the first substrate surface to a plurality of gaseous materials including one or more reactive gaseous materials, wherein the output face includes a plurality of source openings through which the gaseous materials are supplied and one or more exhaust openings;
wherein an exhaust pressure at the exhaust openings is less than ambient pressure and a source pressure at the source openings is greater than the exhaust pressure at the exhaust openings, and wherein a source pressure at outermost source openings of the plurality of source openings is greater than ambient pressure;
a substrate unit including the substrate, the substrate having a length in an in-track direction;
a motion control system that moves the substrate unit over the output face of the deposition head in the in-track direction in accordance with a specified motion profile without constraining motion of the substrate unit in a direction normal to the output face of the deposition head, wherein the motion profile includes moving a center of gravity of the substrate unit beyond a first edge of the output face;
wherein an integrated pressure across the output face provides a net force on the first substrate surface in a direction normal to the output face, wherein a sum of the forces on the substrate unit in a direction normal to the output face and a sum of moments on the substrate unit are zero at all positions in the motion profile and wherein a gap exists between the first substrate surface and the output face at all positions in the motion profile;
wherein the substrate unit includes a backer device rigidly attached to a second substrate surface of the substrate, the second substrate surface being opposite to the first substrate surface; and
wherein the thin film deposition system further includes a counter moment inducing system that applies a counter moment to the substrate unit which is a function of an in-track position of the substrate unit at a specified in-track position of the substrate unit, said counter moment inducing system comprising a first component attached to the backer device and at least one second component located at a fixed position and at an offset distance from said first component, said first component not contacting said second component through a full range of said specified motion profile and contacting said second component at the specified in-track position of the substrate unit to apply said counter moment.

2. The thin film deposition system of claim 1, wherein the length of the substrate is longer than a length of the output face in the in-track direction, when the substrate is present.

3. The thin film deposition system of claim 1, wherein the output face includes:
a first inert zone having wherein an inert gaseous material is supplied;
a second inert zone having wherein an inert gaseous material is supplied; and
a deposition zone located between the first inert zone and the second inert zone along the in-track direction where the first substrate surface is exposed to the one or more reactive gaseous materials to deposit a substance onto the first substrate surface.

4. The thin film deposition system of claim 3, wherein the deposition zone is fully covered by the first substrate surface at all positions in the motion profile.

5. The thin film deposition system of claim 1, wherein the source openings include two outermost openings and one or more inner source openings between the outermost source openings, and wherein the source pressure at outermost source openings is controlled independently of the source pressure at the one or more inner source openings.

6. The thin film deposition system of claim 1, wherein the backer device is attached to the second substrate surface using a vacuum force.

7. A thin film deposition system, comprising:
a vacuum-preloaded gas bearing deposition head positioned in an external environment having an ambient pressure, the deposition head having an output face facing a first substrate surface of a substrate and being configured to expose the first substrate surface to a plurality of gaseous materials including one or more reactive gaseous materials, wherein the output face includes a plurality of source openings through which the gaseous materials are supplied and one or more exhaust openings;
wherein an exhaust pressure at the exhaust openings is less than ambient pressure and a source pressure at the source openings is greater than the exhaust pressure at the exhaust openings, and wherein a source pressure at outermost source openings of the plurality of source openings is greater than ambient pressure;
a substrate unit including the substrate, the substrate having a length in an in-track direction;
a motion control system that moves the substrate unit over the output face of the deposition head in the in-track direction in accordance with a specified motion profile without constraining motion of the substrate unit in a direction normal to the output face of the deposition head, wherein the motion profile includes moving a center of gravity of the substrate unit beyond a first edge of the output face;
wherein an integrated pressure across the output face provides a net force on the first substrate surface in a direction normal to the output face, wherein a sum of the forces on the substrate unit in a direction normal to the output face and a sum of moments on the substrate unit are zero at all positions in the motion profile and wherein a gap exists between the first substrate surface and the output face at all positions in the motion profile;
wherein the substrate unit includes a backer device rigidly attached to a second substrate surface of the substrate, the second substrate surface being opposite to the first substrate surface;
wherein the thin film deposition system further includes a counter moment inducing system that applies a counter moment to the substrate unit which is a function of an in-track position of the substrate unit; and
wherein the counter moment inducing system includes a moveable counter mass connected to the backer unit device which is adapted to move in an opposite lateral direction with respect to the substrate unit from a first position to a second position where the counter mass transfers a torque to the backer device to apply a counter moment to the substrate unit.

8. The thin film deposition system of claim 1, wherein the counter moment inducing system includes a torsion spring, a cantilever spring, a coil spring, a leaf spring, a magnetic actuator, an electromagnetic actuator, a gas bellows, or a pneumatic cylinder.

9. The thin film deposition system of claim 1, wherein the motion profile includes a repeating motion pattern that includes a forward motion portion that moves the substrate a forward distance in the in-track direction and a backwards motion portion that moves the substrate a backward distance in the in-track direction.

10. The thin film deposition system of claim 9, wherein the forward distance is larger than the backward distance such that the repeating motion pattern provides a net forward motion.

11. The thin film deposition system of claim 7, wherein the counter moment inducing system includes connecting linkages and levers which are adapted to move the moveable counter mass in the opposite lateral direction with respect to the substrate unit from the first position to the second position.

12. The thin film deposition system of claim 7, wherein the counter moment inducing system includes cables which are adapted to move the moveable counter mass in the opposite lateral direction with respect to the substrate unit from the first position to the second position.

* * * * *